United States Patent [19]

Maeda et al.

[11] Patent Number: 5,656,381
[45] Date of Patent: Aug. 12, 1997

[54] MAGNETORESISTANCE-EFFECT ELEMENT

[75] Inventors: Atsushi Maeda; Minoru Kume, both of Moriguchi, Japan

[73] Assignee: Sanyo Electric Co., Ltd., Osaka, Japan

[21] Appl. No.: 216,185

[22] Filed: Mar. 22, 1994

[30] Foreign Application Priority Data

| Mar. 24, 1993 | [JP] | Japan | 5-065670 |
| Jul. 27, 1993 | [JP] | Japan | 5-184873 |
| Jul. 29, 1993 | [JP] | Japan | 5-188086 |

[51] Int. Cl.$^6$ .................................................. H01F 1/00
[52] U.S. Cl. .................. 428/611; 428/548; 428/686; 428/693; 428/699
[58] Field of Search ................................. 428/611, 623, 428/673, 548, 645, 649, 655, 681, 686, 689, 692, 693, 699, 900, 928, 671, 674, 658; 148/314, 315, 300, 313; 360/113; 100/105, 306, 420, 425; 420/7, 84, 462, 435, 563, 577

[56] References Cited

U.S. PATENT DOCUMENTS

| 3,567,525 | 3/1971 | Graham et al. | 148/31.57 |
| 3,975,772 | 8/1976 | Lin | 360/113 |
| 5,117,321 | 5/1992 | Nakanishi et al. | 360/120 |
| 5,159,513 | 10/1992 | Dieny et al. | 360/113 |
| 5,164,025 | 11/1992 | Hasegawa | 148/313 |
| 5,206,590 | 4/1993 | Dieny et al. | 324/252 |
| 5,268,043 | 12/1993 | McCowen | 148/310 |
| 5,287,553 | 2/1994 | Ahn et al. | 455/89 |
| 5,304,975 | 4/1994 | Saito et al. | 338/32 R |
| 5,366,815 | 11/1994 | Araki et al. | 428/611 |
| 5,422,621 | 6/1995 | Gambino et al. | 338/32 R |
| 5,425,819 | 6/1995 | Oohashi et al. | 148/300 |

FOREIGN PATENT DOCUMENTS 58-36406   8/1983   Japan .

OTHER PUBLICATIONS

Lieri et al. "The process–controlled magnetic properties of manostructured Cu/Ag composite films." J. Applied Phys. 70(10), 15 Nov. 1991, pp. 5882–5884.

Maeda et al. Abstract of "Magnetoresistance Characteristics of grain–type alloy thin films of Various Compositions," J. of Phys.–Cond. Matter. 6–Sep.–93, vol 5, No. 36, pp. 6745–6752.

"Metallic Superlattices—Artifically Structured Materials", by Shinjo et al.; Studies in physical and theoretical Chemistry 49; 1987.

"Magnetoresistance characteristics of grain–type alloy thin films of various compositions", by Maeda et al.; J. Phys.: Condens. Matter 5 (1993) 6745–6752, 1993 IOP Publishing, Ltd.

Journal of Magnetism and Magnetic Materials 94 (1991) "Oscillatory interlayer coupling and giant magnetoresistance in Co/Cu multilayers" by D. H. Mosca et al. pp. L.1–L.5.

Appl. Phys. Lett. 59 2/91 "Low–field spin–valve magnetoresistance in Fe–Cu–Co sandwiches" by A. Chaiken et al. pp. 240–242.

Physical Review B, 1/92 "Giant magnetoresistance of magnetically soft sandwiches: Dependence on temperature and on layer thicknesses" by B. Dieny et al. pp. 806–813.

A. Maeda et al., "Giant Magneto–Resistance Effect In Grain–Type Alloy Thin Films", Mar. 29, 1993, J. Phys.: Condens. Matter. vol. 5, No. 13, pp. L189–L194.

(List continued on next page.)

Primary Examiner—David A. Simmons
Assistant Examiner—Linda L. Gray
Attorney, Agent, or Firm—W. G. Fasse; W. F. Fasse

[57] ABSTRACT

A magnetoresistance-effect element includes a substrate, and a magnetoresistance-effect film disposed on the substrate. The magnetoresistance-effect film includes an alloy film containing ferromagnetic metal atoms and non-magnetic metal atoms, which have the property relative to each other that they are mutually insoluble in both solid and liquid phases. The magnetoresistance-effect film further includes at least three soft magnetic films arranged as discontinuous areas in contact with the alloy film and magnetically coupled therewith for reducing an operating magnetic field strength of the element.

37 Claims, 44 Drawing Sheets

OTHER PUBLICATIONS

Dieny et al., "Giant Magnetoresistance in Soft Ferromagnetic Layers", Physical Review Condensed Matter, 43 (1991), Jan. vol. 1, Part B.

J. Appl. Phys., Apr. 15, 1994, vol. 69, No. 8, pp. 5262–5266, "Hysteresis In Lithographic Arrays . . . ", by J. Smyth et al.

Physical Review Letters, vol. 68, No. 25, Jun. 22, 1992, pp. 3745 to 3748.

$Fe_{100-Y}Ag_Y$ $Fe_{100-Y}Mg_Y$ $(Fe_{100-x}Ni_x)_{27}Ag_{73}$ $(Fe_{100-x}Ni_x)_{29}Bi_{71}$ $(Fe_{100-x}Cu_x)_{29}Bi_{71}$ $(Fe_{100-x}Cu_x)_{27}Mg_{73}$ $(Co_{100-x}Mn_x)_{24}Pb_{76}$ $(Ni_{100-x}V_x)_{27}Ag_{73}$ $(Ni_{100-x}Cr_x)_{27}Ag_{73}$

Co₂₀Ag₈₀

$Co_{20}Ag_{80}$

WIDTH h OF NiFe FILM (nm)

MAGNETORESISTANCE-EFFECT ELEMENT

CROSS REFERENCE TO RELATED APPLICATIONS

This application is related to application U.S. Ser. No. 08/326,731, filed on Oct. 20, 1994, and entitled MAGNETORESISTANCE EFFECT ELEMENT now U.S. Pat. No. 5,585,198, and to copending application U.S. Ser. No. 08/406,670, filed on Mar. 20, 1995, and entitled MAGNETORESISTANCE ELEMENT.

BACKGROUND OF THE INVENTION

1. Field of the Invention

The present invention relates to a magnetoresistance-effect element which is applied to a magnetoresistance-effect type head (MR head) or a magnetic sensor (MR sensor).

2. Description of the Background Art

A magnetoresistance-effect element is adapted to detect changes in the electrical resistance of a magnetic film caused by application of a magnetic field, thereby measuring the magnetic field strength and any change thereof. In general, therefore, such a magnetoresistance-effect element must have a high magnetoresistance ratio at room temperature. A magnetic material for the magnetoresistance-effect element is generally prepared from an Fe—Ni alloy (permalloy). However, the Fe—Ni alloy is not preferable as the magnetic material for the magnetoresistance-effect element, due to an extremely small magnetoresistance ratio of about 2 to 3%.

A magnetic multilayer film formed by interposing a non-magnetic thin film between magnetic thin films has been recently proposed in the art. This magnetic multilayer film is preferable as a magnetic material for a magnetoresistance-effect element, due to a high magnetoresistance ratio of about 10%. However, this magnetic multilayer film has a rather complicated structure in which the non-magnetic thin film is interposed between the magnetic thin films, whereby the magnetic thin films provided on both sides of the non-magnetic thin film are at different holding power levels. Thus, the steps required for manufacturing this magnetic multilayer film are disadvantageously complicated.

Physical Review Letters, Vol. 68, No. 25, 22 Jun. 1992, pp. 3745 to 3748 discloses a novel magnetoresistance-effect film. This magnetoresistance-effect film is a CoCu alloy film consisting of Co and Cu, which is atomically mixed with Co that is not in a solid phase but in a liquid phase in a eutectic relation. This alloy film exhibits a high magnetoresistance ratio of at least 10% at an ultra-low temperature of 10K. At room temperature, however, this alloy film exhibits only a small magnetoresistance ratio of about 6 to 7%.

SUMMARY OF THE INVENTION

An object of the present invention is to provide a magnetoresistance-effect element that exhibits a high magnetoresistance ratio also at room temperature, and is easy to manufacture with a simple structure.

The magnetoresistance-effect element according to the present invention comprises a substrate and a magnetoresistance-effect film formed on the substrate. This magnetoresistance-effect film has an alloy film consisting of ferromagnetic metal atoms and non-magnetic metal atoms whereby the ferromagnetic metal atoms and the non-magnetic metal atoms have the property relative to each other that they will not form a solid solution and will not be mixed together in both solid and liquid phases.

Thus, the non-magnetic metal atoms and the ferromagnetic metal atoms will not be atomically mixed with each other and are mutually insoluble in both solid and liquid phases. According to the present invention, therefore, grains of the ferromagnetic metal atoms are formed in the alloy film. The magnetized state of these grains is changed from a random arrangement or orientation to a ferromagnetic arrangement or orientation as an applied magnetic field increases. In a matrix of the non-magnetic metal atoms enclosing the grains of the ferromagnetic metal atoms, a scattered state of conduction electrons is extremely varied with the magnetized state of the grains. Consequently, the magnetoresistance ratio of the alloy film is increased.

According to the present invention, therefore, the magnetoresistance-effect film has an extremely high magnetoresistance ratio.

The ferromagnetic metal atoms and the non-magnetic metal atoms having the aforementioned relation will now be described in more concrete terms. When the ferromagnetic metal atoms are atoms of Fe, for example, Ag, Bi, Mg or Pb can be selected for the non-magnetic metal atoms. In this case, it is possible to increase the magnetoresistance ratio of the alloy film to at least 10% by introducing the non-magnetic metal atoms in an atomic content of 60 to 85 atom %. Further, Co, Ni, Cu or Zn can be added to this alloy film.

When the ferromagnetic metal atoms are atoms of Co, on the other hand, Ag or Pb can be employed for the non-magnetic metal atoms. When a CoAg alloy is employed, it is possible to increase the magnetoresistance ratio of the alloy film to at least 10% by introducing Ag in an atomic content of 54 to 88 atom %. When a CoPb alloy is employed, it is possible to increase the magnetoresistance ratio of the alloy film to at least 10% by introducing Pb in an atomic content of 68 to 82 atom %. Further, V, Cr or Mn can be added to the CoAg alloy and the CoPb alloy.

Furthermore, when the ferromagnetic metal atoms are atoms of Ni, Ag can be employed for the non-magnetic metal atoms. When such an NiAg alloy is employed, the atomic content of Ag is preferably 60 to 80 atom %. In order to increase the magnetoresistance ratio to at least 10% in this NiAg alloy, it is necessary to further add third metal atoms. V, Cr or Mn can be employed for the third metal atoms. In order to obtain a magnetoresistance ratio of at least 10%, the atomic contents of V, Cr and Mn relative to the total contents of NiV, NiCr and NiMn are preferably 15 to 55 atom %, 18 to 69 atom % and 24 to 92 atom % respectively.

The grains of the ferromagnetic metal atoms contained in the alloy film are preferably not more than 20 nm, more preferably 3 to 8 nm in diameter.

In order to reduce the grains of the ferromagnetic metal atoms to not more than 20 nm in diameter, the alloy film which is formed by vapor deposition is preferably not more than 30 nm, more preferably not more than 20 nm, in thickness.

In an Example according to the present invention, the magnetoresistance-effect film has an alloy film, and a soft magnetic film provided in contact with the alloy film. The magnetized state of the grains contained in the alloy film is changed following or according to the soft magnetic film even in a weak magnetic field change, due to the magnetic coupling with the soft magnetic film.

The soft magnetic film may be provided between the substrate and the alloy film, or on the alloy film. A plurality of soft magnetic films are preferably discontinuously provided on the substrate. In this case, the contact areas of the soft magnetic films and the alloy film are widened to increase the influence exerted by the soft magnetic films on the magnetized state of the grains contained in the alloy film, whereby the operating magnetic films strength can be extremely reduced. Such soft magnetic films can be provided in the form of stripes or islands. The soft magnetic films can be formed by NiFe alloy films or CoNi alloy films.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS OF THE INVENTION

An FeAg alloy film was formed on a glass substrate by vacuum deposition. The vacuum deposition was carried out by melting Fe through electron beam irradiation and melting Ag by resistance heating. The atomic contents of these elements in the magnetic alloy film were controlled by adjusting the ratio of the deposition rate of Fe to that of Ag. The term "atomic content" indicates the ratio of atoms contained in the alloy, which is expressed in atom %.

Magnetic alloy films of samples 1 and 2 were formed under the following conditions:
(Sample 1)

An FeAg alloy film 440 Å in thickness was formed under conditions of a degree of vacuum of $1 \times 10^{-5}$ Torr, a substrate at room temperature, a deposition rate of 2 Å/sec., and a ratio 1:3 of the deposition rate of Fe to that of Ag.
(Sample 2)

An FeAg alloy film 1150 Å in thickness was formed under conditions of a degree of vacuum of $2 \times 10^{-5}$ Torr, a substrate at room temperature, a deposition rate of 2 Å/sec., and a ratio 1:2 of the deposition rate of Fe to that of Ag.

Figure 1:
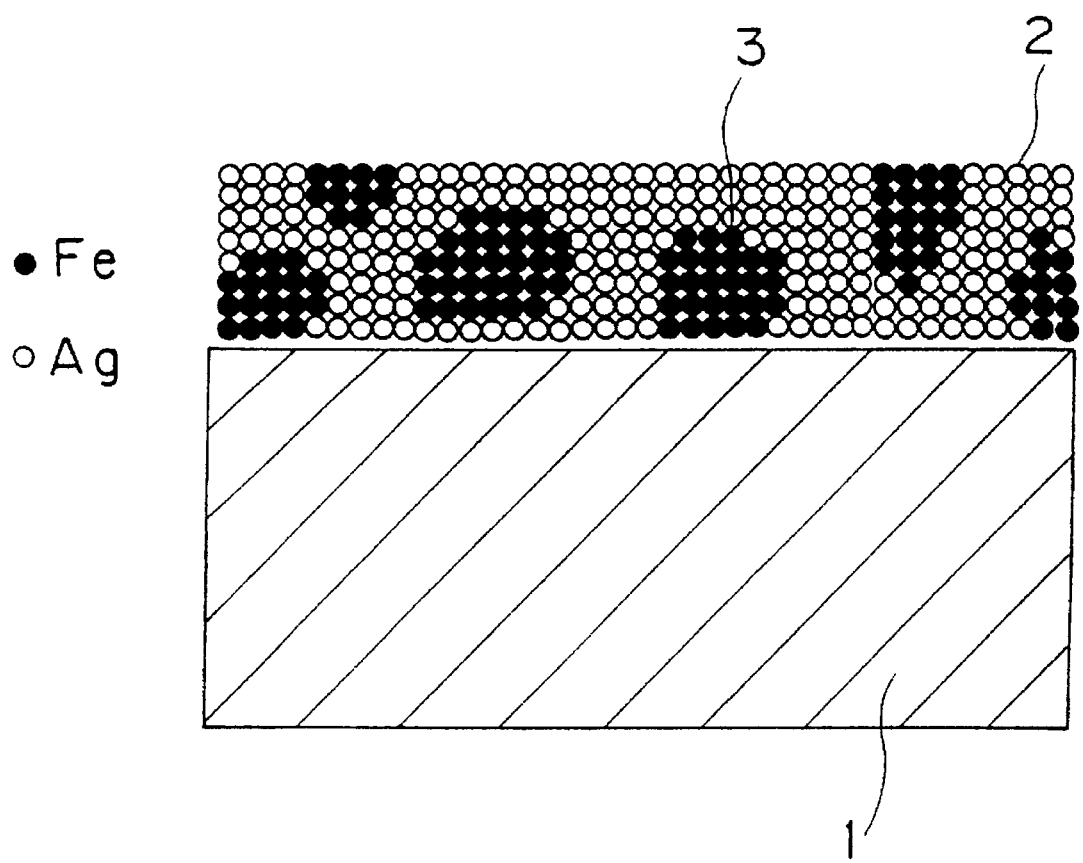
FIG. 1 typically illustrates a magnetoresistance-effect element according to the present invention.

In both of the aforementioned alloy films of samples 1 and 2, the Fe forms ferromagnetic metal atoms and the Ag forms non-magnetic metal atoms. Ag and Fe have the relative property of forming no solid solution, and will not be atomically mixed with each other in both the solid and liquid phases. FIG. 1 is a typical sectional view showing each of the aforementioned FeAg alloy films which were formed on the substrates. Referring to FIG. 1, a magnetic alloy film 2 of FeAg is formed on a substrate 1. In this FeAg magnetic alloy film 2, Fe atoms form grains 3, and Ag atoms are present around the grains 3. The grains 3 represent regions provided with relatively large amounts or concentrations of the ferromagnetic metal atoms, but the boundaries thereof cannot be clearly determined.

Figure 2:
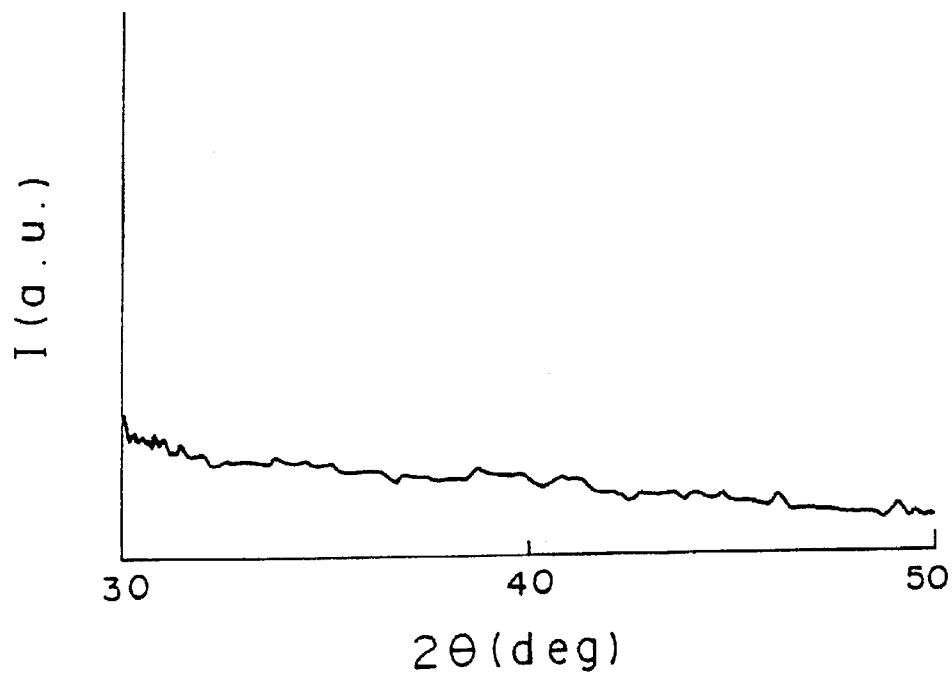
FIG. 2 illustrates an X-ray diffraction pattern of an alloy film according to a sample 1.
Figure 3:
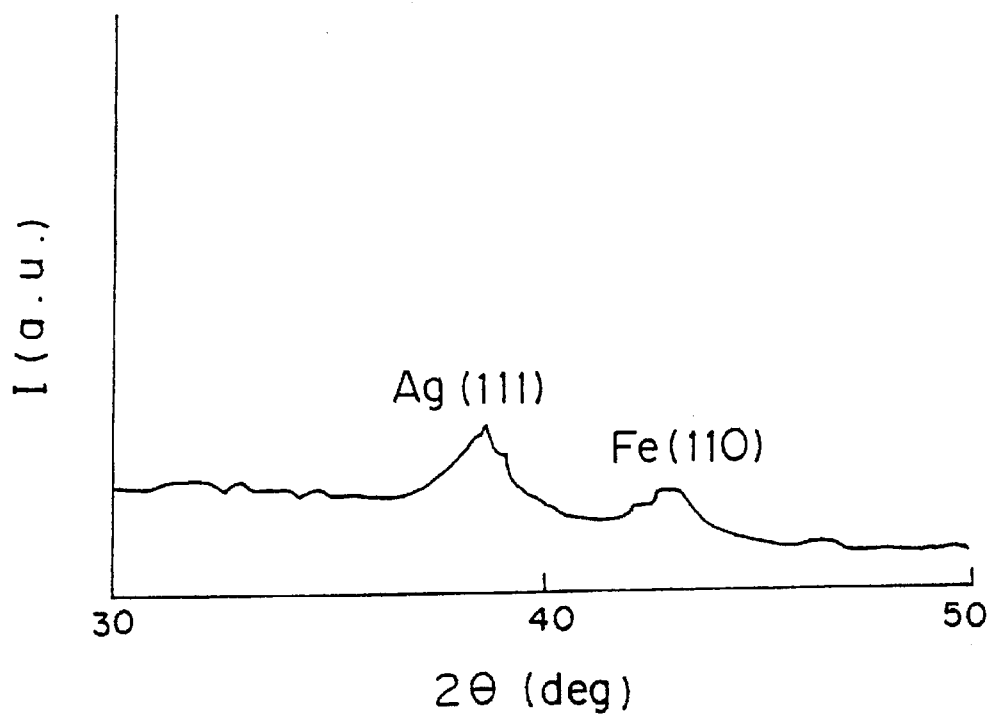
FIG. 3 illustrates an X-ray diffraction pattern of an alloy film according to a sample 2.

FIGS. 2 and 3 show X-ray diffraction patterns of the magnetic alloy films according to the samples 1 and 2 respectively. Referring to FIG. 2, it is understood that the magnetic alloy film according to the sample 2 is in an amorphous state with no peak in its X-ray diffraction pattern. Referring to FIG. 3, a weak peak (44.6°) of a (110) plane of Fe and a weak peak (38.2°) of a (111) plane of Ag are recognized in the X-ray diffraction pattern of the magnetic alloy film according to the sample 2. Thus, it is understood that the magnetic alloy film according to the sample 2 is in a crystalline state at a low degree of crystallization. It is also understood that Fe and Ag forming the magnetic alloy film according to the sample 2 are in relation or have the property of forming no solid solution with each other, because the peaks appearing in FIG. 3 are specific to Fe and Ag.

Figure 4:
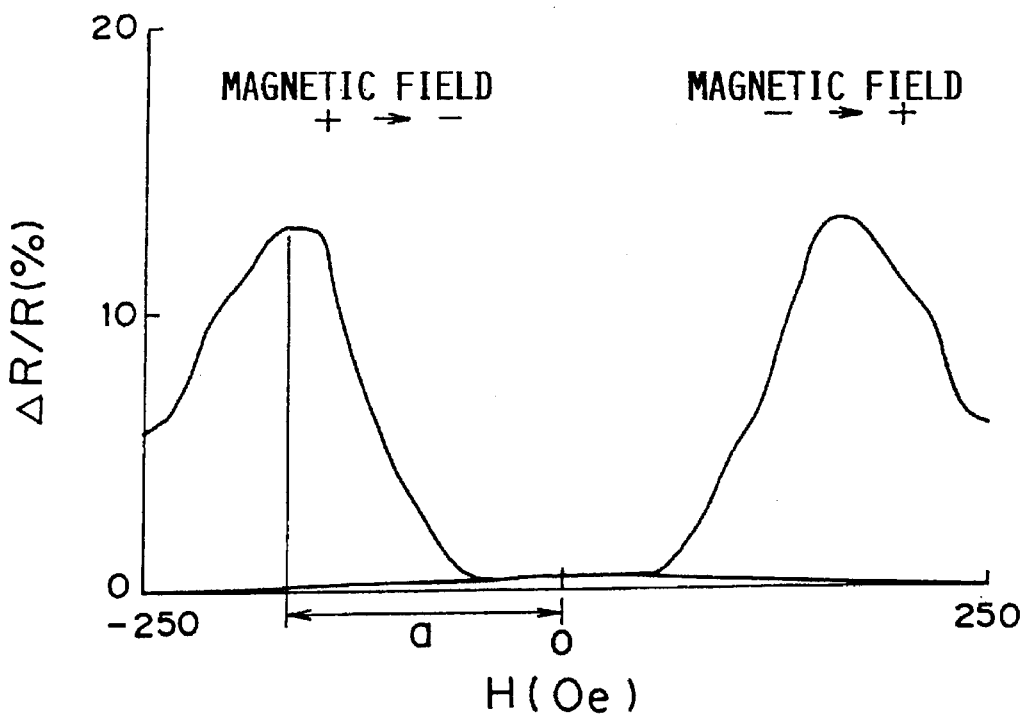
FIG. 4 illustrates the magnetoresistance ratio of the alloy film according to the sample 1.
Figure 5:
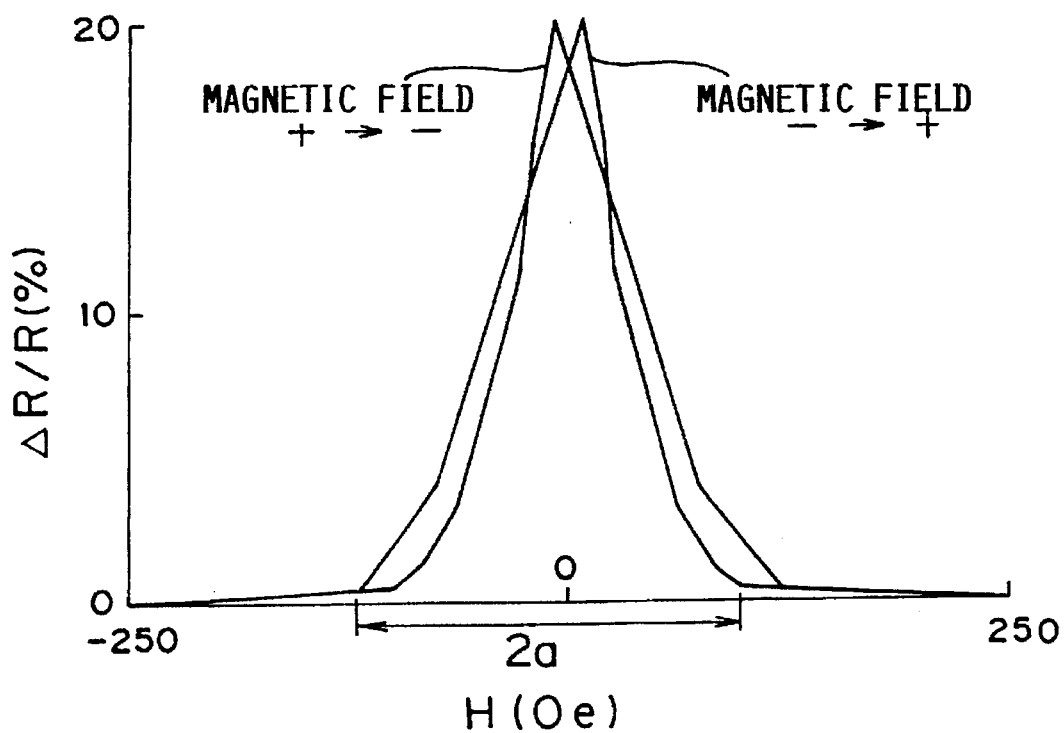
FIG. 5 illustrates the magnetoresistance ratio of the alloy film according to the sample 2.

As to the magnetic alloy films according to the samples 1 and 2, external magnetic fields were applied and varied in a range of −250 to +250 Oe and magnetic resistance values were measured by a four probe method, to obtain magnetoresistance ratios ΔR/R. FIGS. 4 and 5 show the results. Each value of the magnetoresistance ratio ΔR/R was calculated from the following equation, assuming that Rmax represents the maximum resistance and Rmin represents the minimum resistance:

$$\frac{\Delta R}{R} = \frac{Rmax - Rmin}{Rmin} \times 100(\%)$$

FIG. 4 shows the magnetoresistance ratio of the magnetic alloy film according to the sample 1. As shown in FIG. 4, the magnetic alloy film according to the sample 1 exhibited characteristics suitable for a magnetoresistance-effect film, with a magnetoresistance ratio of 13%.

FIG. 5 shows the magnetoresistance ratio of the magnetic alloy film according to the sample 2. As shown in FIG. 5, the magnetic alloy film according to the sample 2 exhibited characteristics suitable for a magnetoresistance-effect film, with a magnetoresistance ratio of 20%.

The magnetic alloy film according to the sample 2 exhibited a higher magnetoresistance ratio than that according to the sample 1. Thus, it is understood that the sample 2 is more advantageously suitable for a magnetoresistance-effect film than the sample 1.

Then, operating magnetic field strength values were obtained as to the magnetic alloy films according to the samples 1 and 2. FIGS. 4 and 5 show the operating magnetic field strength values as widths a of the range of magnetic field strength that causes an abrupt or maximum change of the magnetoresistance ratios ΔR/R.

The magnetic alloy film according to the sample 1, having a small operating magnetic field strength of 160 Oe, is suitable for a magnetoresistance-effect film. The magnetic alloy film according to the sample 2, having a small operating magnetic field strength of 100 Oe, is also suitable for a magnetoresistance-effect film. It is understood that the sample 2 is more suitable for a magnetoresistance-effect film than the sample 1 since its operating magnetic field strength is smaller than that of the sample 1.

As understood from the above description, a magnetic alloy film consisting of Fe forming ferromagnetic metal atoms and Ag forming non-magnetic metal atoms, wherein the Ag does not form a solid solution with Fe, has a high magnetoresistance ratio ΔR/R and a small magnetic operating magnetic field strength. Thus, such an alloy film is suitable for a magnetoresistance-effect element such as a magnetoresistance-effect type magnetic head.

Further, such a magnetic alloy film is easy to manufacture and excellent in mass productivity, because it is a single-layer film. Various ferromagnetic metal atoms A and non-magnetic metal atoms B, which have the relative property of not forming solid solutions with each other and not being atomically mixed with each other in solid and liquid phases, were combined with each other to form alloy films $A_{100-Y}B_Y$ in crystalline states by vacuum deposition. Relations between composition ratios and rates of magnetoresistance change at room temperature (20° C.) were examined as to these alloy films $A_{100-Y}B_Y$. The results will now be described. The atomic contents reported in the following were obtained by analyzing actually formed magnetic alloy films by electron probe microanalysis (EPMA).

Figure 6:
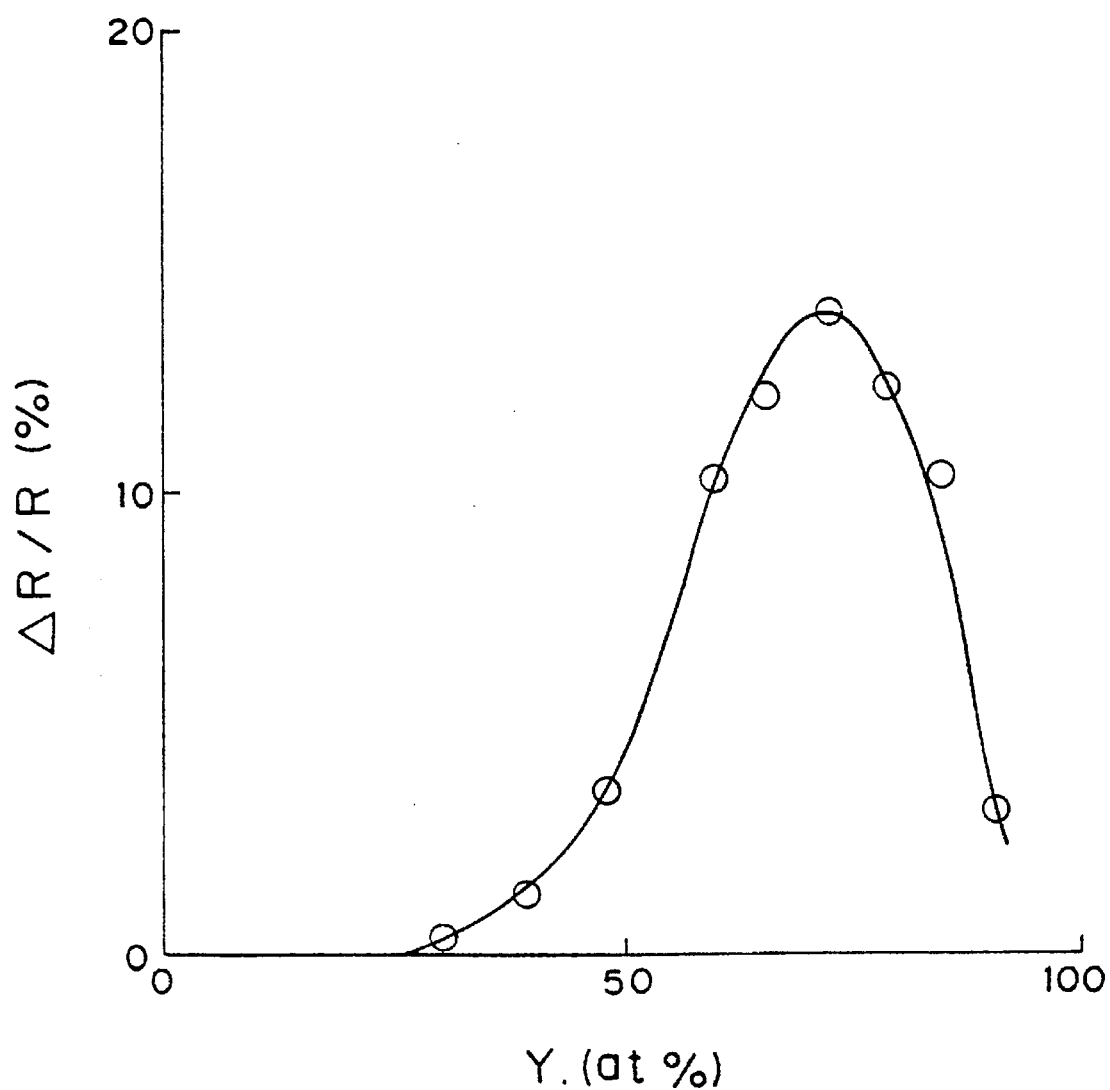
FIG. 6 illustrates the relation between the atomic content of Ag and the magnetoresistance ratio in an FeAg alloy film.

FIG. 6 illustrates the relation between the magnetoresistance ratio ΔR/R and the atomic content of Ag in an FeAg alloy film. In this alloy film, Fe forms the ferromagnetic metal atoms A, and Ag forms the non-magnetic metal atoms B.

Figure 7:
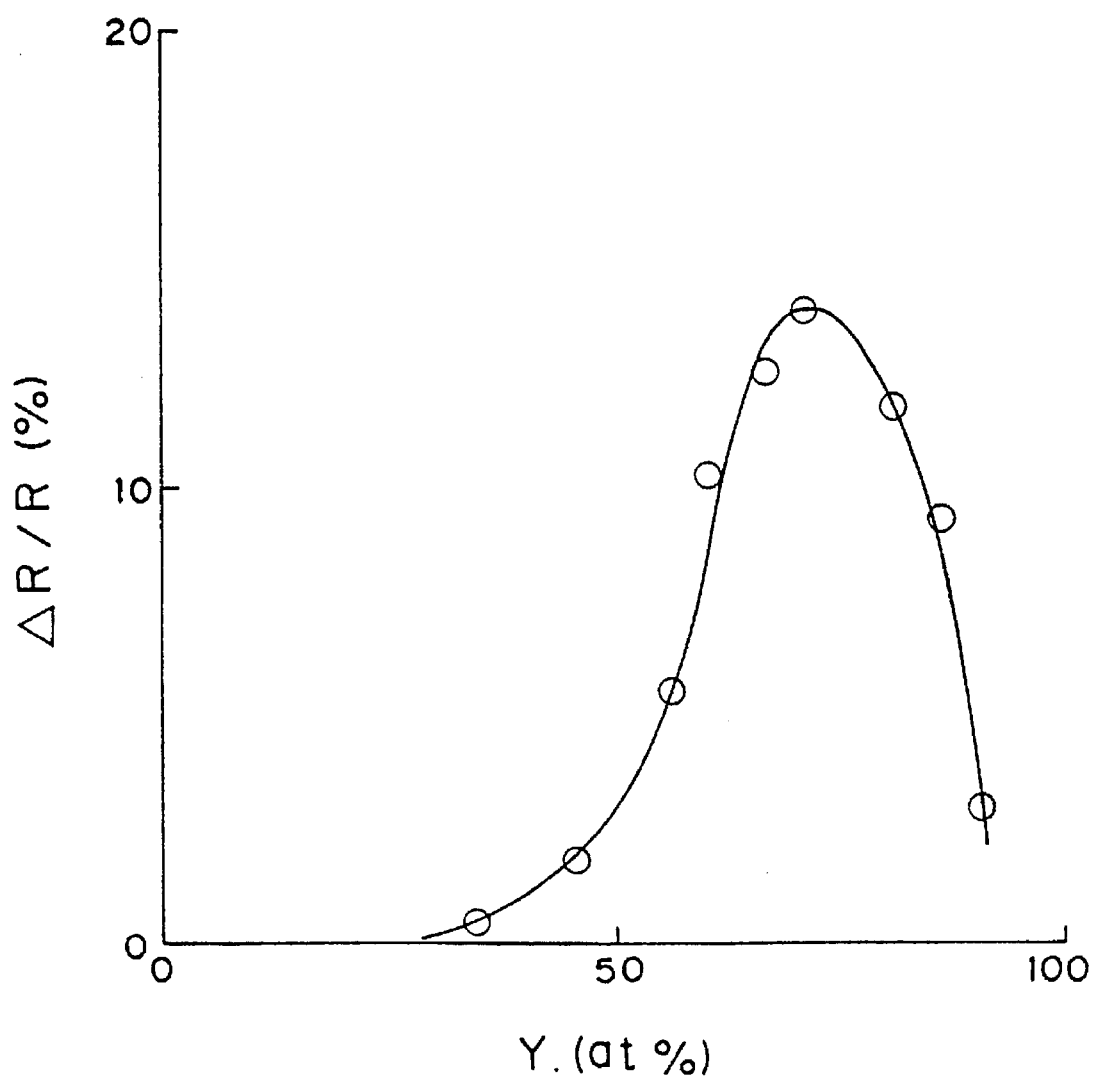
FIG. 7 illustrates the relation between the atomic content of Bi and the magnetoresistance ratio in an FeBi alloy film.

FIG. 7 illustrates the relation between the magnetoresistance ratio ΔR/R and the atomic content of Bi in an FeBi alloy film. In this alloy film, Fe forms the ferromagnetic metal atoms A, and Bi forms the non-magnetic metal atoms B.

Figure 8:
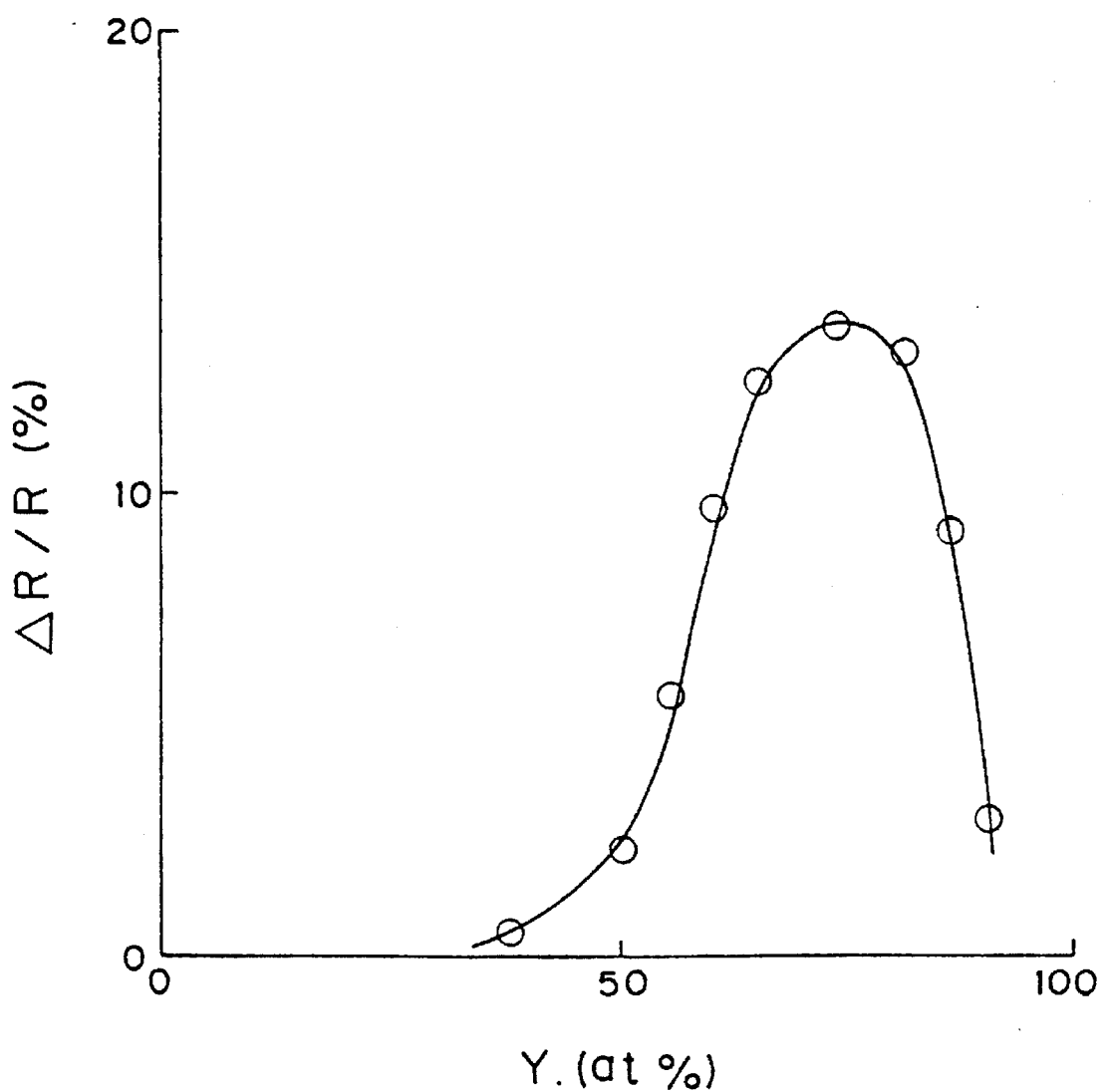
FIG. 8 illustrates the relation between the atomic content of Mg and the magnetoresistance ratio in an FeMg alloy film.

FIG. 8 illustrates the relation between the magnetoresistance ratio ΔR/R and the atomic content of Mg in an FeMg alloy film. In this alloy film, Fe Forms the ferromagnetic metal atoms A, and Mg forms the non-magnetic metal atoms B.

Figure 9:
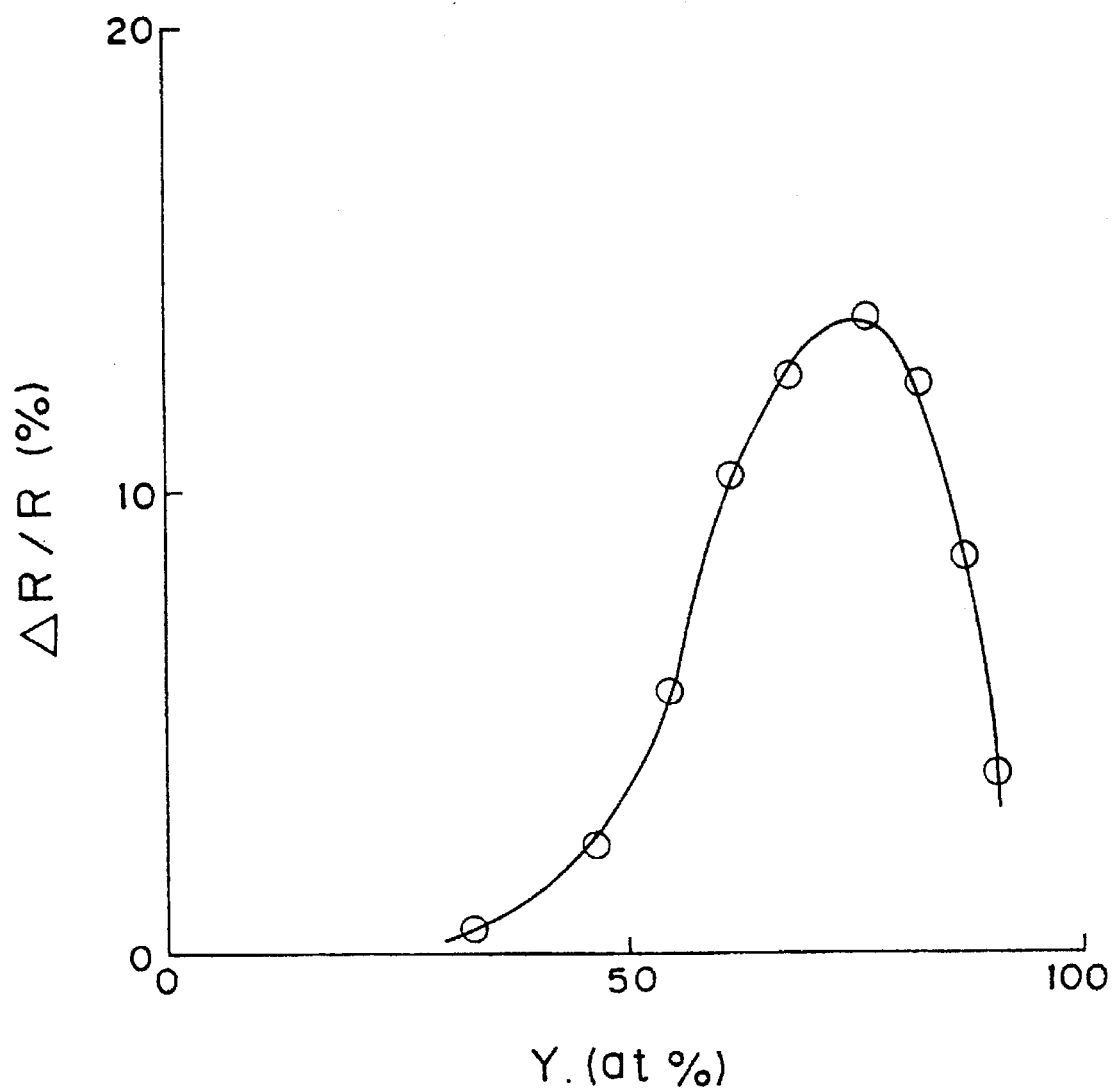
FIG. 9 illustrates the relation between the atomic content of Pb and the magnetoresistance ratio in an FePb alloy film.

FIG. 9 illustrates the relation between the magnetoresistance ratio ΔR/R and the atomic content of Pb in an FePb alloy film. In this alloy film, Fe forms the ferromagnetic metal atoms A, and Pb forms the non-magnetic metal atoms B.

Figure 10:
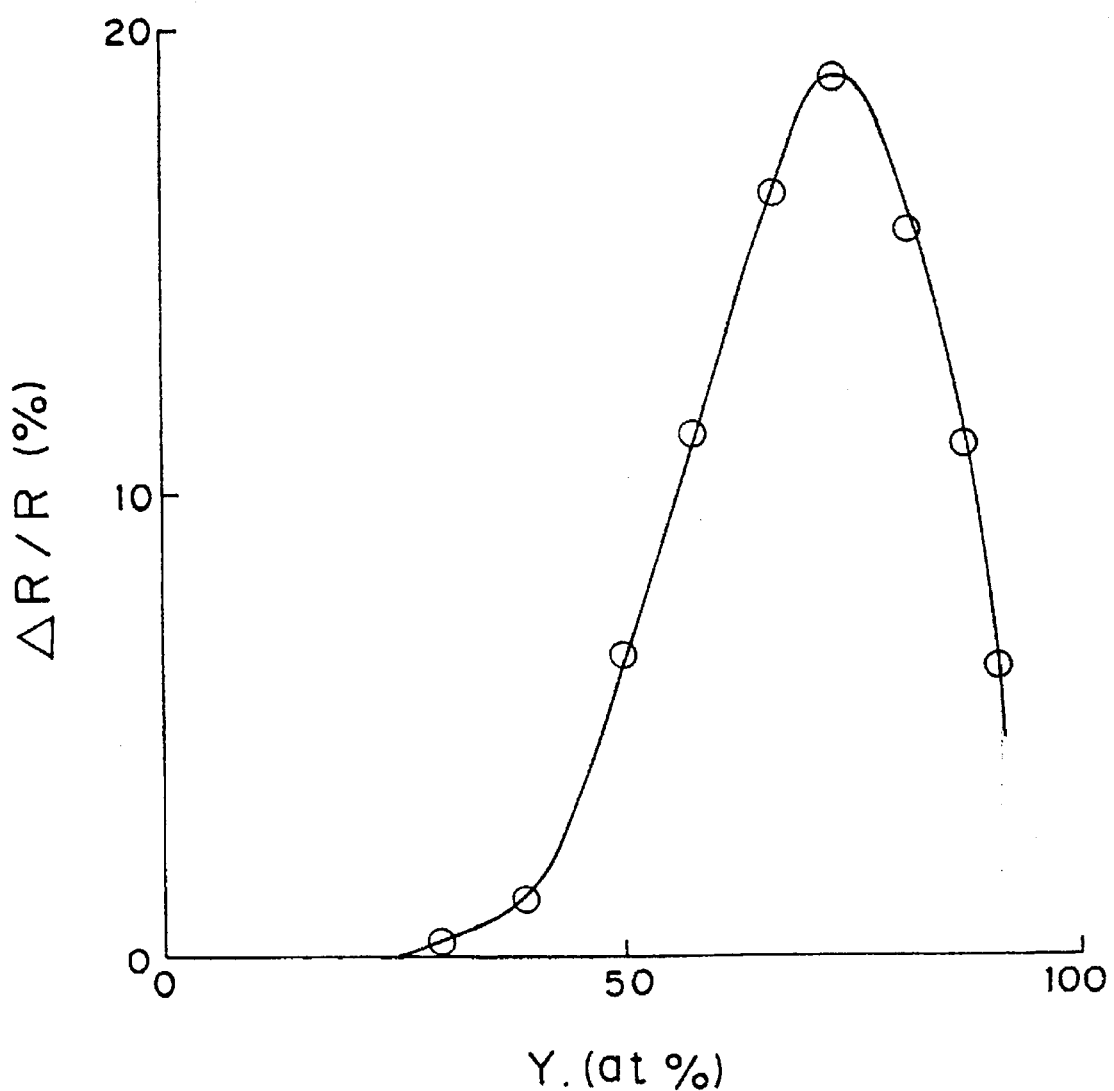
FIG. 10 illustrates the relation between the atomic content of Ag and the magnetoresistance ratio in a CoAg alloy film.

FIG. 10 illustrates the relation between the magnetoresistance ratio ΔR/R and the atomic content of Ag in a CoAg alloy film. In this alloy film, Co forms the ferromagnetic metal atoms A, and Ag forms the non-magnetic metal atoms B.

Figure 11:
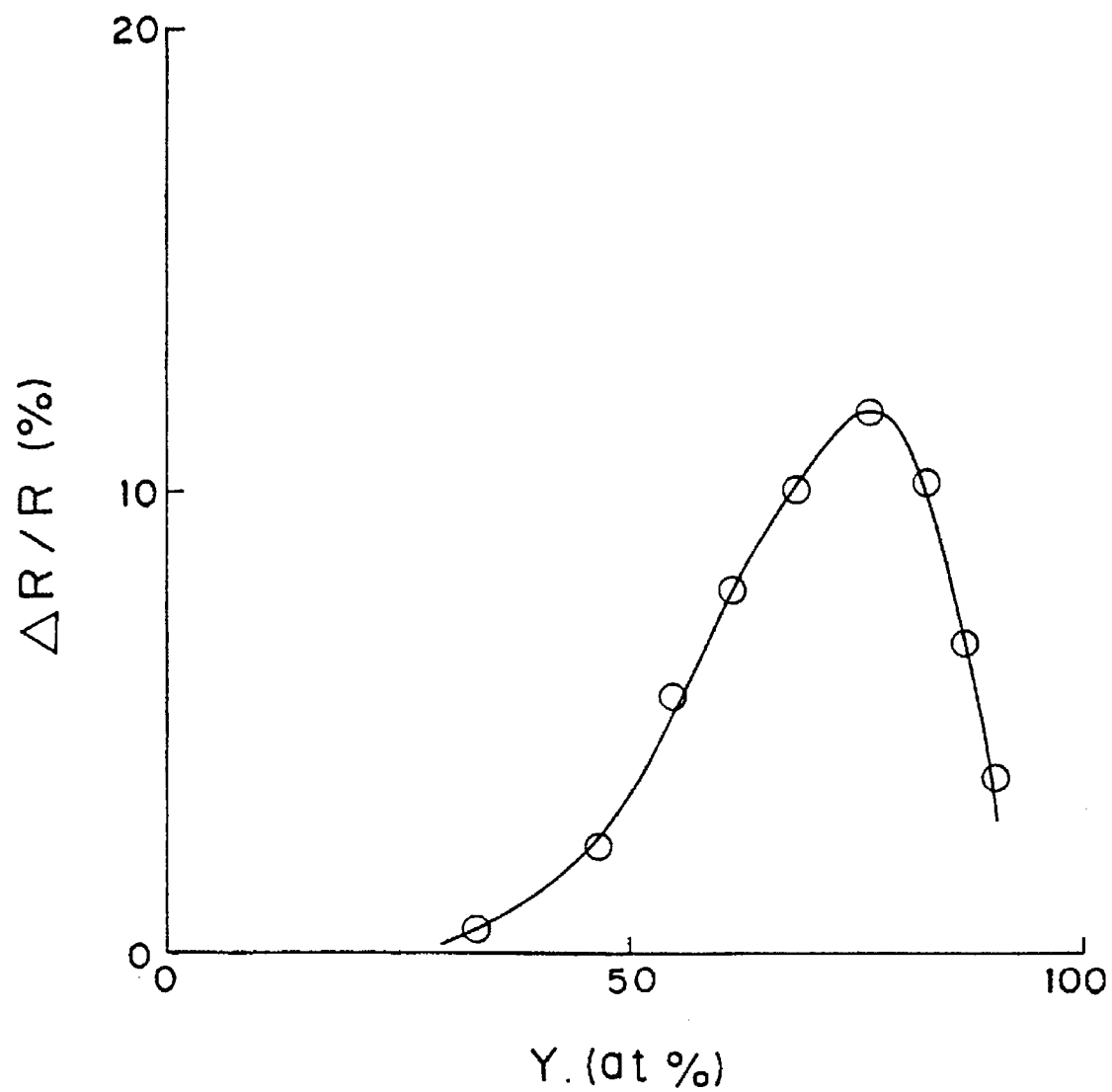
FIG. 11 illustrates the relation between the atomic content of Pb and the magnetoresistance ratio in a CoPb alloy film.

FIG. 11 illustrates the relation between the magnetoresistance ratio ΔR/R and the atomic content of Pb in a CoPb alloy film. In this alloy film, Co forms the ferromagnetic metal atoms A, and Pb forms the non-magnetic metal atoms B.

Table 1 summarizes the results also shown graphically in FIGS. 6 to 11 to show the atomic contents of the non-magnetic metal atoms B required for increasing the magnetoresistance ratios ΔR/R to at least 10% and for achieving the peak magnetoresistance ratio.

TABLE 1

| A | B | ATOMIC CONTENT OF B (at %) WITH ΔR/R>10% | MAXIMUM ΔR/R(%) | ATOMIC CONTENT OF B (at %) WITH MAXIMUM ΔR/R |
|---|---|---|---|---|
| Fe | Ag | 60–85 | 13.5 | 73 |
| Fe | Bi | 60–85 | 13.4 | 71 |
| Fe | Mg | 60–85 | 13.4 | 73 |
| Fe | Pb | 60–85 | 13.6 | 76 |
| Co | Ag | 54–88 | 18.7 | 73 |
| Co | Pb | 68–82 | 11.3 | 76 |

As shown in Table 1, the magnetoresistance ratio ΔR/R exceeds 10% in the FeAg film when the atomic content of Ag is in a range of 60 to 85 atom %. The magnetoresistance ratio ΔR/R reaches the maximum value of 13.5% when the atomic content of Ag is 73 atom %.

The magnetoresistance ratio ΔR/R exceeds 10% in the FeBi alloy film when the atomic content of Bi is in a range of 60 to 85 atom %. The magnetoresistance ratio ΔR/R reaches the maximum value of 13.4% when the atomic content of Bi is 71 atom %.

The magnetoresistance ratio ΔR/R exceeds 10% in the FeMg alloy film when the atomic content of Mg is in a range of 60 to 85 atom %. The magnetoresistance ratio ΔR/R reaches the maximum value of 13.4% when the atomic content or Ag is 73 atom %.

The magnetoresistance ratio ΔR/R exceeds 10% in the FePb alloy film when the atomic content of Pb is in a range of 60 to 85 atom %. The magnetoresistance ratio ΔR/R reaches the maximum value of 13.6% when the atomic content of Pb is 76 atom %.

The magnetoresistance ratio ΔR/R exceeds 10% in the CoAg alloy film when the atomic content of Ag is in a range of 54 to 88 atom %. The magnetoresistance ratio ΔR/R reaches the maximum value of 18.7% when the atomic content of Ag is 73 atom %.

The magnetoresistance ratio ΔR/R exceeds 10% in the CoPb alloy film when the atomic content of Pb is in a range of 68 to 82 atom %. The magnetoresistance ratio ΔR/R reaches the maximum value of 11.3% when the atomic content of Pb is 76 atom %.

Next, other metal atoms C were added to the alloy films $A_{100-Y}B_Y$ to form alloy films $(A_{100-X}C_X)_{100-Y}B_Y$ having crystalline states. Relations between composition ratios and magnetoresistance ratios ΔR/R at room temperature (20° C.) were examined as to these alloy films $(A_{100-X}C_X)_{100-Y}B_Y$. The results will now be described.

FeAg Series Alloy Films

Figure 12:
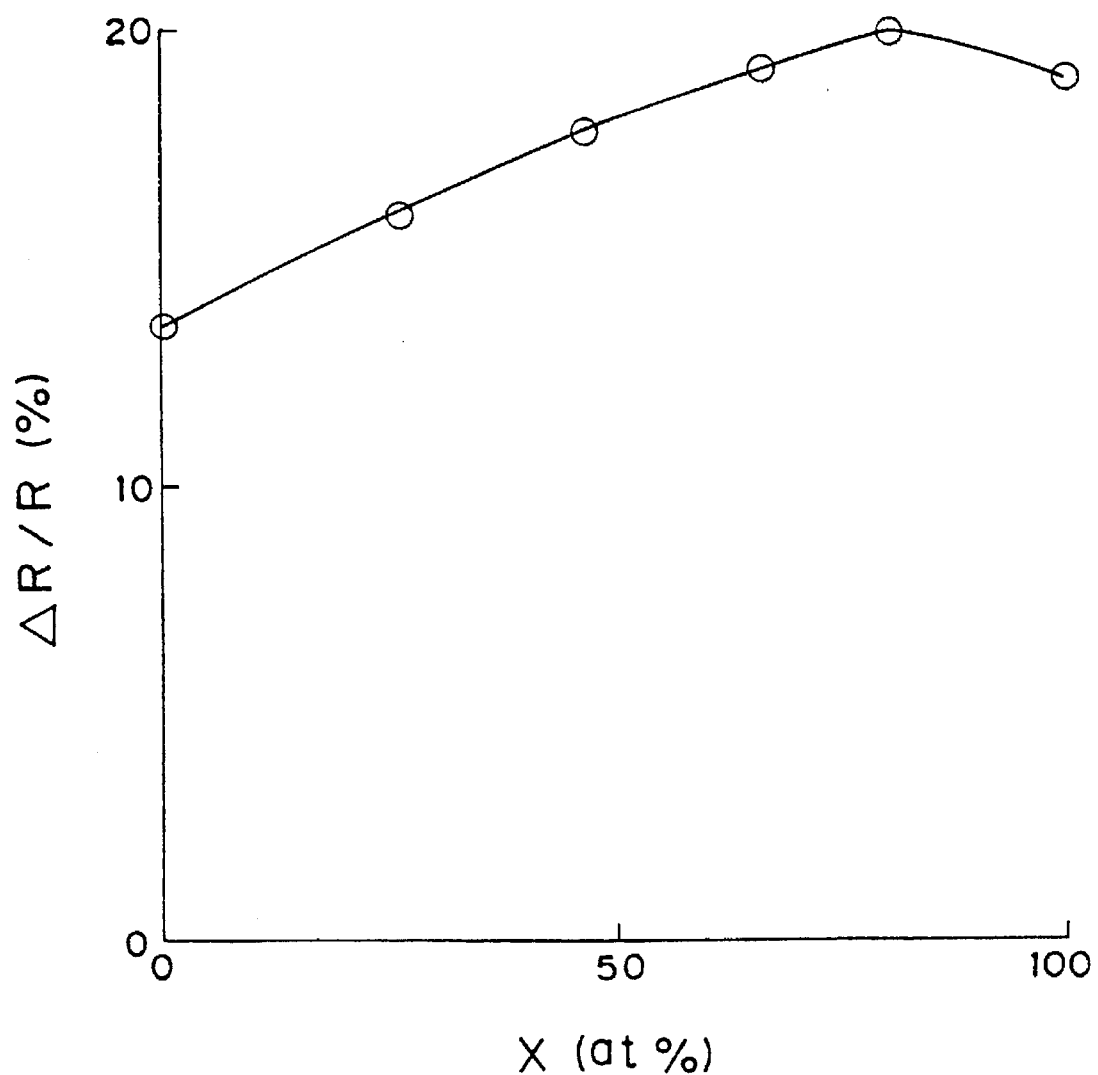
FIG. 12 illustrates the relation between the atomic content of Co in FeCo and the magnetoresistance ratio in an FeCoAg alloy film.

FIG. 12 illustrates the relation between the atomic content of Co in FeCo and the magnetoresistance ratio ΔR/R in an FeCoAg alloy film. In this alloy film, Fe forms the ferromagnetic metal atoms A, Ag forms the non-magnetic metal atoms B, and Co forms the added metal atoms C.

Figure 13:
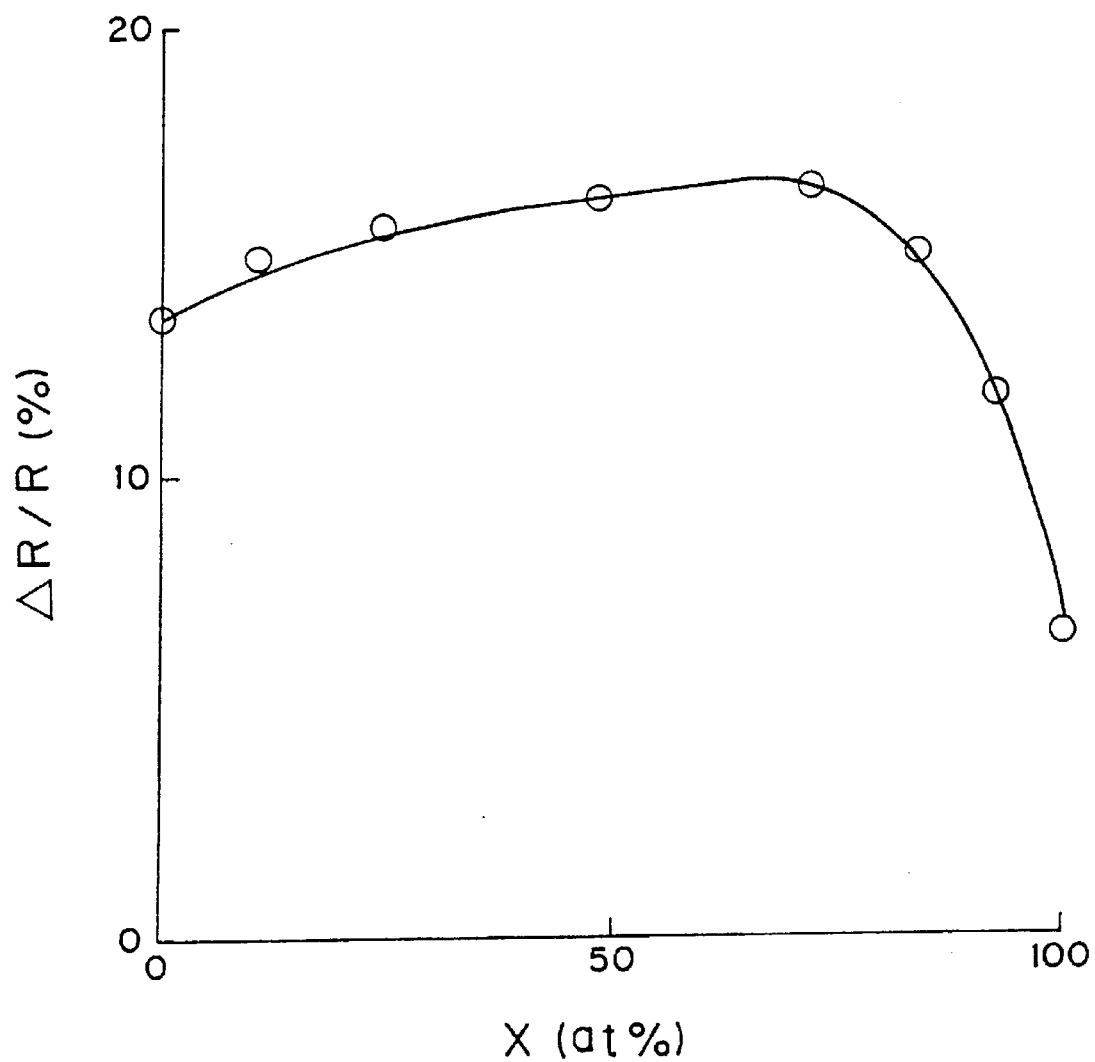
FIG. 13 illustrates the relation between the atomic content of Ni in FeNi and the magnetoresistance ratio in an FeNiAg alloy film.

FIG. 13 illustrates the relation between the atomic content of Ni in FeNi and the magnetoresistance ratio ΔR/R in an FeNiAg alloy film. In this alloy film, Fe forms the ferromagnetic metal atoms A, Ag forms the non-magnetic metal atoms B, and Ni forms the added metal atoms C.

Figure 14:
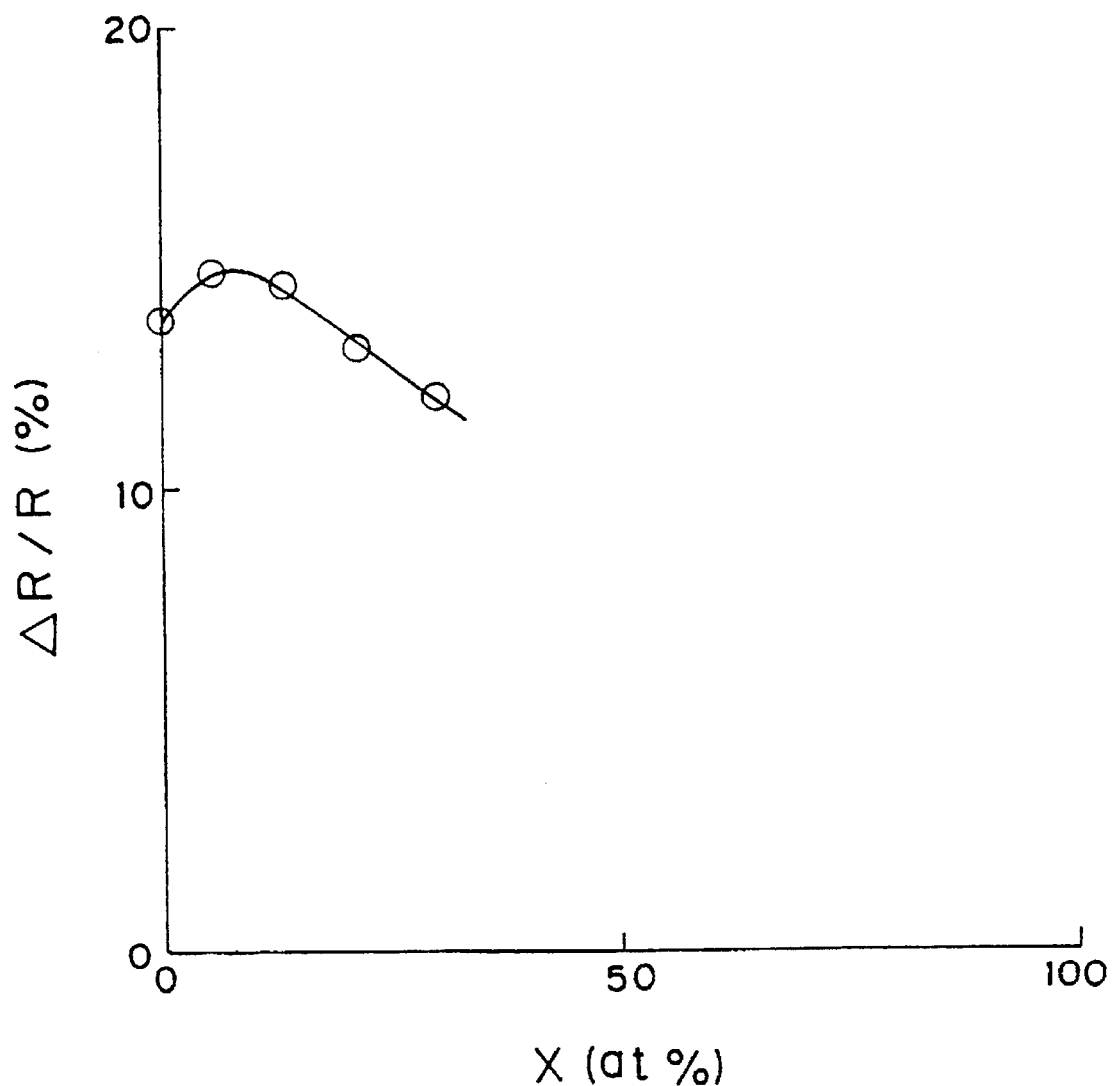
FIG. 14 illustrates the relation between the atomic content of Cu in FeCu and the magnetoresistance ratio in an FeCuAg alloy film.

FIG. 14 illustrates the relation between the atomic content of Cu in FeCu and the magnetoresistance ratio ΔR/R in an FeCuAg alloy film. In this alloy film, Fe forms the ferromagnetic metal atoms A, Ag forms the non-magnetic metal atoms B, and Cu forms the added metal atoms C.

Figure 15:
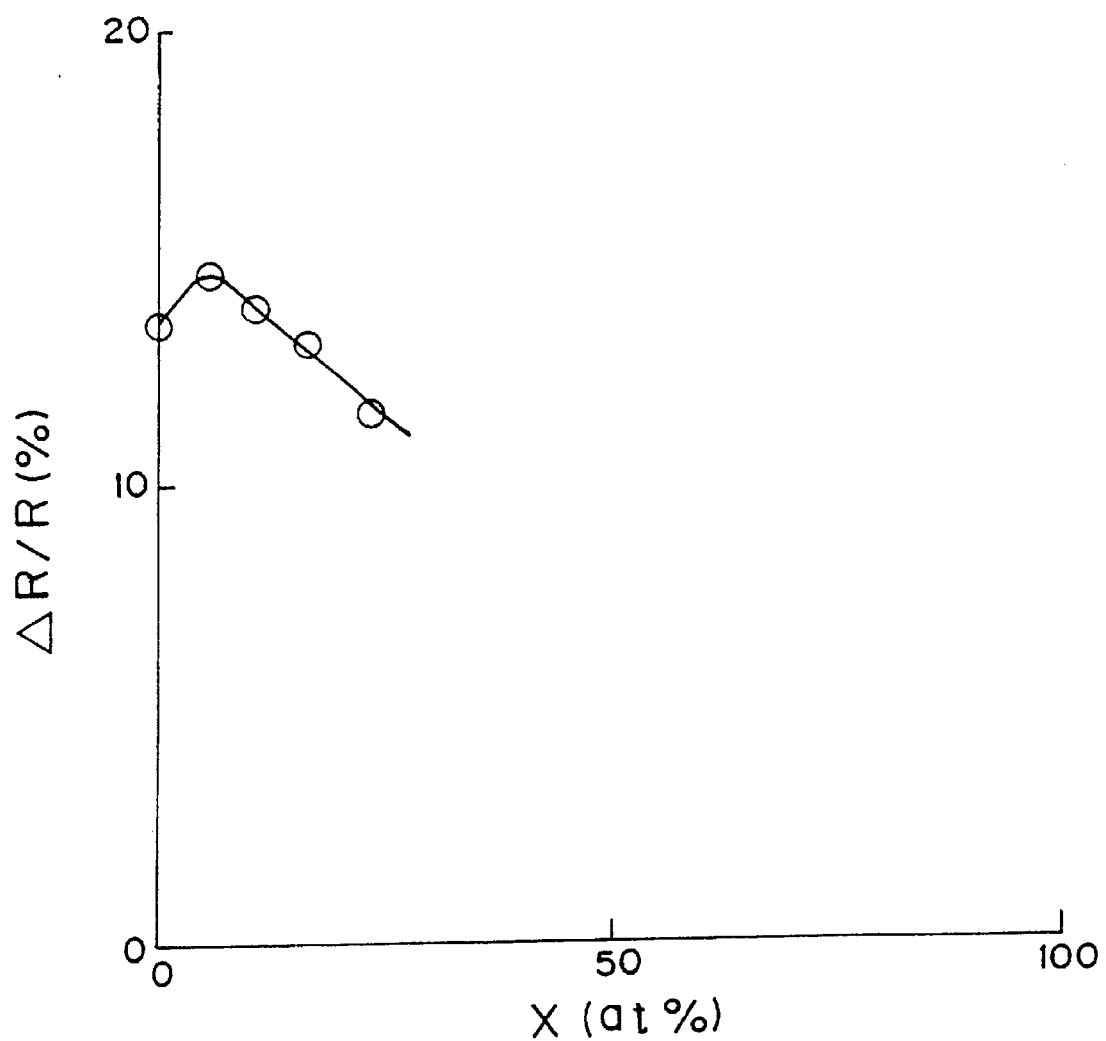
FIG. 15 illustrates the relation between the atomic content of Zn in FeZn and the magnetoresistance ratio in an FeZnAg alloy film.

FIG. 15 illustrates the relation between the atomic content of Zn in FeZn and the magnetoresistance ratio ΔR/R in an FeZnAg alloy film. In this alloy film, Fe forms the ferromagnetic metal atoms A, Ag forms the non-magnetic metal atoms B, and Zn forms the added metal atoms C.

In each of the alloy films of FIGS. 12 to 15, the non-magnetic metal atoms B (i.e. Ag) have a constant atomic content of 73 atom %, while only the relative contents of A and C were varied in several samples.

As shown in FIGS. 12 to 15, especially in comparison to FIG. 6, it is possible to increase the rates of magnetoresistance change by further adding the metal atoms C.

When the metal atoms C comprising Co are added in any arbitrary amount, the magnetoresistance ratio ΔR/R of the FeCoAg alloy film exceeds 13.5%, which is the maximum attained for $Fe_{27}Ag_{73}$ with no addition of Co, as shown in FIG. 12 and FIG. 6.

When the metal atoms C comprising Ni are added in a range of atom contents of not more than 88 atom % in FeNi, the magnetoresistance ratio ΔR/R of the FeNiAg alloy film exceeds 13.5%, which is the level attained with no addition of Ni, as shown in FIG. 13. When Ni is added in 72 atom % relative to the total of Fe and Ni, the magnetoresistance ratio ΔR/R reaches the maximum value of 16.2%.

When the metal atoms C comprising Cu are added in a range of atom contents of not more than 20 atom % in FeCu, the magnetoresistance ratio ΔR/R of the FeCuAg alloy film exceeds 13.5%, which is the level attained with no addition of Cu, as shown in FIG. 14. When Cu is added in 6 atom % relative to the total of Fe and Cu, the magnetoresistance ratio ΔR/R reaches the maximum value of 14.7%.

When the metal atoms C comprising Zn are added in a range of atomic contents of not more than 15 atom % in FeZn, the magnetoresistance ratio ΔR/R of the FeZnAg exceeds 13.5%, which is the level attained with no addition of Zn, as shown in FIG. 15. When Zn is added in 5 atom % relative to the total of Fe and Zn, the magnetoresistance ratio ΔR/R reaches the maximum value of 14.7%.

FeBi Series Alloy Films

Figure 16:
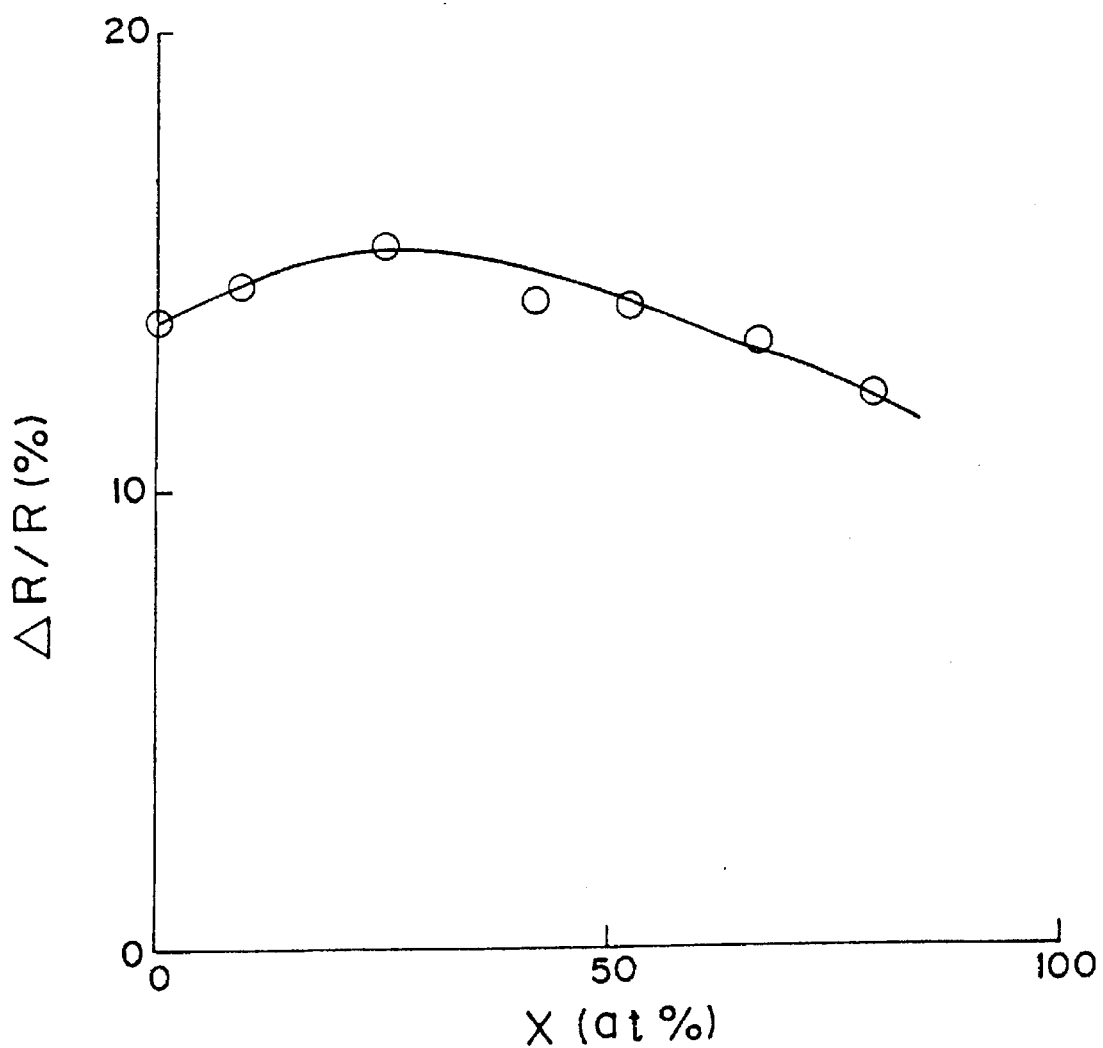
FIG. 16 illustrates the relation between the atomic content of Co in FeCo and the magnetoresistance ratio in an FeCoBi alloy film.

FIG. 16 illustrates the relation between the atomic content of Co in FeCo and the magnetoresistance ratio ΔR/R in an FeCoBi alloy film. In this alloy film, Fe forms the ferromagnetic metal atoms A, Bi forms the non-magnetic metal atoms B, and Co forms the added metal atoms C.

Figure 17:
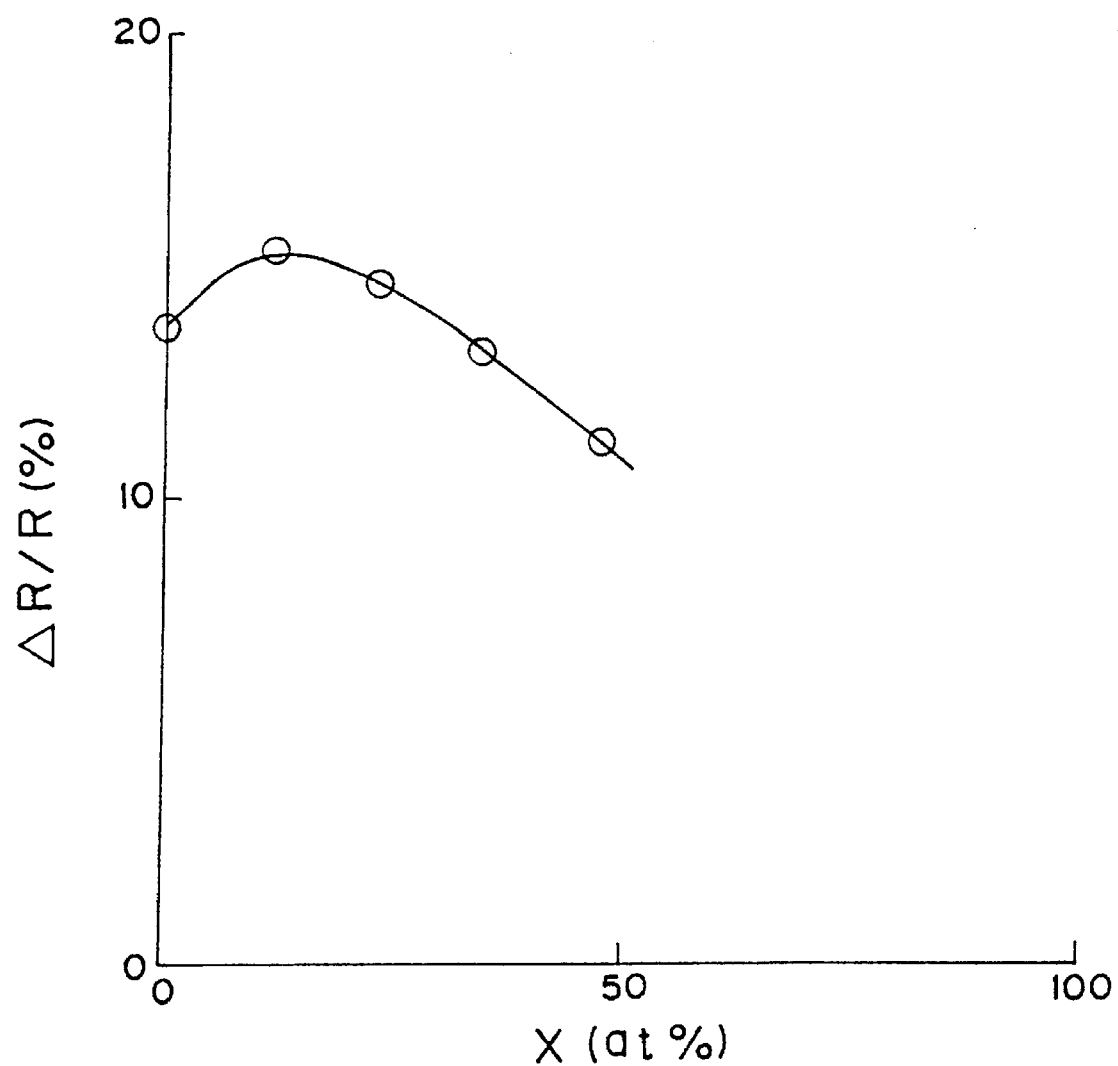
FIG. 17 illustrates the relation between the atomic content of Ni in FeNi and the magnetoresistance ratio in an FeNiBi alloy film.

FIG. 17 illustrates the relation between the atomic content of Ni in FeNi and the magnetoresistance ratio ΔR/R in an FeNiBi alloy film. In this alloy film, Fe forms the ferromagnetic metal atoms A, Bi forms the non-magnetic metal atoms B, and Ni forms the added metal atoms C.

Figure 18:
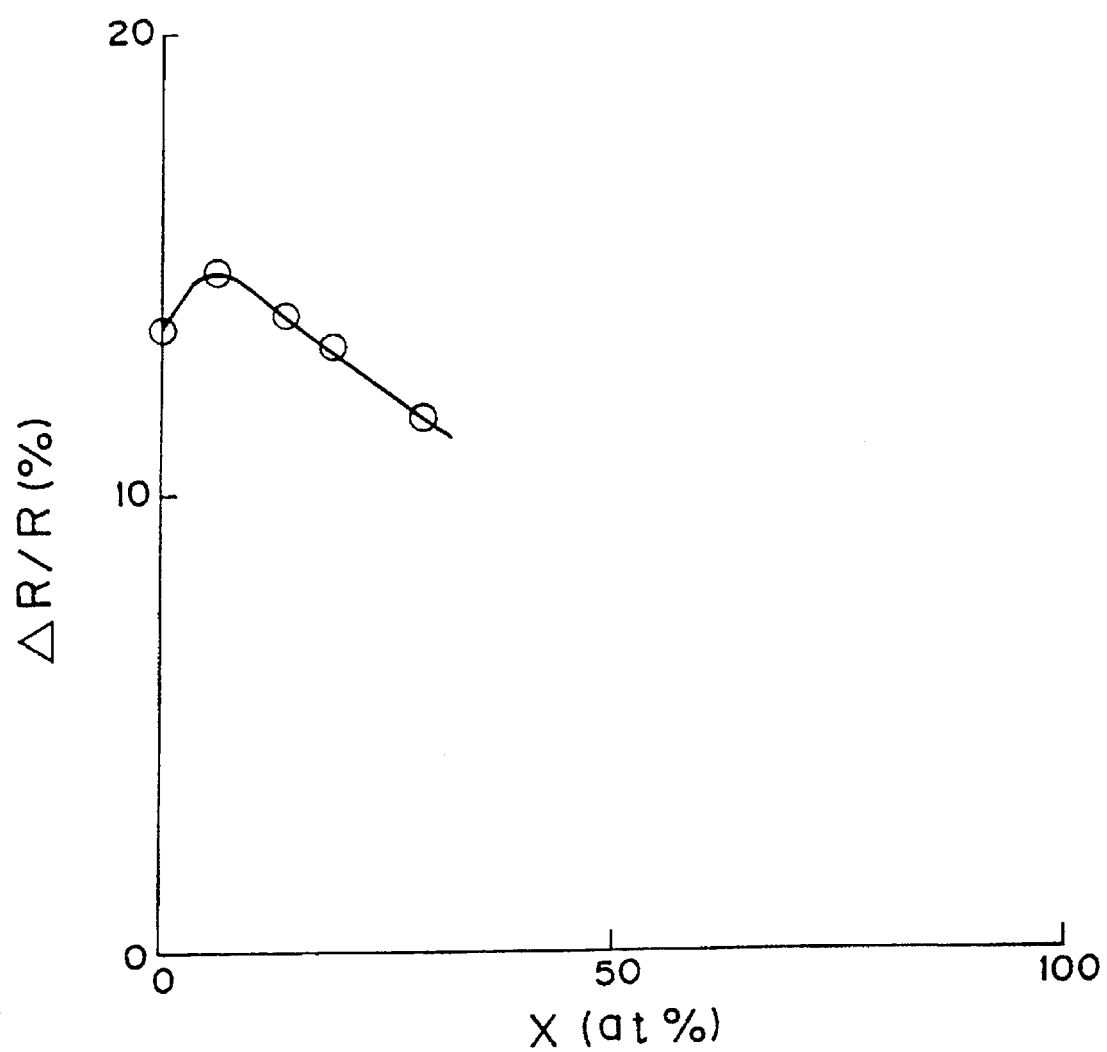
FIG. 18 illustrates the relation between the atomic content of Cu in FeCu and the magnetoresistance ratio in an FeCuBi alloy film.

FIG. 18 illustrates the relation between the atomic content of Cu in FeCu and the magnetoresistance ratio ΔR/R in an FeCuBi alloy film. In this alloy film, Fe forms the ferromagnetic metal atoms A, Bi forms the non-magnetic metal atoms B, and Cu forms the added metal atoms C.

Figure 19:
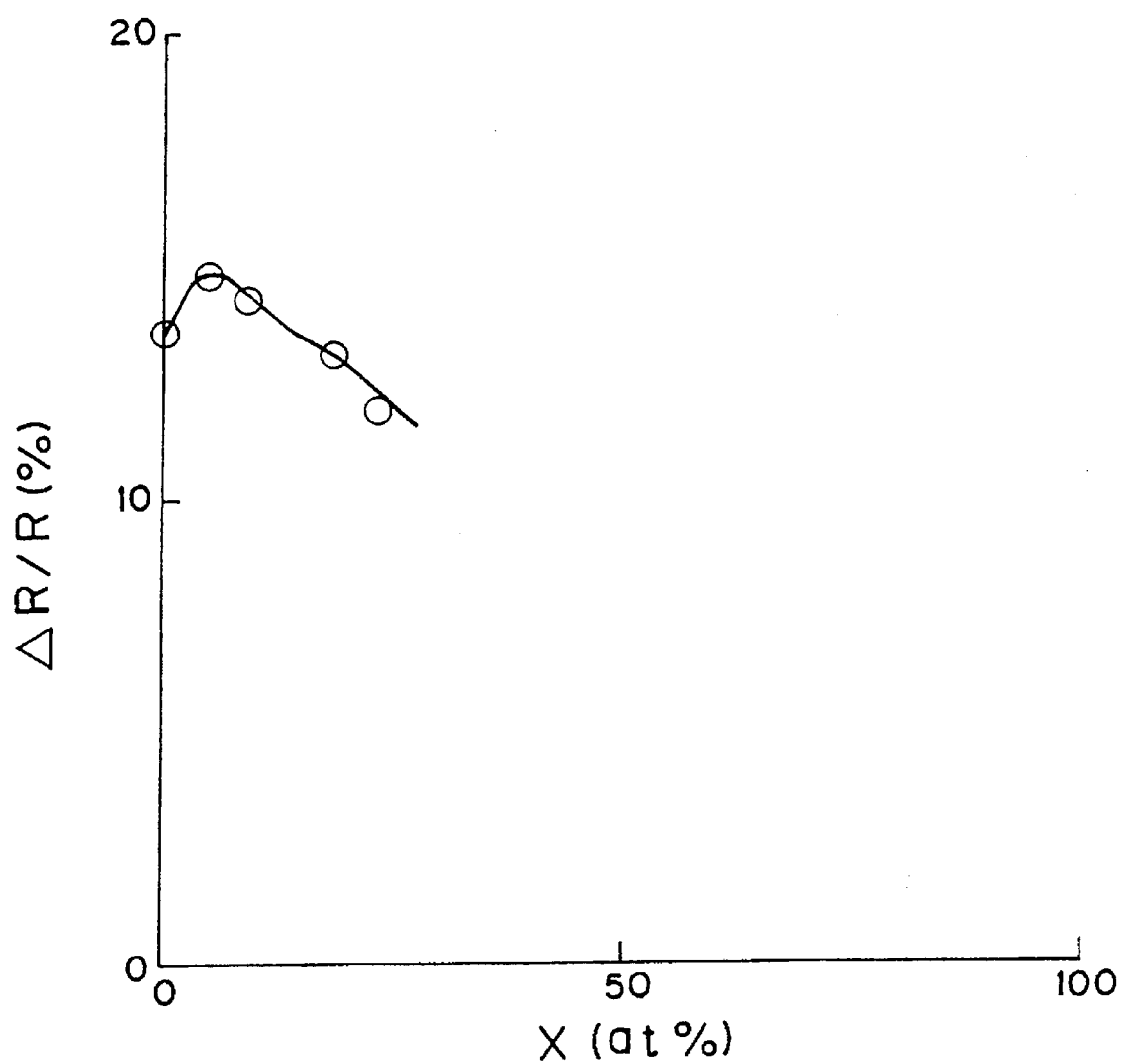
FIG. 19 illustrates the relation between the atomic content of Zn in FeZn and the magnetoresistance ratio in an FeZnBi alloy film.

FIG. 19 illustrates the relation between the atomic content of Zn in FeZn and the magnetoresistance ratio ΔR/R in an FeZnBi alloy film. In this alloy film, Fe forms the ferromagnetic metal atoms A, Bi forms the non-magnetic metal atoms B, and Zn forms the added metal atoms C.

In each of the alloy films of FIGS. 16 to 19, the non-magnetic metal atoms B (i.e. Bi) have a constant atomic content of 71 atom %, while only the relative contents of A and C were varied in several samples. As shown by FIGS. 16 to 19, the magnetoresistance ratio can be increased by adding the metal atoms C.

When the metal atoms C comprising Co are added in a range of atomic contents of not more than 60 atom % in FeCo, the magnetoresistance ratio ΔR/R of the FeCoBi alloy film exceeds 13.4% which is the level attained with no addition of the metal atoms C, as shown in FIG. 16. When Co is added in 25 atom % relative to total FeCo, the magnetoresistance ratio ΔR/R reaches the maximum value of 15.1%.

When the metal atoms C comprising Ni are added in a range of atomic contents of not more than 30 atom % in FeNi, the magnetoresistance ratio ΔR/R of the FeNiBi alloy film exceeds 13.4%, which is the level attained with no addition of the metal atoms C, as shown in FIG. 17. When Ni is added in 11 atom % relative to total FeNi, the magnetoresistance ratio ΔR/R reaches the maximum value of 15.1%.

When the metal atoms C comprising Cu are added in a range of atomic contents of not more than 20 atom % in FeCu, the magnetoresistance ratio ΔR/R of the FeCuBi alloy film exceeds 13.4%, which is the level attained with no addition of the metal atoms C, as shown in FIG. 18. When Cu is added in 6 atom % relative to total FeCu, the magnetoresistance ratio ΔR/R reaches the maximum value of 14.9%.

When the metal atoms C comprising Zn are added in a range of atomic contents of not more than 15 atom % in FeZn, the magnetoresistance ratio ΔR/R of the FeZnBi alloy film exceeds 13.4%, which is the level attained with no addition of the metal atoms C, as shown in FIG. 19. When Zn is added in 4 atom % relative to the total FeZn, the magnetoresistance ratio ΔR/R reaches the maximum value of 14.9%.

FeMg Series Alloy Films

Figure 20:
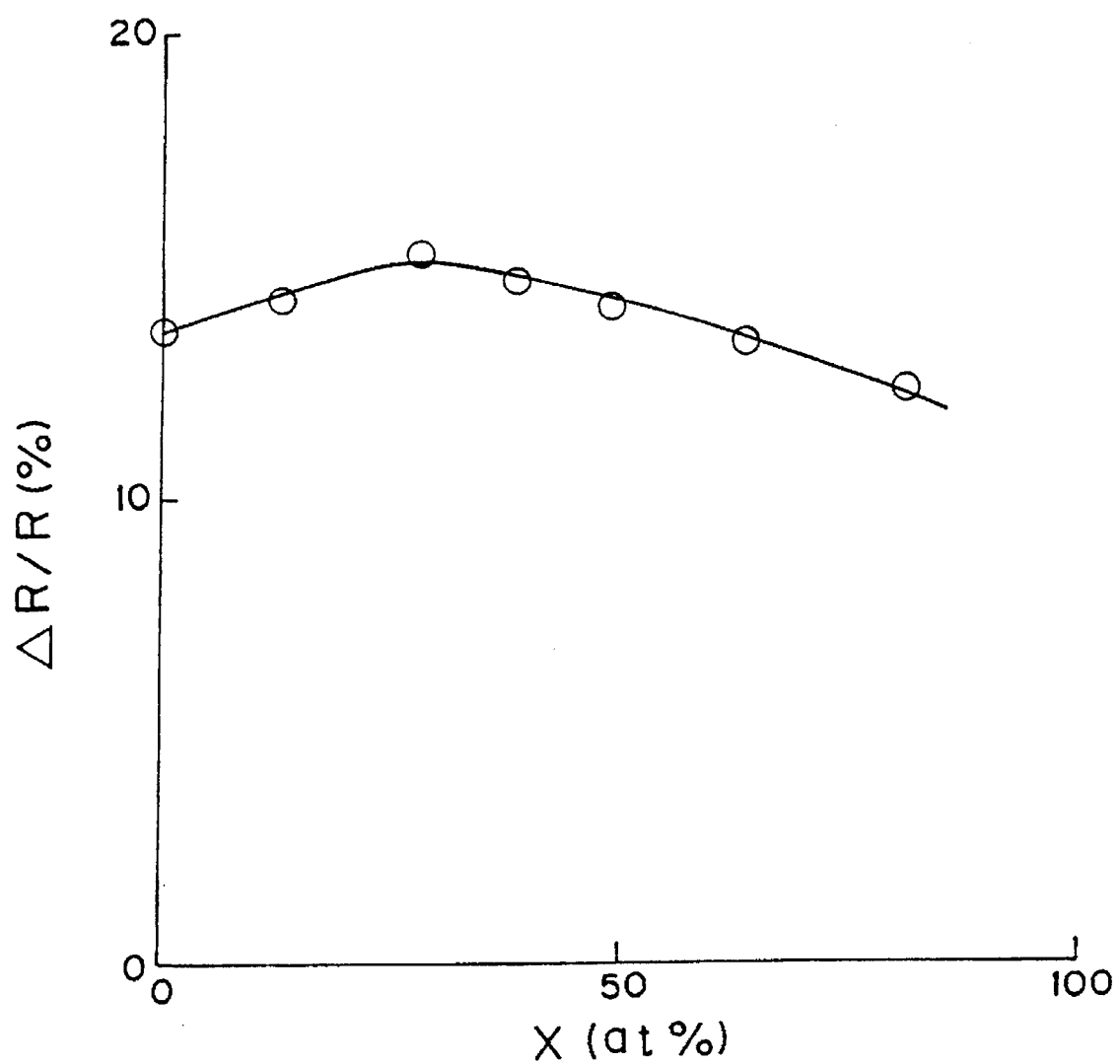
FIG. 20 illustrates the relation between the atomic content of Co in FeCo and the magnetoresistance ratio in an FeCoMg alloy film.

FIG. 20 illustrates the relation between the atomic content of Co in FeCo and the magnetoresistance ratio ΔR/R in an FeCoMg alloy film. In this alloy film, Fe forms the ferromagnetic metal atoms A, Mg forms the non-magnetic metal atoms B, and Co forms the added metal atoms C.

Figure 21:
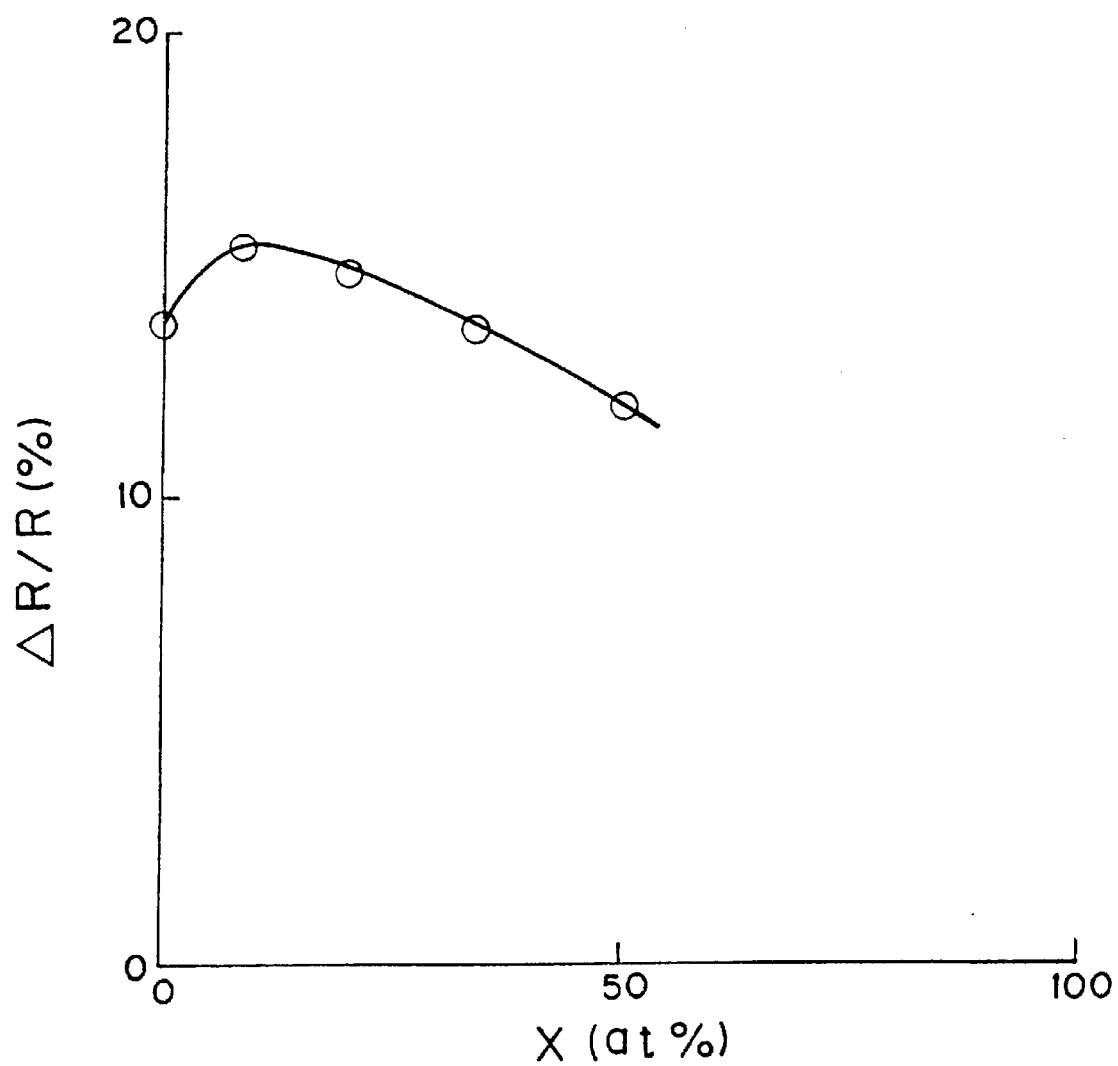
FIG. 21 illustrates the relation between the atomic content of Ni in FeNi and the magnetoresistance ratio in an FeNiMg alloy film.

FIG. 21 illustrates the relation between the atomic content of Ni in FeNi and the magnetoresistance ratio ΔR/R in an FeNiMg alloy film. In this alloy film, Fe forms the ferromagnetic metal atoms A, Mg forms the non-magnetic metal atoms B, and Ni forms the added metal atoms C.

Figure 22:
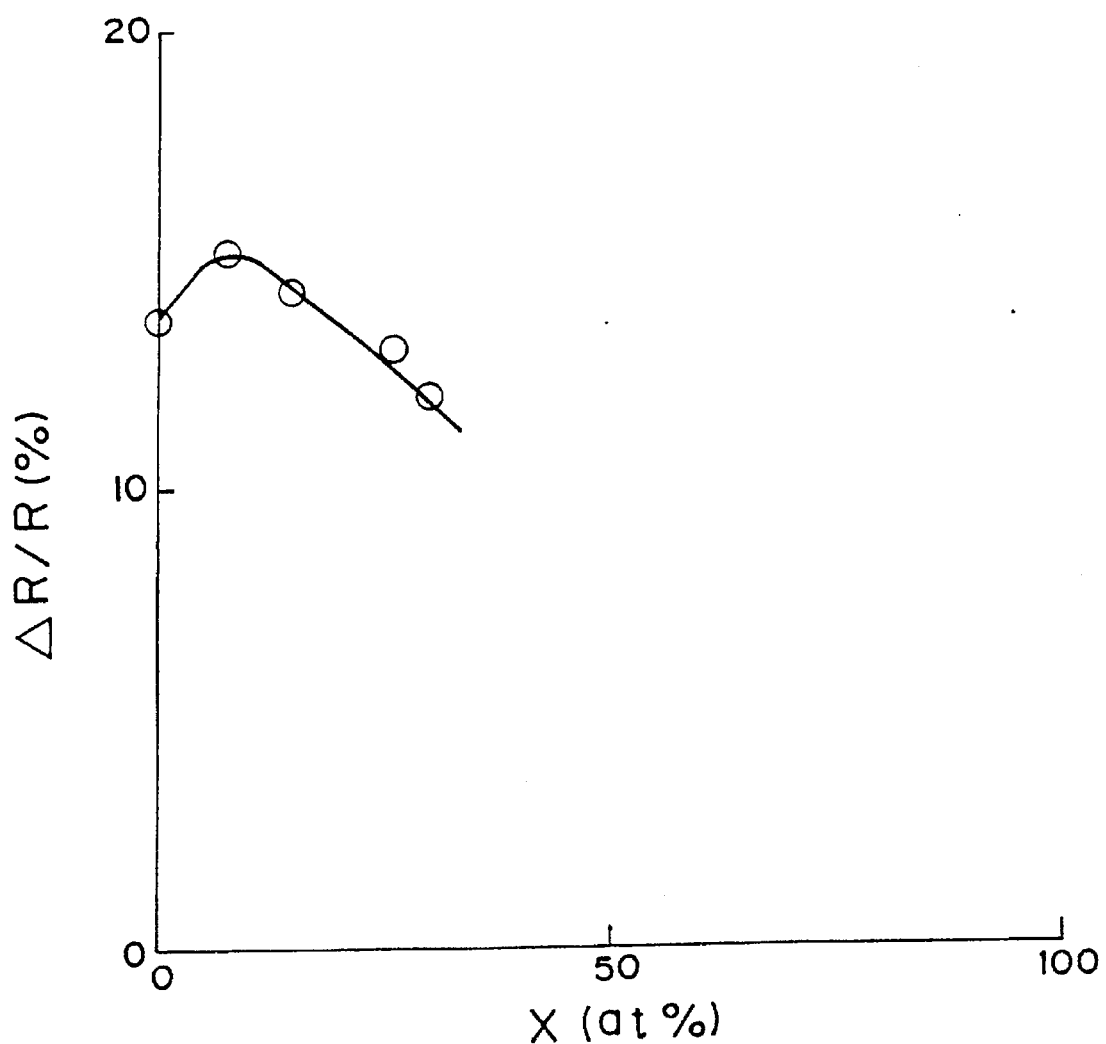
FIG. 22 illustrates the relation between the atomic content of Cu in FeCu and the magnetoresistance ratio in an FeCuMg alloy film.

FIG. 22 illustrates the relation between the atomic content of Cu in FeCu and the magnetoresistance ratio ΔR/R in an FeCuMg alloy film. In this alloy film, Fe forms the ferromagnetic metal atoms A, Mg forms the non-magnetic metal atoms B, and Cu forms the added metal atoms C.

Figure 23:
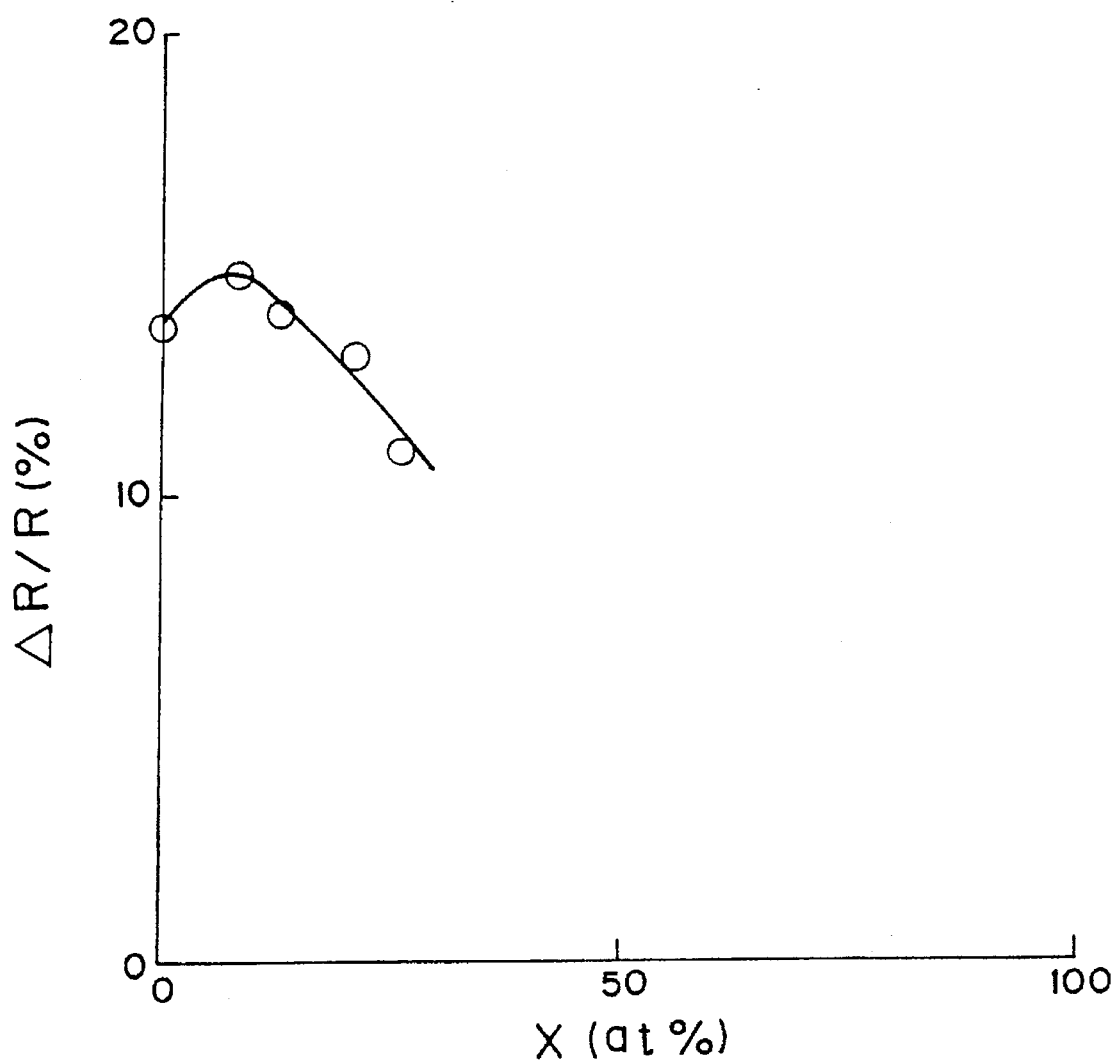
FIG. 23 illustrates the relation between the atomic content of Zn in FeZn and the magnetoresistance ratio in an FeZnMg alloy film.

FIG. 23 illustrates the relation between the atomic content of Zn in FeZn and the magnetoresistance ratio ΔR/R in an FeZnMg alloy film. In this alloy film, Fe forms the ferromagnetic metal atoms A, Mg forms the non-magnetic metal atoms B, and Zn forms the added metal atoms C.

In each of the above alloy films of FIGS. 20 to 23, the atomic content of the non-magnetic metal atoms B is a constant 73 atom %. The relative content of the atoms A and C is varied for several samples.

When the metal atoms C comprising Co are added in a range of atomic contents of not more than 60 atom % in FeCo, the magnetoresistance ratio ΔR/R of the FeCoMg alloy film exceeds 13.4%, which is the level attained with no addition of the metal atoms C, as shown in FIG. 20. When Co is added in 28 atom % relative to the total FeCo, the magnetoresistance ratio ΔR/R reaches the maximum value of 15.2%.

When the metal atoms C comprising Ni are added in a range of atomic contents of not more than 30 atom % in FeNi, the magnetoresistance ratio ΔR/R of the FeNiMg alloy film exceeds 13.4%, which is the level attained with no addition of the metal atoms C, as shown in FIG. 21. When Ni is added in 8 atom % relative to total FeNi, the magnetoresistance ratio ΔR/R reaches the maximum value of 15.2%.

When the metal atoms C comprising Cu are added in a range of atomic contents of not more than 20 atom % in FeCu, the magnetoresistance ratio ΔR/R of the FeCuMg alloy film exceeds 13.4%, which is the level attained with no addition of the metal atoms C, as shown in FIG. 22. When Cu is added in 8 atom % relative to total FeCu, the magnetoresistance ratio ΔR/R reaches the maximum value of 15%.

When the metal atoms C comprising Zn are added in a range of atomic contents of not more than 15 atom % in FeZn, the magnetoresistance ratio ΔR/R of the FeZnMg alloy film exceeds 13.4%, which is the level attained with no addition of the metal atoms C, as shown in FIG. 23. When Zn is added in 8 atom % relative to total FeZn, the magnetoresistance ratio ΔR/R reaches the maximum value of 14.8%.

FePb Series Alloy Films

Figure 24:
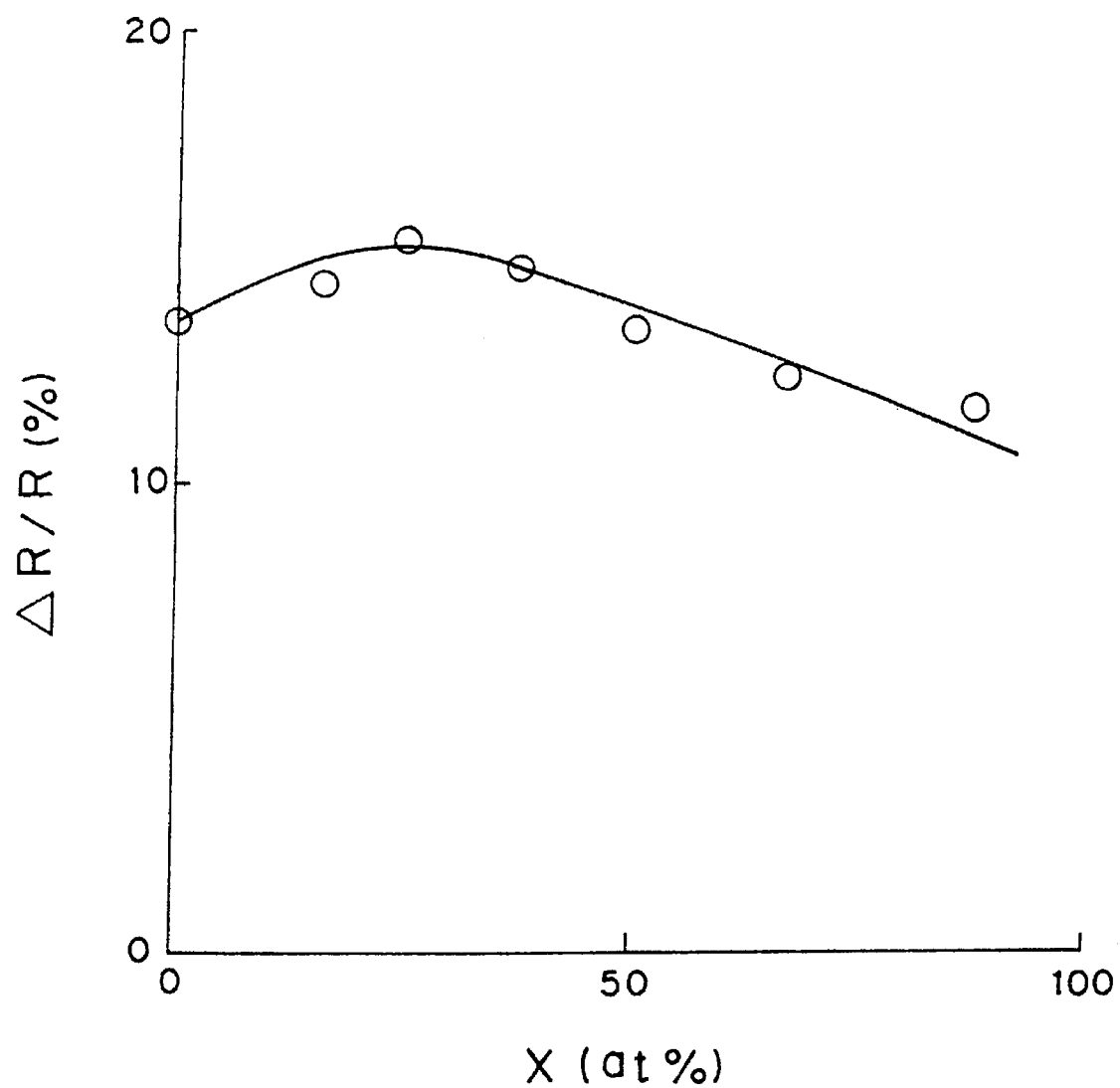
FIG. 24 illustrates the relation between the atomic content of Co in FeCo and the magnetoresistance ratio in an FeCoPb alloy film.

FIG. 24 illustrates the relation between the atomic content of Co in FeCo and the magnetoresistance ratio ΔR/R in an FeCoPb alloy film. In this alloy film, Fe forms the ferromagnetic metal atoms A, Pb forms the non-magnetic metal atoms B, and Co forms the added metal atoms C.

Figure 25:
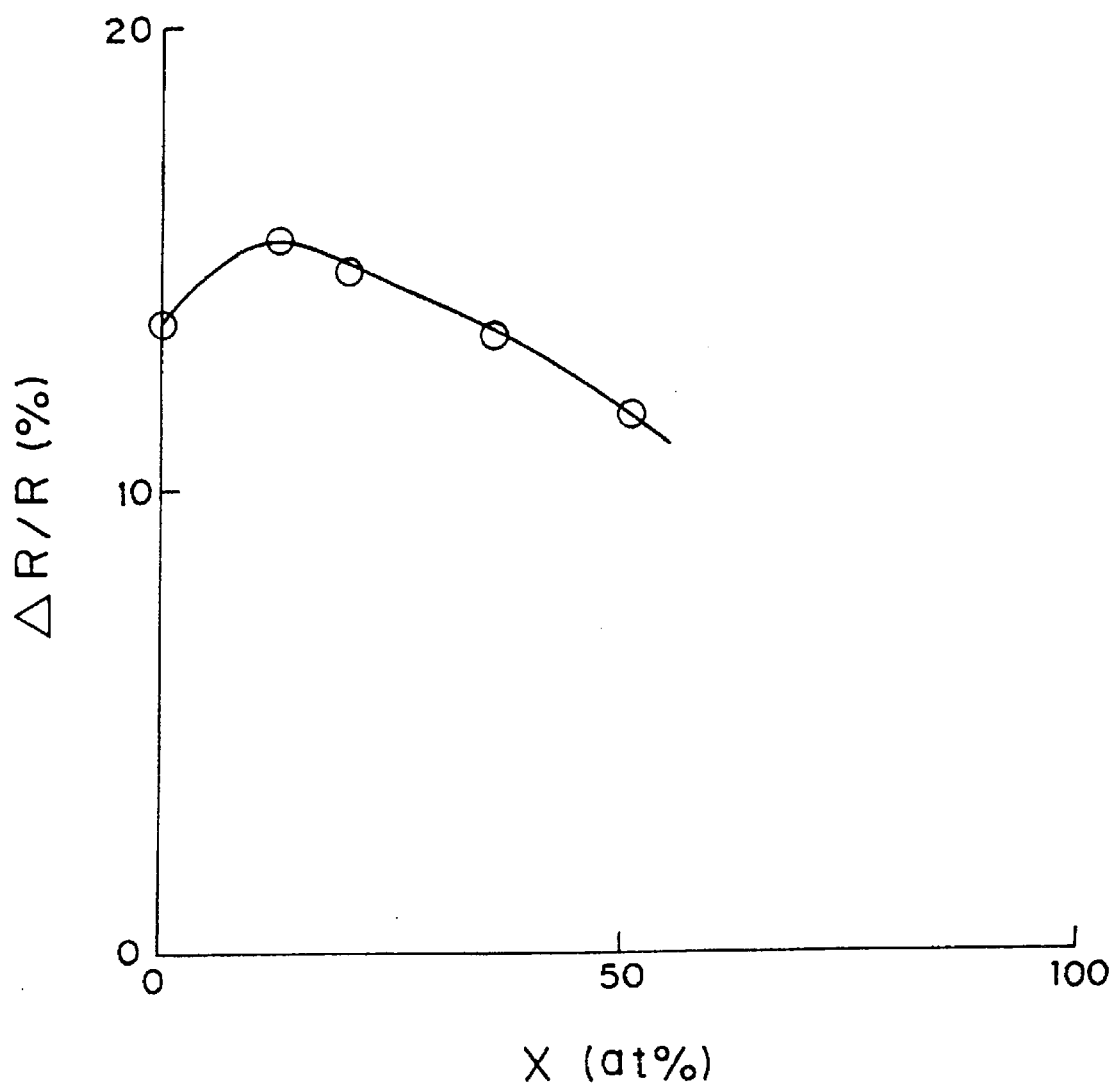
FIG. 25 illustrates the relation between the atomic content of Ni in FeNi and the magnetoresistance ratio in an FeNiPb alloy film.

FIG. 25 illustrates the relation between the atomic content Ni in FeNi and the magnetoresistance ratio ΔR/R in an FeNiPb alloy film. In this alloy film, Fe forms the ferromagnetic metal atoms A, Pb forms the non-magnetic metal atoms B, and Ni forms the added metal atoms C.

Figure 26:
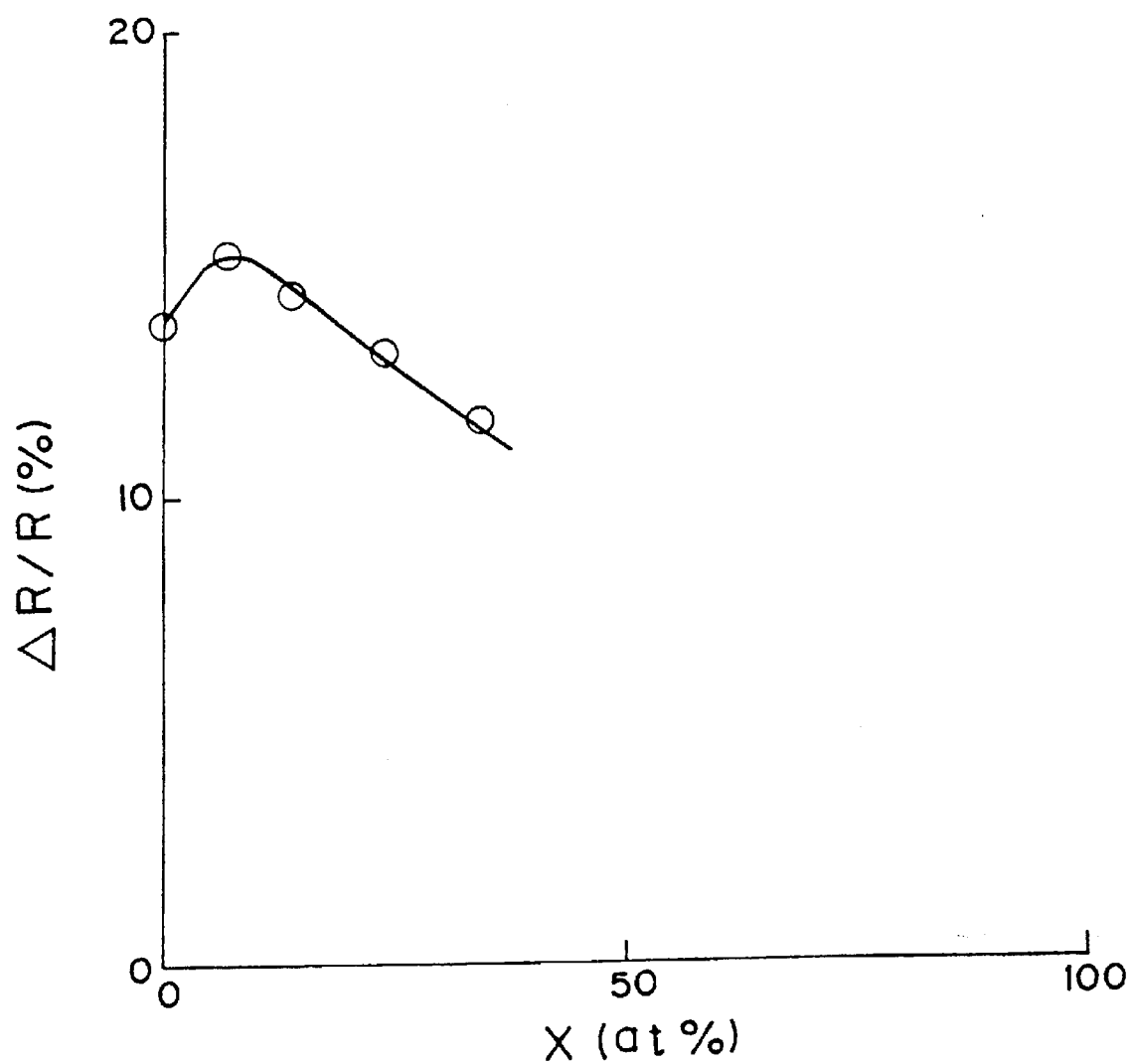
FIG. 26 illustrates the relation between the atomic content of Cu in FeCu and the magnetoresistance ratio in an FeCuPb alloy film.

FIG. 26 illustrates the relation between the atomic content of Cu in FeCu and the magnetoresistance ratio ΔR/R in an FeCuPb alloy film. In this alloy film, Fe forms the ferromagnetic metal atoms A, Pb forms the non-magnetic metal atoms B, and Cu forms the added metal atoms C.

Figure 27:
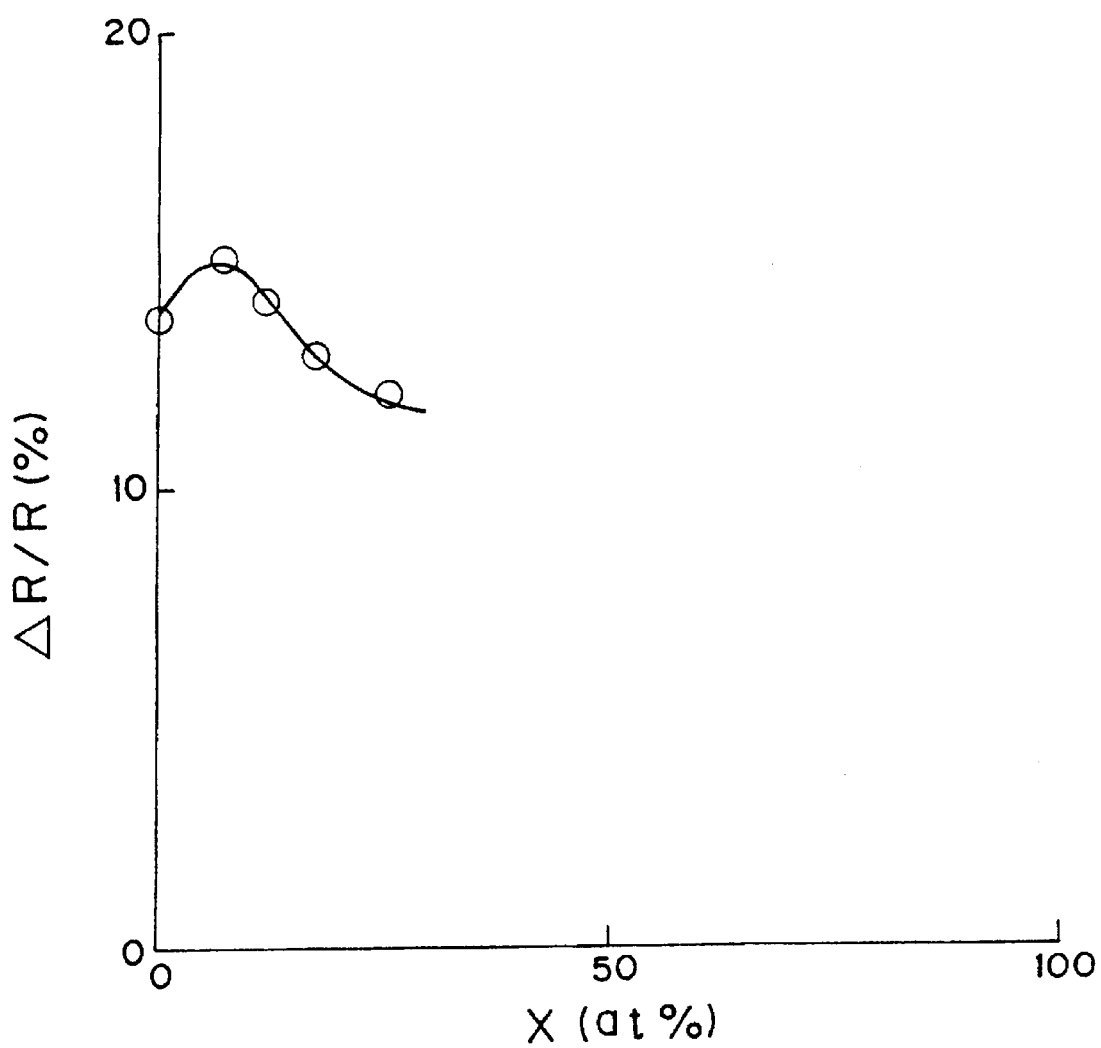
FIG. 27 illustrates the relation between the atomic content of Zn in FeZn and the magnetoresistance ratio in an FeZnPb alloy film.

FIG. 27 illustrates the relation between the atomic content of Zn in FeZn and the magnetoresistance ratio ΔR/R in an FeZnPb alloy film. In this alloy film, Fe forms the ferromagnetic metal atoms A, Pb forms the non-magnetic metal atoms B, and Zn forms the added metal atoms C.

In each of the above alloy films of FIGS. 24 to 27, the atomic content of the non-magnetic metal atoms B is a constant 76 atom %. The relative content of the atoms A and C is varied for several samples.

When the metal atoms C comprising Co are added in a range of atomic contents of not more than 60 atom % in FeCo, the magnetoresistance ratio ΔR/R of the FeCoPb exceeds 13.6%, which is the level attained with no addition of the metal atoms C, as shown in FIG. 24. When Co is added in 25 atom % relative to total FeCo, the magnetoresistance ratio ΔR/R reaches the maximum value of 15.2%.

When the metal atoms C comprising Ni are added in a range of atomic contents of not more than 30 atom % in FeNi, the magnetoresistance ratio ΔR/R of the FeNiPb alloy film exceeds 13.6%, which is the level attained with no addition of the metal atoms C, as shown in FIG. 25. When Ni is added in 12 atom % relative to total FeNi, the magnetoresistance ratio ΔR/R reaches the maximum value of 15.1%.

When the metal atoms C comprising Cu are added in a range of atomic contents of not more than 20 atom % in FeCu, the magnetoresistance ratio ΔR/R of the FeCuPb alloy film exceeds 13.6%, which is the level attained with no addition of the metal atoms C, as shown in FIG. 26. When Cu is added in 7 atom % relative to total FeCu, the magnetoresistance ratio ΔR/R reaches the maximum value of 15%.

When the metal atoms C comprising Zn are added in a range of atomic contents of not more than 15 atom % in FeZn, the magnetoresistance ratio ΔR/R of the FeZnPb alloy film exceeds 13.6%, which is the level attained with no addition of the metal atoms C, as shown in FIG. 27. When Zn is added in 7 atom % relative to total FeZn, the magnetoresistance ratio ΔR/R reaches the maximum value of 14.9%.

CoAg Series Alloy Films

Figure 28:
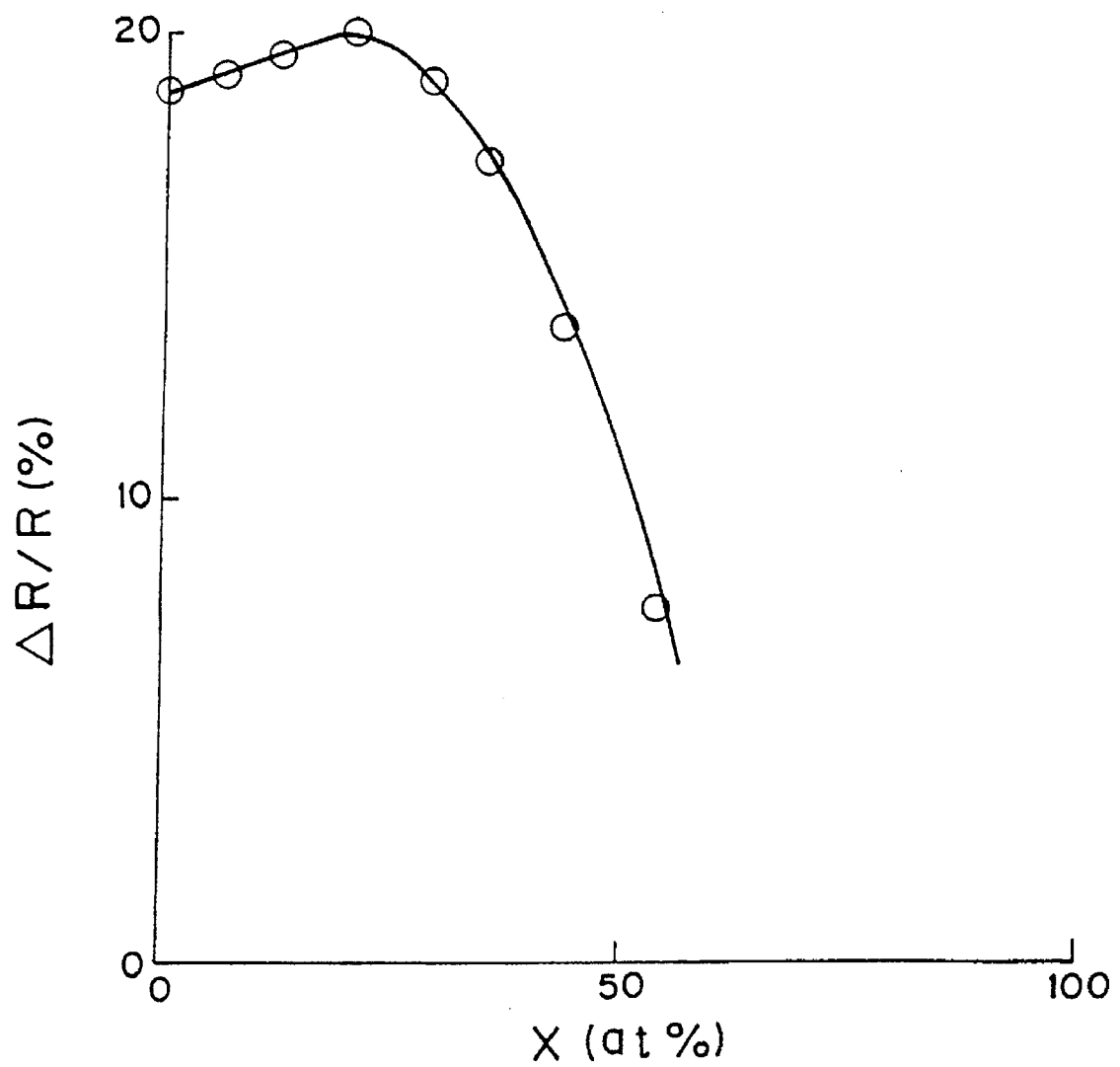
FIG. 28 illustrates the relation between the atomic,content of V in CoV and the magnetoresistance ratio in a CoVAg alloy film.

FIG. 28 illustrates the relation between the atomic content of V in CoV and the magnetoresistance ratio ΔR/R in an CoVAg alloy film. In this alloy film, Co forms the ferromagnetic metal atoms A, Ag forms the non-magnetic metal atoms B, and V forms the added metal atoms C.

Figure 29:
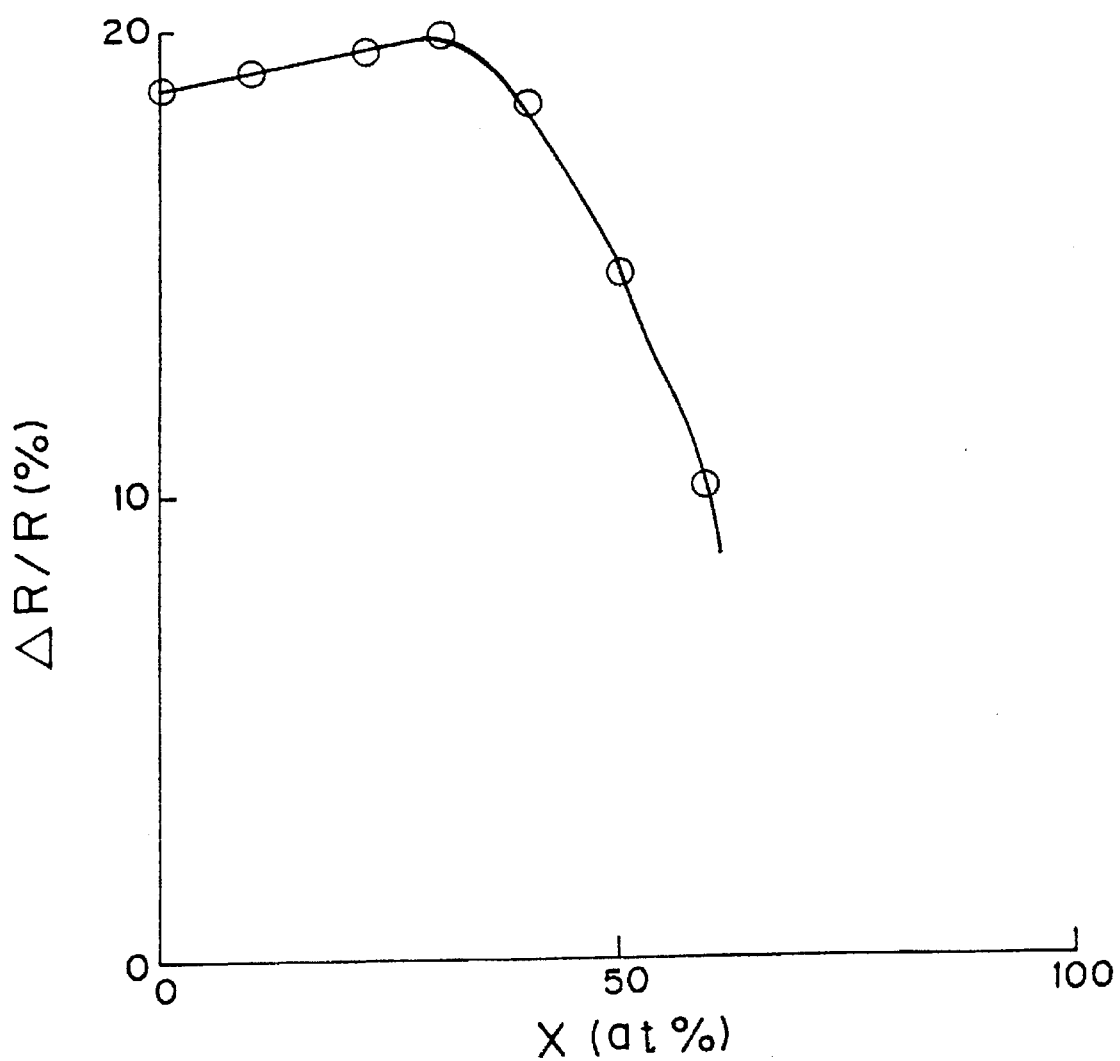
FIG. 29 illustrates the relation between the atomic content of Cr in CoCr and the magnetoresistance ratio in a CoCrAg alloy film.

FIG. 29 illustrates the relation between the atomic content of Cr in CoCr and the magnetoresistance ratio ΔR/R in an CoCrAg alloy film. In this alloy film, Co forms the ferromagnetic metal atoms A, Ag forms the non-magnetic metal atoms B, and Cr forms the added metal atoms C.

Figure 30:
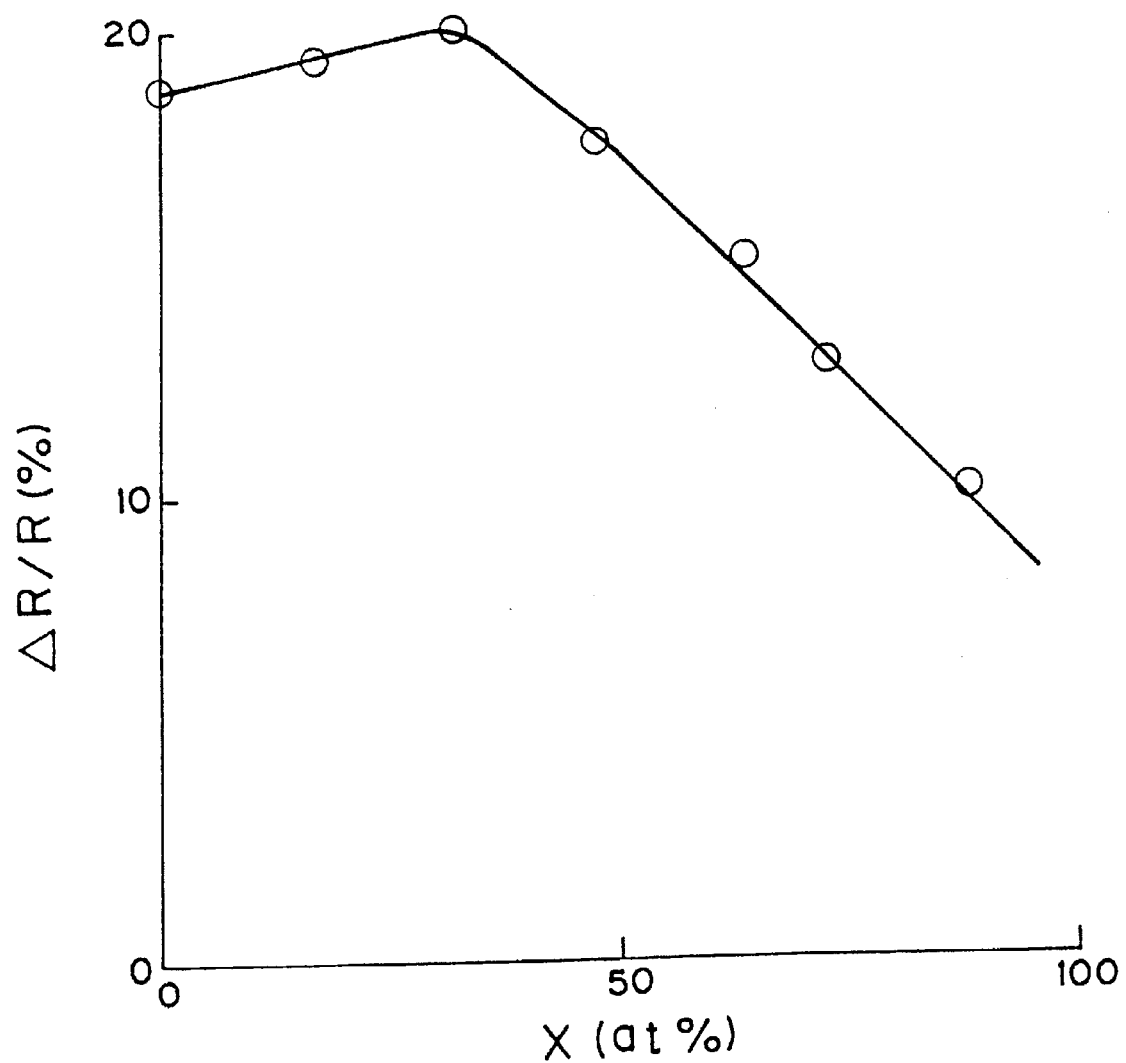
FIG. 30 illustrates the relation between the atomic content of Mn in CoMn and the magnetoresistance ratio in a CoMnAg alloy film.

FIG. 30 illustrates the relation between the atomic content of Mn in CoMn and the magnetoresistance ratio ΔR/R in an CoMnAg alloy film. In this alloy film, Co forms the ferromagnetic metal atoms A, Ag forms the non-magnetic metal atoms B, and Mn forms the added metal atoms C.

In each of the above alloy films of FIGS. 28 to 30, the atomic content of the non-magnetic metal atoms B is a constant 73 atom %. The relative content of the atoms A and C is varied for several samples.

When the metal atoms C comprising V are added in a range of atomic contents of not more than 30 atom % in CoV, the magnetoresistance ratio ΔR/R of the CoVAg alloy film exceeds 18.7%, which is the level attained with no addition of the metal atoms C, as shown in FIG. 28. When V is added in 20 atom % relative to total CoV, the magnetoresistance ratio ΔR/R reaches the maximum value of 20%.

When the metal atoms C comprising Cr are added in a range of atomic contents of not more than 37 atom % in CoCr, the magnetoresistance ratio ΔR/R of the CoCrAg alloy film exceeds 18.7%, which is the level attained with no addition of the metal atoms C, as shown in FIG. 29. When Cr is added in 30 atom % relative to total CoCr, the magnetoresistance ratio ΔR/R reaches the maximum value of 20%.

When the metal atoms C comprising Mn are added in a range of atomic contents of not more than 41 atom % in CoMn, the magnetoresistance ratio ΔR/R of the CoMnAg alloy film exceeds 18.7%, which is the level attained with no addition of the metal atoms C, as shown in FIG. 30. When Mn is added in 32 atom % relative to total CoMn, the magnetoresistance ratio ΔR/R reaches the maximum value of 20%.

CoPb Series Alloy Films

Figure 31:
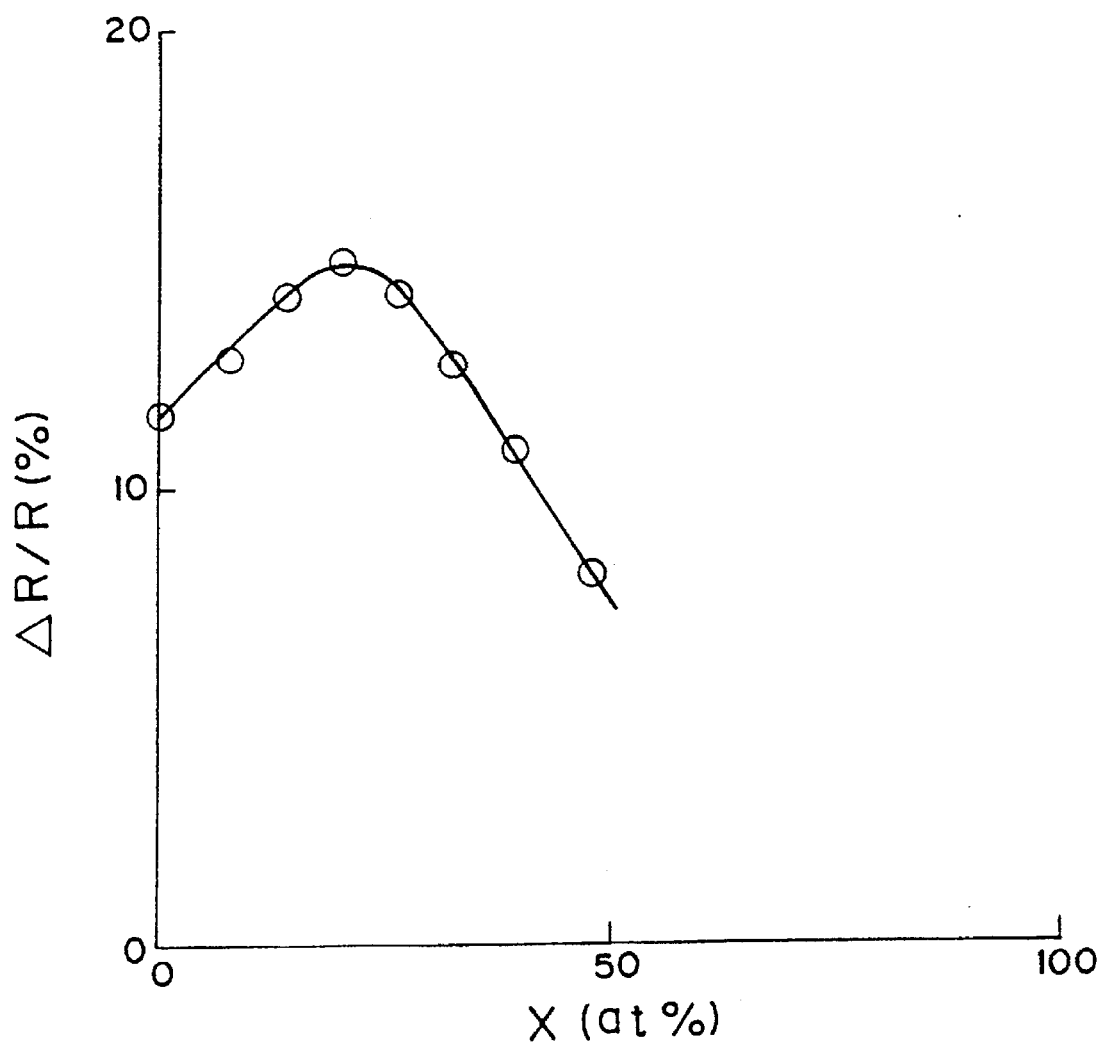
FIG. 31 illustrates the relation between the atomic content of V in CoV and the magnetoresistance ratio in a CoVPb alloy film.

FIG. 31 illustrates the relation between the atomic content of V in CoV and the magnetoresistance ratio ΔR/R in an CoVPb alloy film. In this alloy film, Co forms the ferromagnetic metal atoms A, Pb forms the non-magnetic metal atoms B, and V forms the added metal atoms C.

Figure 32:
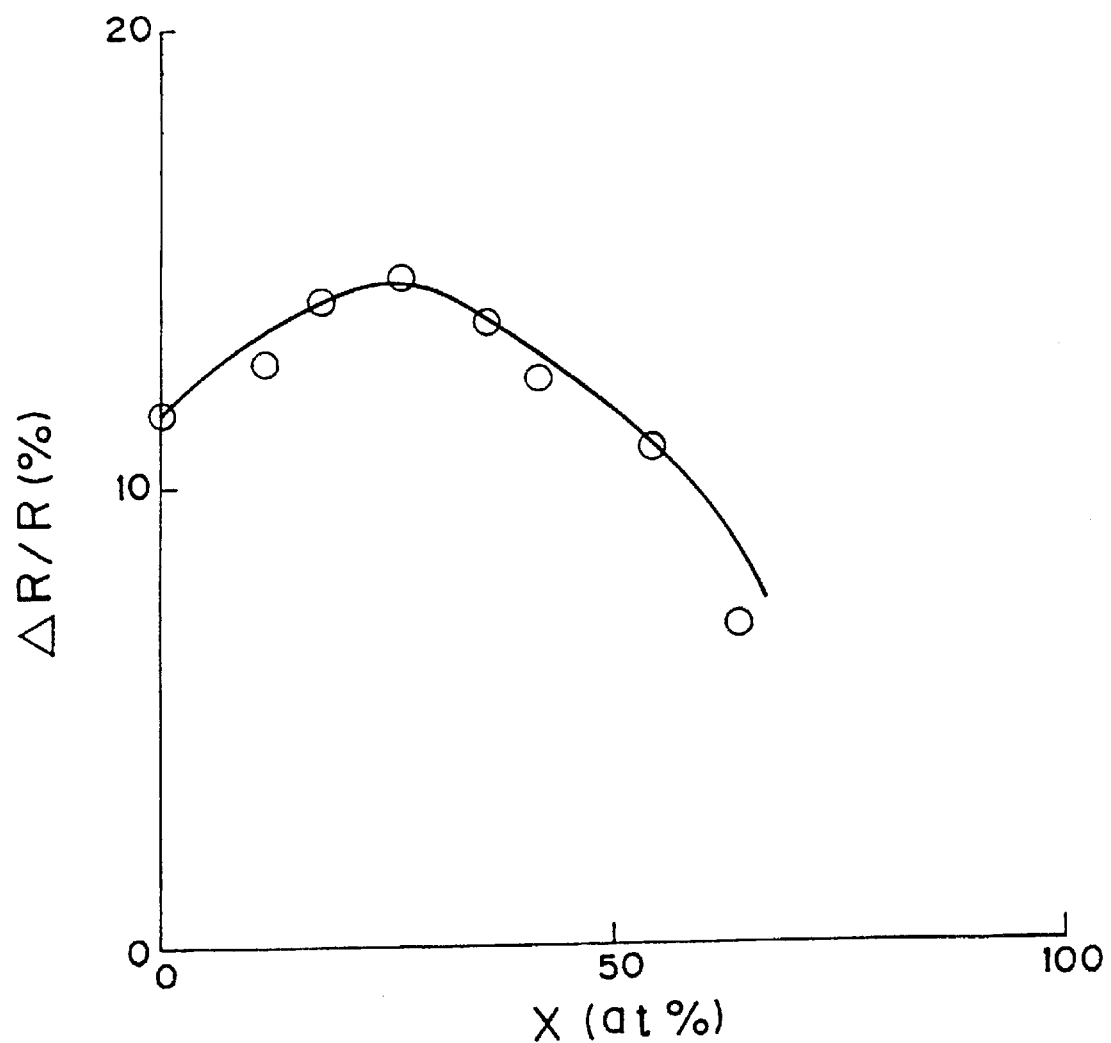
FIG. 32 illustrates the relation between the atomic content of Cr in CoCr and the magnetoresistance ratio in a CoCrPb alloy film.

FIG. 32 illustrates the relation between the atomic content of Cr in CoCr and the magnetoresistance ratio ΔR/R in an CoCrPb alloy film. In this alloy film, Co forms the ferromagnetic metal atoms A, Pb forms the non-magnetic metal atoms B, and Cr forms the added metal atoms C.

Figure 33:
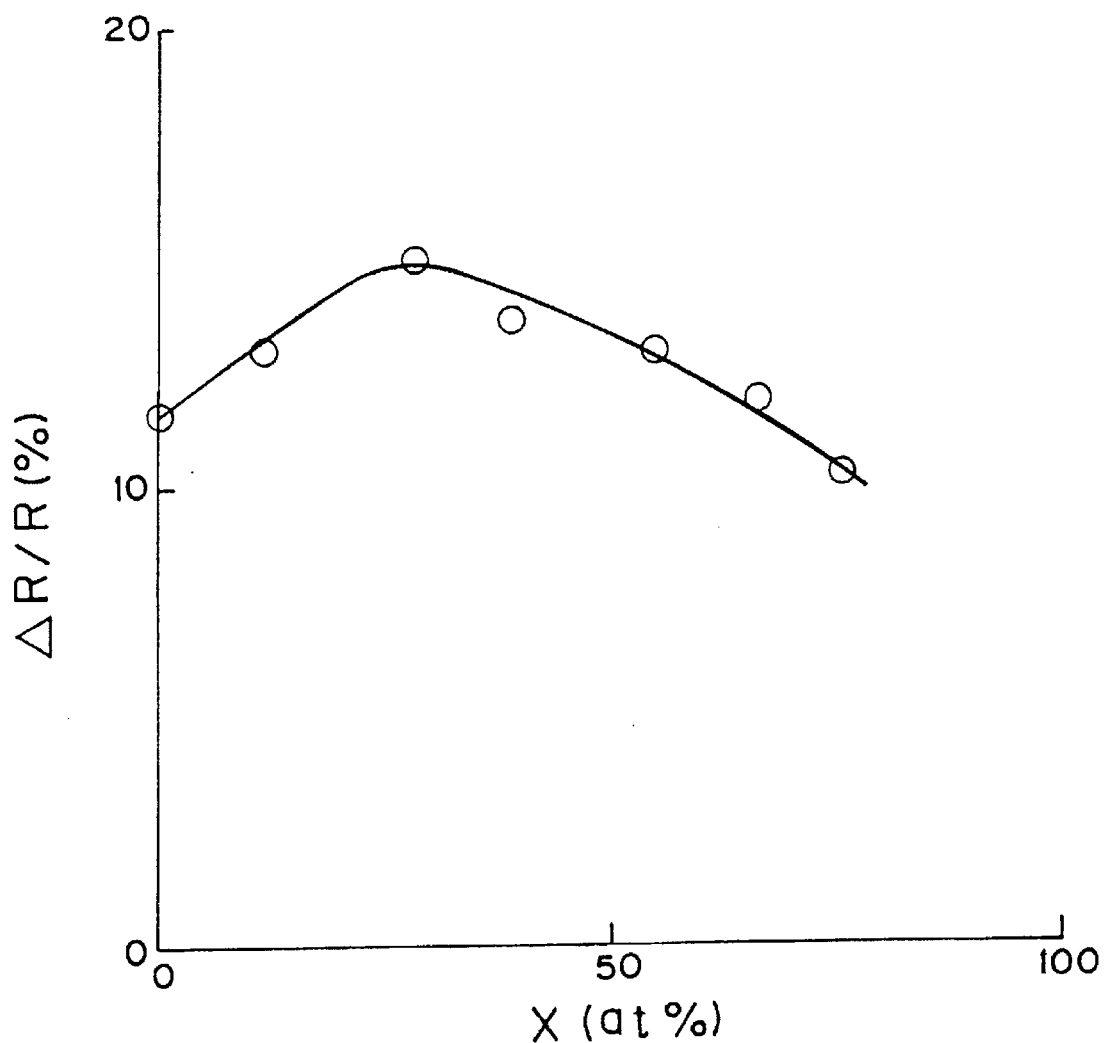
FIG. 33 illustrates the relation between the atomic content of Mn in CoMn and the magnetoresistance ratio in a CoMnPb alloy film.

FIG. 33 illustrates the relation between the atomic content of Mn in CoMn and the magnetoresistance ratio ΔR/R in an CoMnPb alloy film. In this alloy film, Co forms the ferromagnetic metal atoms A, Pb forms the non-magnetic metal atoms B, and Mn forms the added metal atoms C.

In each of the above alloy films of FIGS. 31 to 33, the atomic content of the non-magnetic metal atoms B is a constant 76 atom %. The relative content of the atoms A and C is varied for several samples.

When the metal atoms C comprising V are added in a range of atomic contents of not more than 35 atom % in CoV, the magnetoresistance ratio ΔR/R of the CoVPb alloy film exceeds 11.3%, which is the level attained with no addition of the metal atoms C, as shown in FIG. 31. When V is added in 20 atom % relative to total CoV, the magnetoresistance ratio ΔR/R reaches the maximum value of 14.9%.

When the metal atoms C comprising Cr are added in a range of atomic contents of not more than 46 atom % in CoCr, the magnetoresistance ratio ΔR/R of the CoCrPb alloy film exceeds 11.3%, which is the level attained with no addition of the metal atoms C, as shown in FIG. 32. When Cr is added in 26 atom % relative to total CoCr, the magnetoresistance ratio ΔR/R reaches the maximum value of 14.3%.

When the metal atoms C comprising Mn are added in a range of atomic contents of not more than 70 atom % in CoMn, the magnetoresistance ratio ΔR/R of the CoMnPb alloy film exceeds 11.3%, which is the level attained with no addition of the metal atoms C, as shown in FIG. 33. When Mn is added in 28 atom % relative to total CoMn, the magnetoresistance ratio ΔR/R reaches the maximum value of 14.9%.

NiAg Series Alloy Films

Figure 34:
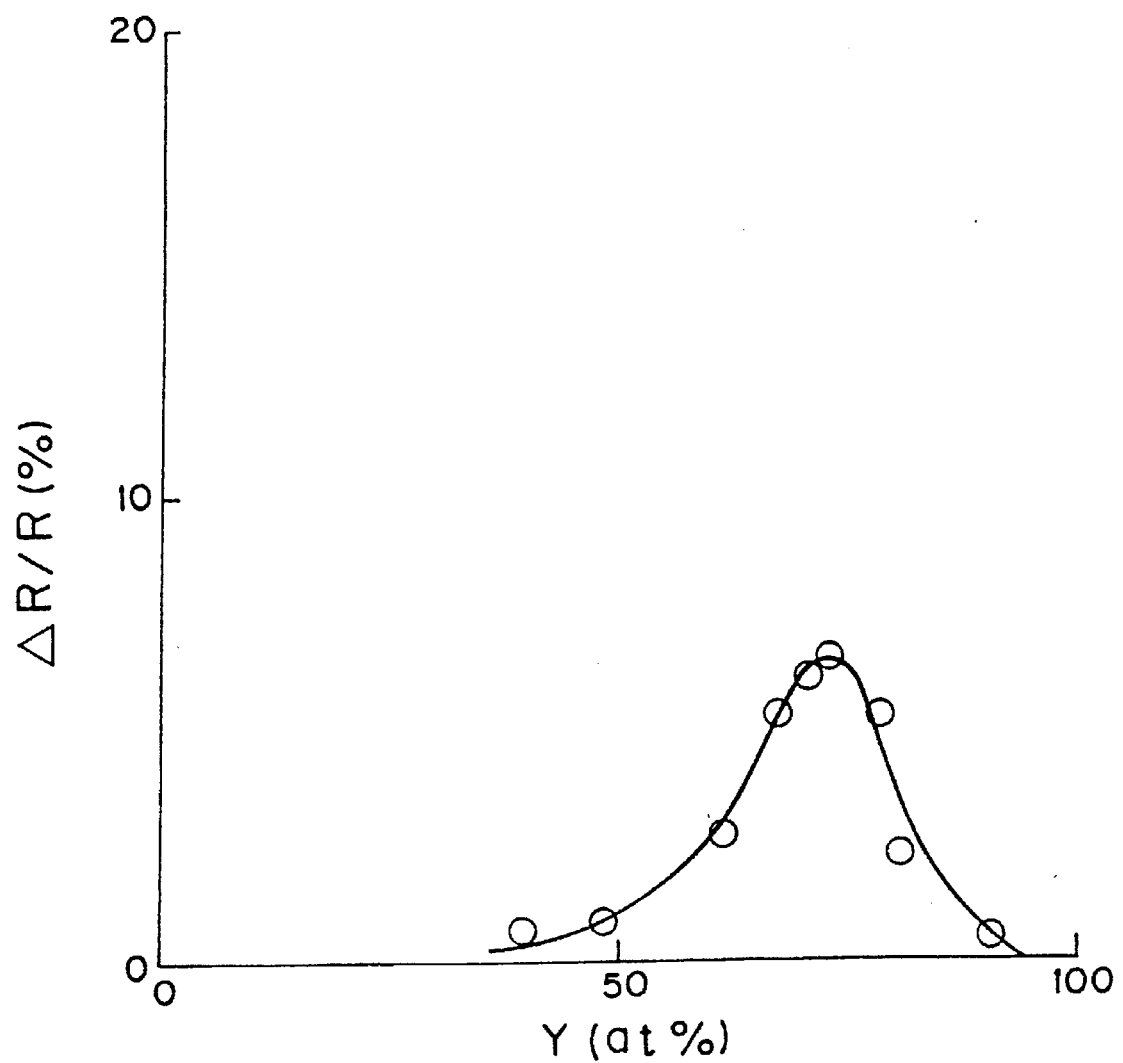
FIG. 34 illustrates the relation between the atomic content of Ag and the magnetoresistance ratio in an NiAg alloy film.

FIG. 34 illustrates the relation between the magnetoresistance ratio ΔR/R and the atomic content of Ag in a magnetic alloy film consisting of Ni forming ferromagnetic metal atoms A and Ag forming non-magnetic metal atoms B, wherein Ag does not form a solid solution with Ni.

As understood from FIG. 34, the magnetoresistance ratio ΔR/R of the magnetic alloy film of such an NiAg alloy exceeds 6% when the atomic content of Ag is in a range of 70 to 75 atom %, and reaches the maximum value of 6.5% when the atomic content of Ag is 73 atom %, in particular. While the magnetoresistance ratio ΔR/R of the NiAg alloy film cannot exceed 10%, it is possible to bring this magnetoresistance ratio ΔR/R to a level exceeding 10% at room temperature by adding metal atoms C, as described below.

Figure 35:
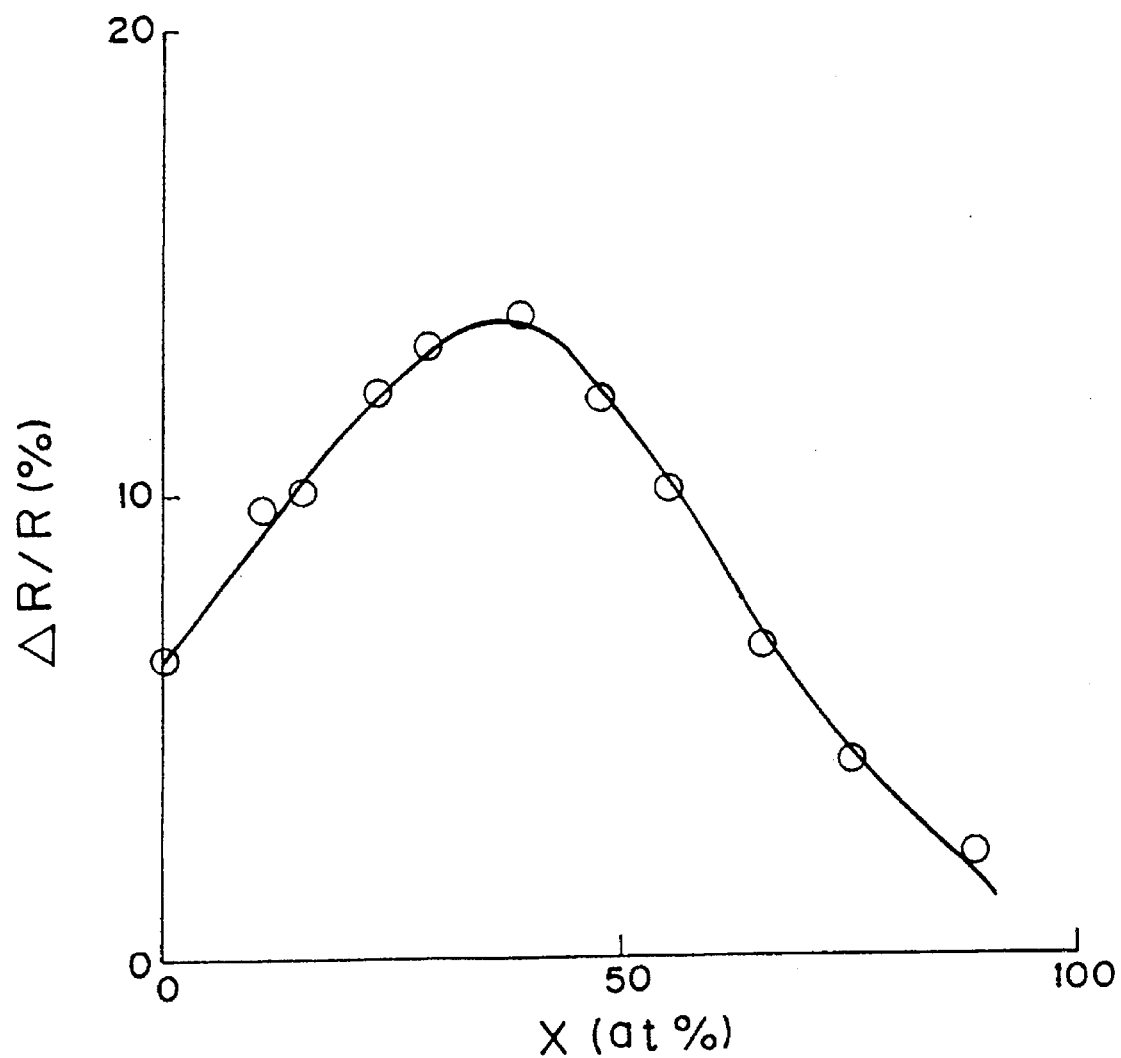
FIG. 35 illustrates the relation between the atomic content of V in NiV and the magnetoresistance ratio in an NiVAg alloy film.

FIG. 35 illustrates the relation between the atomic content of V in NiV and the magnetoresistance ratio ΔR/R in an NiVAg alloy film. In this alloy film, Ni forms the ferromagnetic metal atoms A, Ag forms the non-magnetic metal atoms B, and V forms the added metal atoms C.

Figure 36:
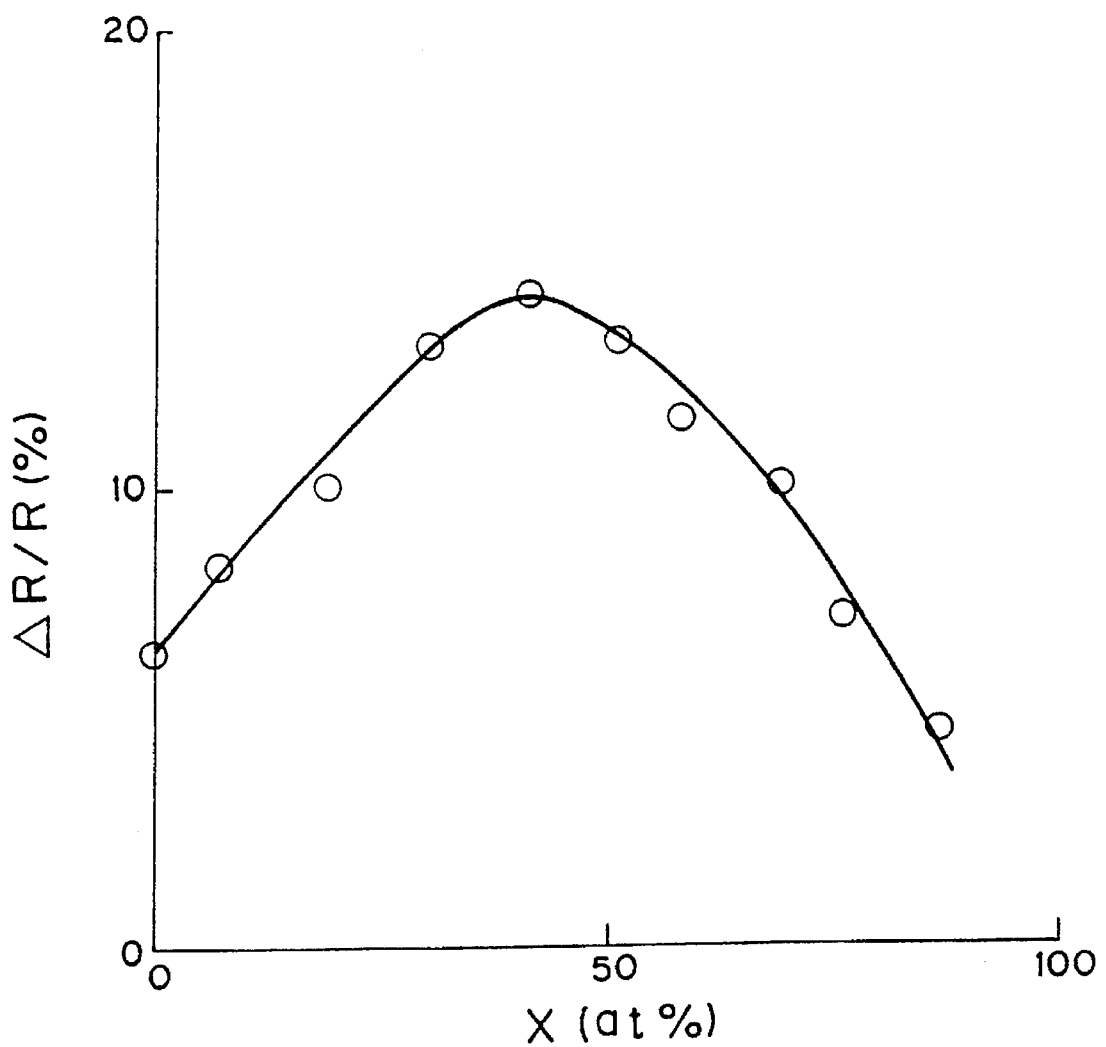
FIG. 36 illustrates the relation between the atomic content of Cr in NiCr and the magnetoresistance ratio in an NiCrAg alloy film.

FIG. 36 illustrates the relation between the atomic content of Cr in NiCr and the magnetoresistance ratio ΔR/R in an NiCrAg alloy film. In this alloy film, Ni forms the ferromagnetic metal atoms A, Ag forms the non-magnetic metal atoms B, and Cr forms the added metal atoms C.

Figure 37:
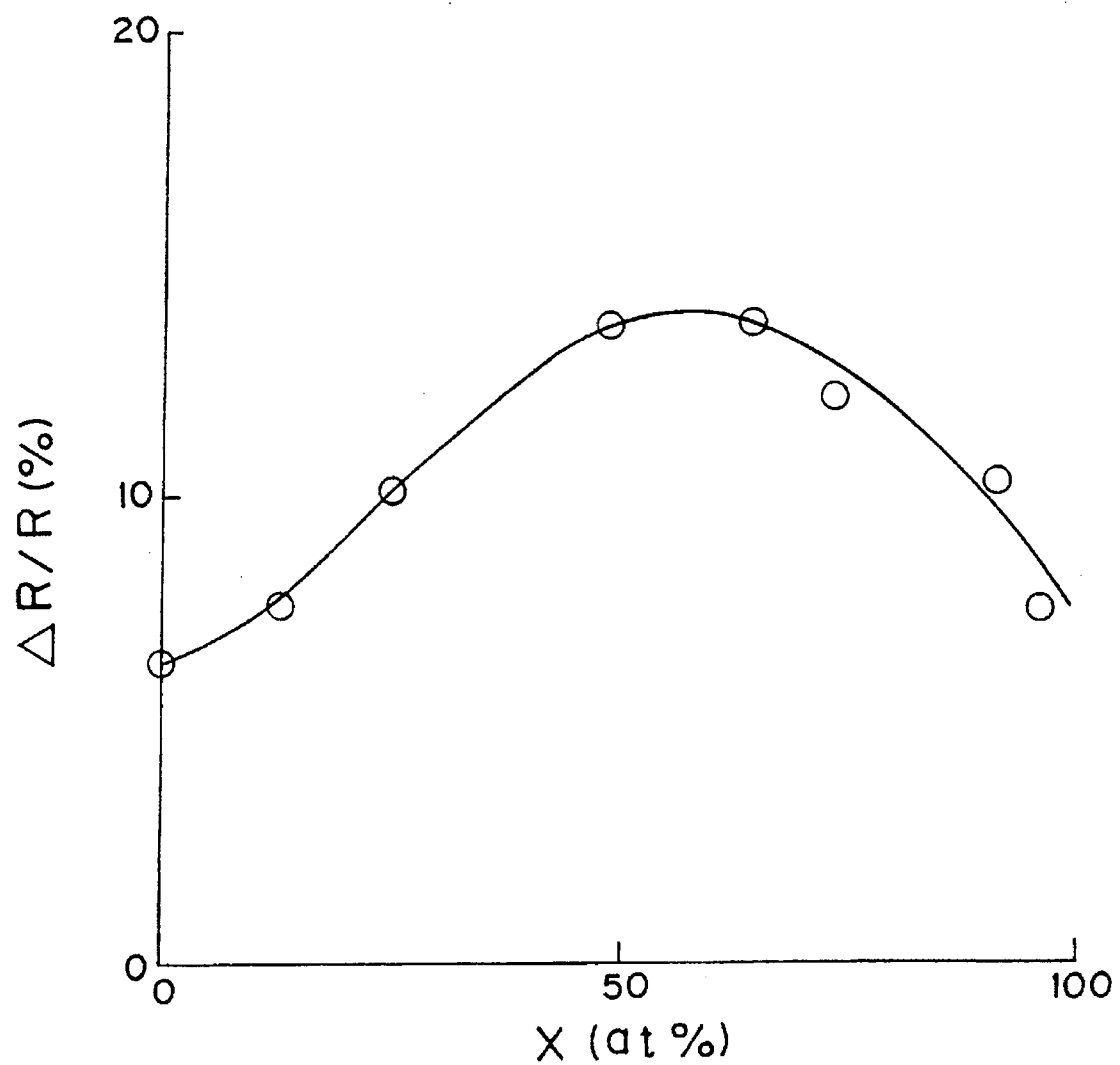
FIG. 37 illustrates the relation between the atomic content of Mn in NiMn and the magnetoresistance ratio in an NiMnAg alloy film.

FIG. 37 illustrates the relation between the atomic content of Mn in NiMn and the magnetoresistance ratio ΔR/R in an NiMnAg alloy film. In this alloy film, Ni forms the ferromagnetic metal atoms A, Ag forms the non-magnetic metal atoms B, and Mn forms the added metal atoms C.

In each of the above alloy films of FIGS. 35 to 37, the atomic content of the non-magnetic metal atoms B is a constant 73 atom %. The relative content of the atoms A and C is varied for several samples.

When the metal atoms C comprising V are added in a range of atomic contents of 15 to 55 atom % in NiV, the magnetoresistance ratio ΔR/R of the NiVAg alloy film exceeds 10%, as shown in FIG. 35. When V is added in 38 atom % relative total NiV, the magnetoresistance ratio ΔR/R reaches the maximum value of 13.8%.

When the metal atoms C comprising Cr are added in a range of atomic contents of 18 to 69 atom % in NiCr, the magnetoresistance ratio ΔR/R of the NiCrAg alloy film exceeds 10%, as shown in FIG. 36. When Cr is added in 41 atom % relative to total NiCr, the magnetoresistance ratio ΔR/R reaches the maximum value of 14%.

When the metal atoms C comprising Mn are added in a range of atomic contents of 24 to 92 atom % in NiMn, the magnetoresistance ratio ΔR/R of the NiMnAg exceeds 10%, as shown in FIG. 37. When Mn is added in 64 atom % relative to total NiMn, the magnetoresistance ratio ΔR/R reaches the maximum value of 13.5%.

Figure 38:
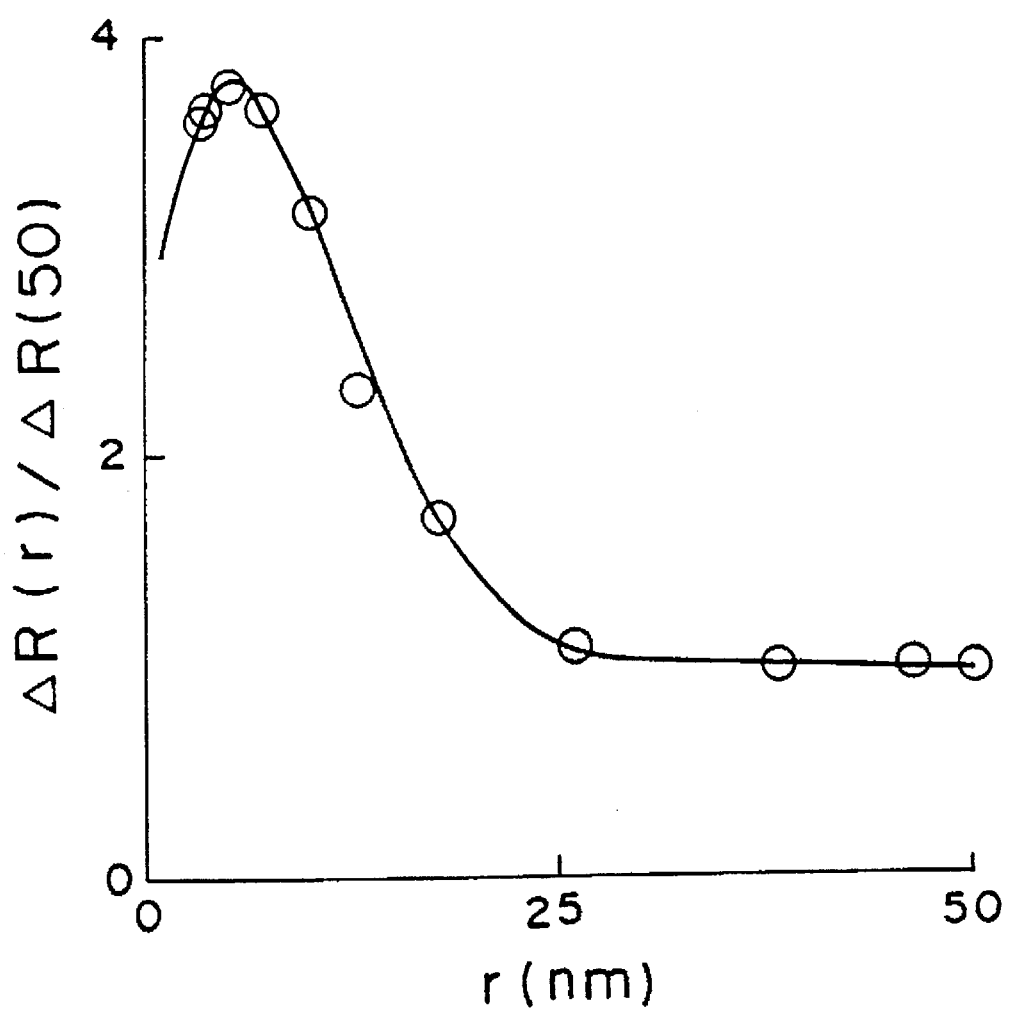
FIG. 38 illustrates the relation between the grain diameter and the magnetoresistance ratio in a CoAg alloy film.

FIG. 38 illustrates the relation between the grain diameter r, and the magnetoresistance ratio in a CoAg film, consisting of 20 atom % of Co and 80 atom % of Ag, which was formed on a glass substrate by electron beam deposition. The grain diameter was varied by changing heat treatment time at 200° C. The magnetoresistance ratio was relatively evaluated with reference to a level 1 with the grain diameter of 50 nm. As shown in FIG. 38, the magnetoresistance ratio is abruptly increased when the grain diameter is reduced to not more than 20 nm. The magnetoresistance ratio exhibits a particularly high value when the grain diameter is in a range of 3 to 8 nm.

Figure 39:
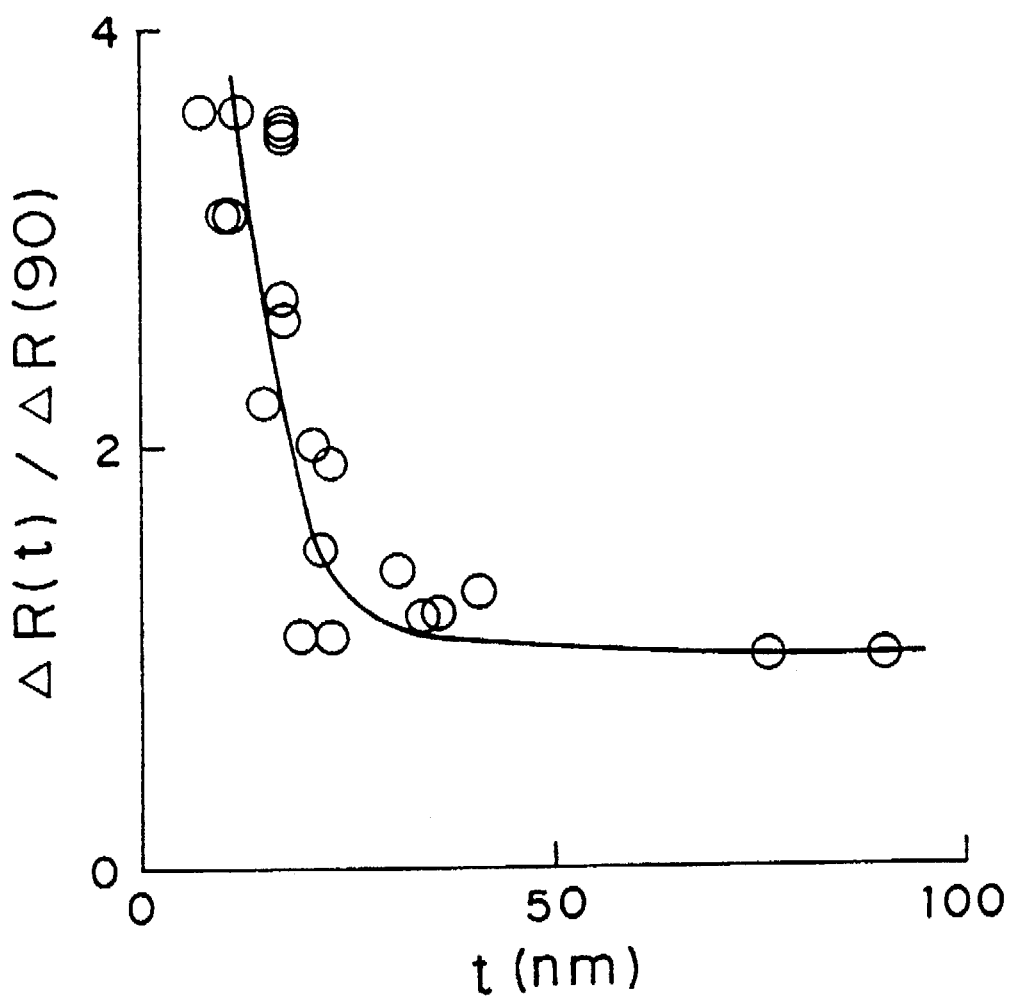
FIG. 39 illustrates the relation between the film thickness and the magnetoresistance ratio in the CoAg alloy film.

FIG. 39 illustrates the relation between the film thickness t and the magnetoresistance ratio in the CoAg film, consisting of 20 atom % of Co and 80 atom % of Ag, which was formed on a glass substrate by electron beam deposition. The magnetoresistance ratio was relatively evaluated with reference to a level 1 with the film thickness t of 90 nm. As shown in FIG. 39, the magnetoresistance ratio is abruptly increased when the film thickness t is reduced to not more than 30 nm. It is presumed that this is because grains contained in the alloy film are controlled to small diameters when the film thickness t is in a small range.

Figure 40:
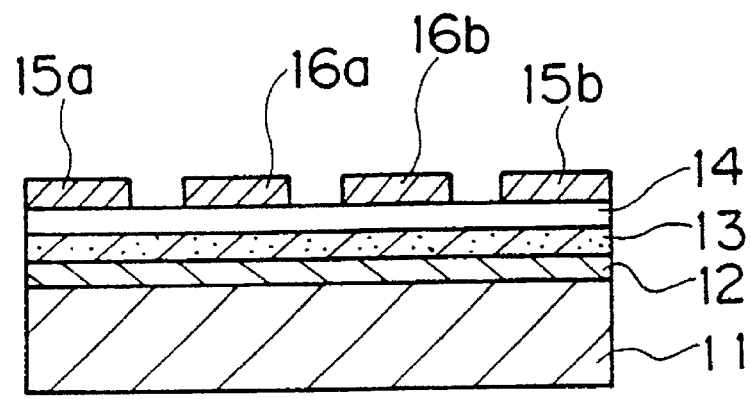
FIG. 40 is a sectional view showing an exemplary magnetoresistance effect element.
Figure 41:
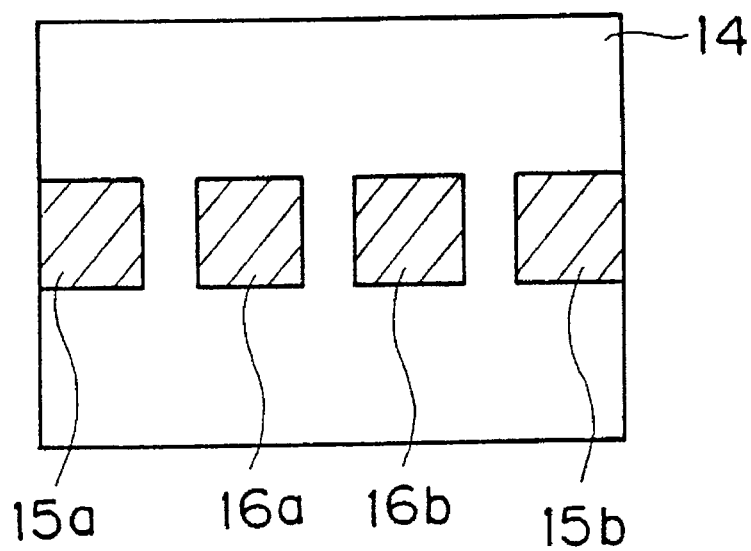
FIG. 41 is a plan view showing the magnetoresistance effect element of FIG. 40.

FIG. 40 is a sectional view showing an exemplary structure of a magnetoresistance-effect element. FIG. 41 is a magnetoresistance-effect element shown in FIG. 40.

Referring to FIGS. 40 and 41, a substrate is formed by an alumina plate 11 in which TiC is dispersed, an Al$_2$O$_3$ film 12 formed on the alumina plate 11, and an SiO$_2$ film 13 formed on the Al$_2$O$_3$ film 12. A magnetoresistance-effect film 14 is formed on the SiO$_2$ film 13. Current supply electrodes 15a and 15b are provided on the magnetoresistance effect film 14, in order to feed a current to the magnetoresistance-effect film 14. Further, voltage reading electrodes 16a and 16b are provided between the current supply electrodes 15a and 15b, in order to detect the resistance of the magnetoresistance-effect film 14. The current supply electrodes 15a and 15b and the voltage reading electrodes 16a and 16b can be formed by metal multilayer films of Ti/Au/Ti, for example. The current supply electrodes 15a and 15b feed a current into the magnetoresistance-effect film 14, so that the voltage reading electrodes 16a and 16b detect the magnetoresistance ratio in the magnetoresistance effect film 14. It is possible to measure change in magnetic field strength of a magnetic field which is applied to the magnetoresistance-effect film 14 by detecting the magnetoresistance ratio.

Figure 42:
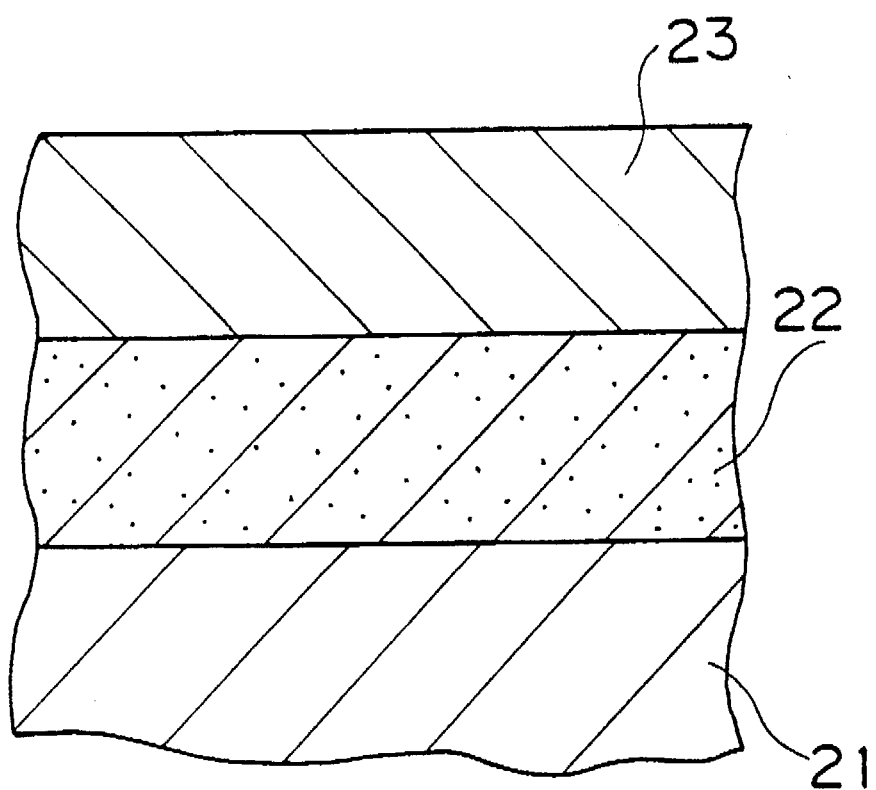
FIG. 42 is a sectional view showing an exemplary magnetoresistance effect element according to a first Example of the present invention.

FIG. 42 is a sectional view showing an exemplary magnetoresistance effect element according to a first Example of the present invention. Referring to FIG. 42, a CoAg film 22 consisting of 20 atom % of Co and 80 atom % of Ag is formed on a glass substrate 21 by electron beam deposition. An NiFe film 23 consisting of 80 atom % of Ni and 20 atom % of Fe is formed as a soft magnetic film on the CoAg film 22 by electron beam deposition. A magnetoresistance effect film is formed by the alloy film 22 and the soft magnetic film 23.

A plurality of samples were prepared from CoAg films 22 having constant thicknesses of 50 nm and NiFe films 23 having various film thicknesses. Rates of magnetoresistance change at room temperature and operating magnetic field strength values Hs were measured as to the respective samples.

The samples exhibited extremely high rates of magnetoresistance change of 17 to 19%, regardless of the thicknesses of the NiFe films 23.

Figure 43:
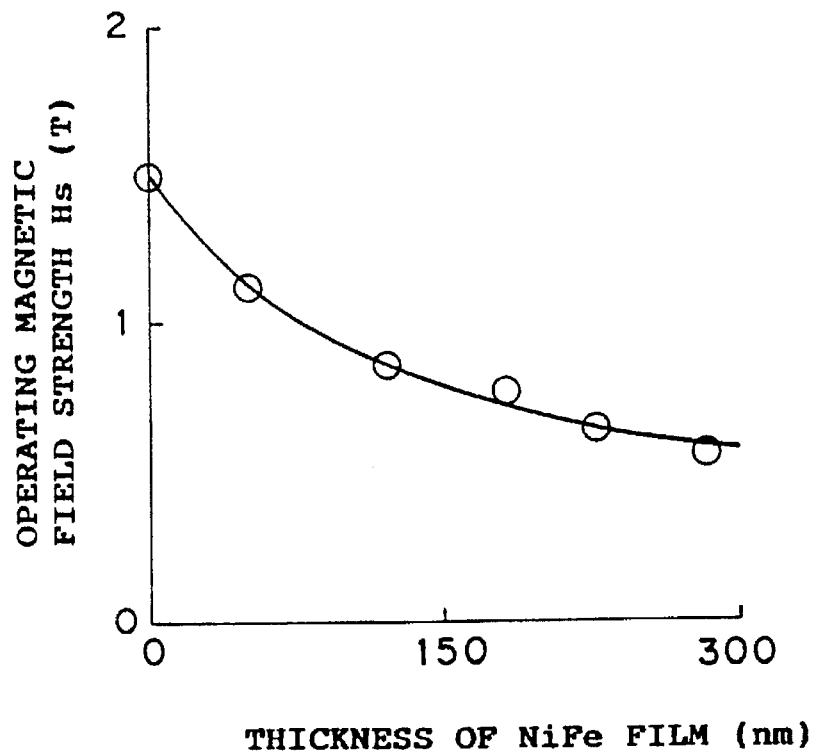
FIG. 43 illustrates the relation between film thicknesses and operating magnetic field strength levels of NiFe soft magnetic films.

FIG. 43 shows the results of the operating magnetic field strength values Hs. A sample having an NiFe film of 0 nm in thickness, i.e., having only the alloy film, exhibits a high operating magnetic field strength value Hs of about 1.5 T. In the samples having two-layer structures of the CoAg films and the NiFe films, the operating magnetic field strength values Hs are reduced as the thicknesses of the NiFe films are increased. A sample having an NiFe film 300 nm in thickness exhibits an extremely small operating magnetic field strength value Hs of 0.5 T.

Figure 44:
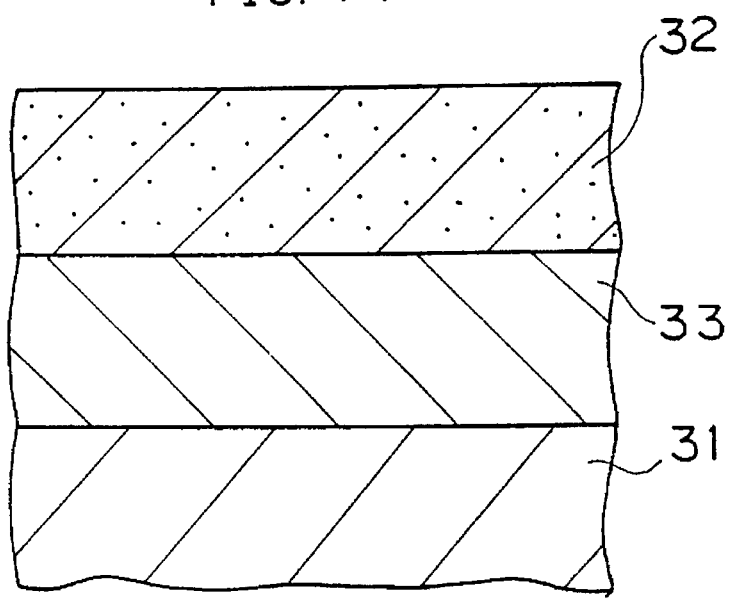
FIG. 44 is a sectional view showing an exemplary magnetoresistance effect element according to a second Example of the present invention.

FIG. 44 is a sectional view showing an exemplary magnetoresistance-effect element according to a second Example of the present invention. As shown in FIG. 44, an NiFe film 33 was formed on a substrate 31 and a CoAg film 32 was formed on this NiFe film 33. Samples of such magnetoresistance-effect elements were subjected to measurement of rates of magnetoresistance change and operating magnetic field strength values, similarly to the above. Consequently it was found that the operating magnetic field strength values were reduced as the thicknesses of the NiFe films were increased, similarly to the results shown in FIG. 43.

Also when another NiFe film was formed on the CoAg film 32 in the magnetoresistance-effect film shown in FIG. 44 to sandwich the CoAg film 32 between the two NiFe films, results similar to the above were obtained.

Figure 45:
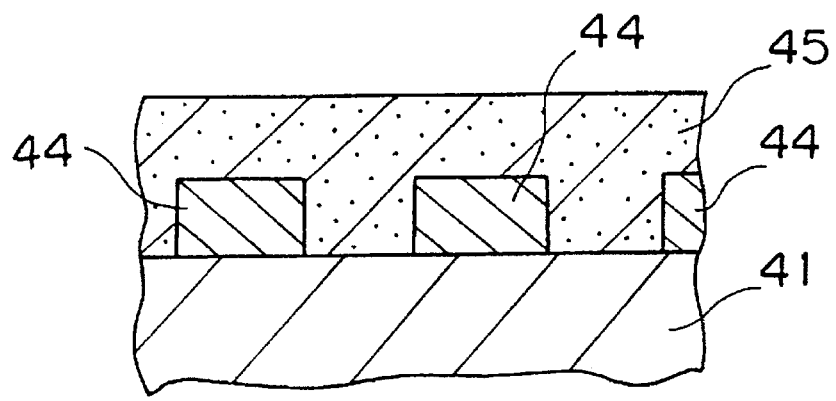
FIG. 45 is a sectional view showing an exemplary magnetoresistance-effect element according to a third Example of the present invention.
Figure 46:
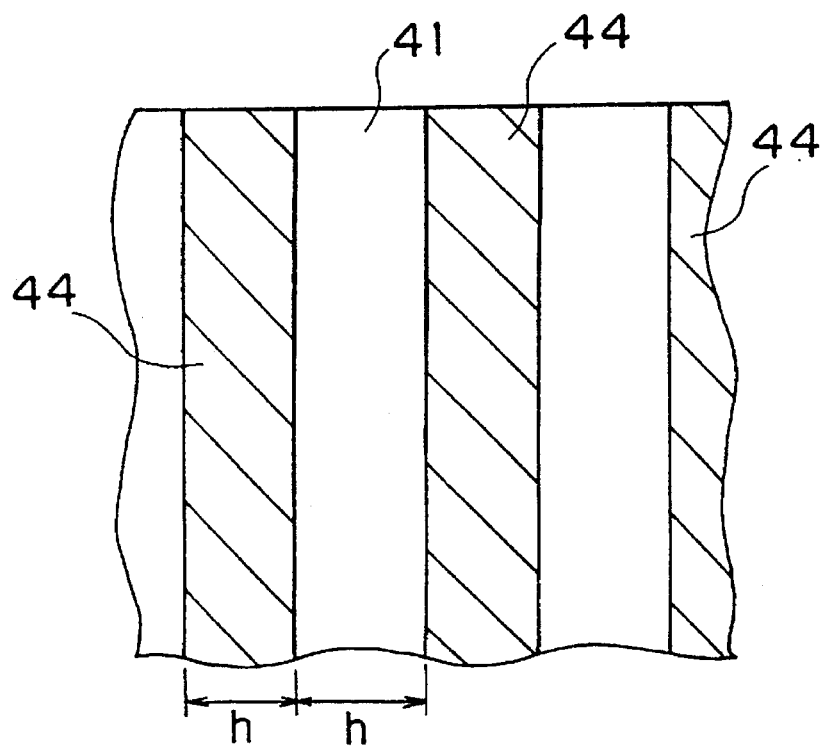
FIG. 46 is a plan view showing soft magnetic films provided in the exemplary magnetoresistance-effect element according to the third Example of the present invention.

FIG. 45 is a sectional view showing an exemplary magnetoresistance-effect element according to a third Example of the present invention. Referring to FIG. 45, NiFe films 44 are discontinuously formed on a substrate 41. A CoAg film 45 is formed to cover the NiFe films 44 and the substrate 41. As shown in FIG. 46, the NiFe films 44 are provided on the substrate 41 in the form of stripes, i.e. relatively long and narrow bands. The NiFe films 44 are so formed that the width h of each stripe is equal to the width h of the spaces between these stripes of NiFe films 44.

As shown in FIG. 45, the CoAg film 45 has portions that are formed on the NiFe films 44 and portions that are directly formed on the substrate 41. This CoAg film 45 is in contact with both the upper and the side surfaces of the NiFe films 44, whereby contact areas of the NiFe films 44 and the CoAg film 45 are increased.

Figure 47A:
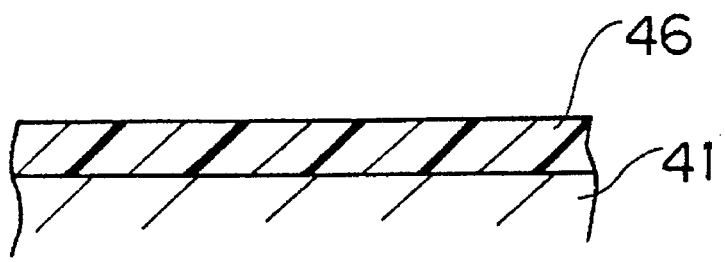
FIGS. 47A to 47F are sectional views showing steps of manufacturing the magnetoresistance-effect element according to the third Example shown in FIGS. 45 and 46.
Figure 47B:
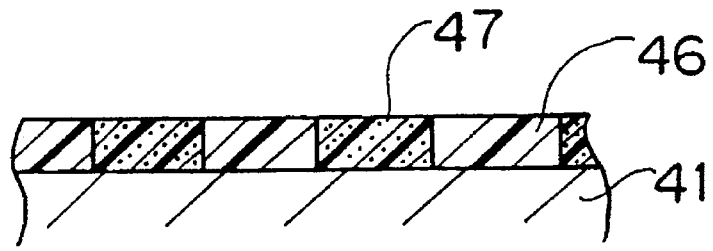
Figure 47C:
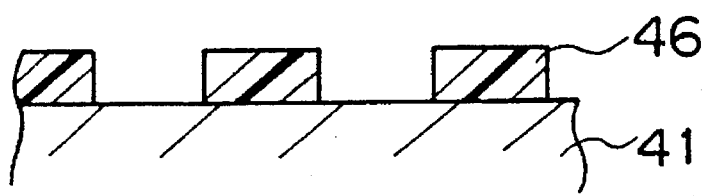
Figure 47D:
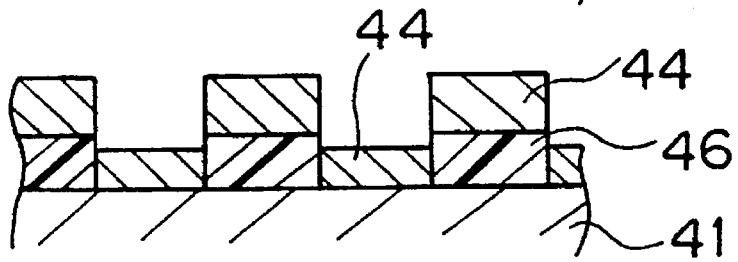
Figure 47E:
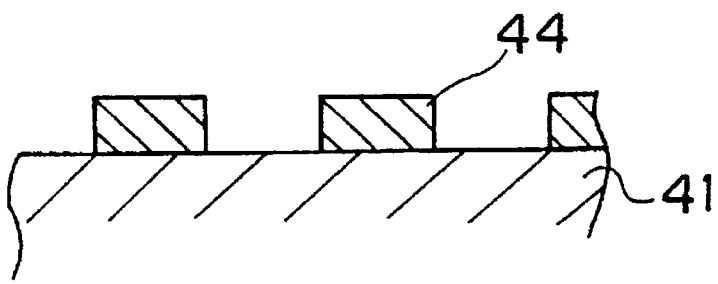
Figure 47F:
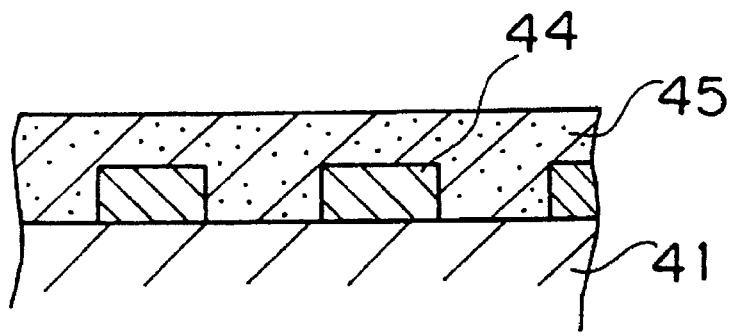

FIGS. 47A to 47F are sectional views showing steps of manufacturing the magnetoresistance-effect element according to the Example shown in FIGS. 45 and 46. Referring to FIG. 47A, a resist film 46 is applied onto the overall surface area on a substrate 41. Referring to FIG. 47B, the resist film 46 is exposed in the form of stripes, so that exposed portions 47 are developed. Referring to FIG. 47C, the exposed portions 47 are removed from the resist film 46, to leave stripe-shaped resist films 46. Referring to FIG. 47D, an NiFe film 44 is then formed by electron beam deposition. Portions of the NiFe film 44 formed on the resist films 46 are removed by lift-off process. Thus, stripe-shaped NiFe films 44 are formed as shown in FIG. 47E. Referring to FIG. 47F, a CoAg film 45 is formed on the stripe-shaped NiFe films 44 and the substrate 41 by electron beam deposition. Thus, the magnetoresistance-effect element shown in FIG. 45 is obtained.

In relation to the magnetoresistance-effect element shown in FIGS. 45 and 46, a plurality of samples were prepared from NiFe films 44 of 50 nm thickness with various stripe widths h and spaces h, and CoAg films 45 of 100 nm thickness. Rates of magnetoresistance change at room temperature and operating magnetic field strength values Hs were measured as to the respective samples.

The samples exhibited extremely high rates of magnetoresistance change of 17 to 19%, regardless of the values of width and spacing h of the film stripes.

Figure 48:
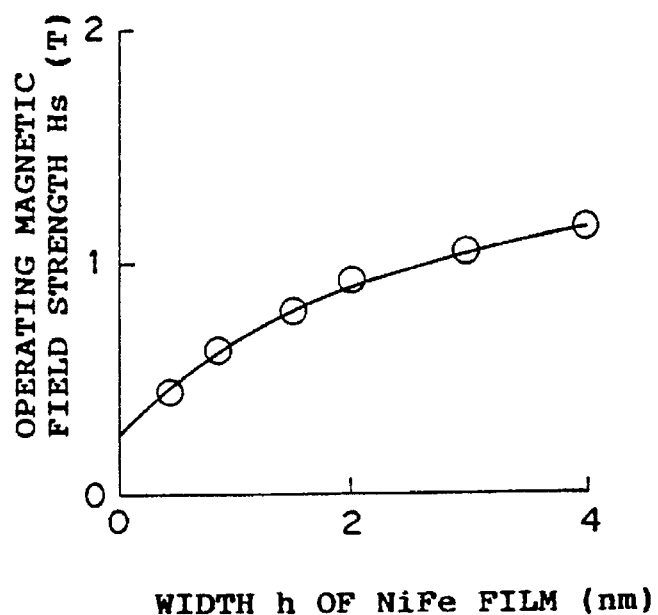
FIG. 48 illustrates the relation between the operating magnetic field strength and the widths of spaces h between the soft magnetic films and the widths h of the films themselves, as shown in FIGS. 45 and 48.

As to the operating magnetic field strength values Hs, it was recognized that the operating magnetic field strength values Hs were reduced as the widths and spaces h of and between the NiFe films were reduced, which improved the magnetic field sensitivity. When the NiFe films had widths h and spaces h of 0.5 μm, the sample exhibited an extremely small operating magnetic field strength value Hs of 0.4 T as shown in FIG. 48.

Figure 49:
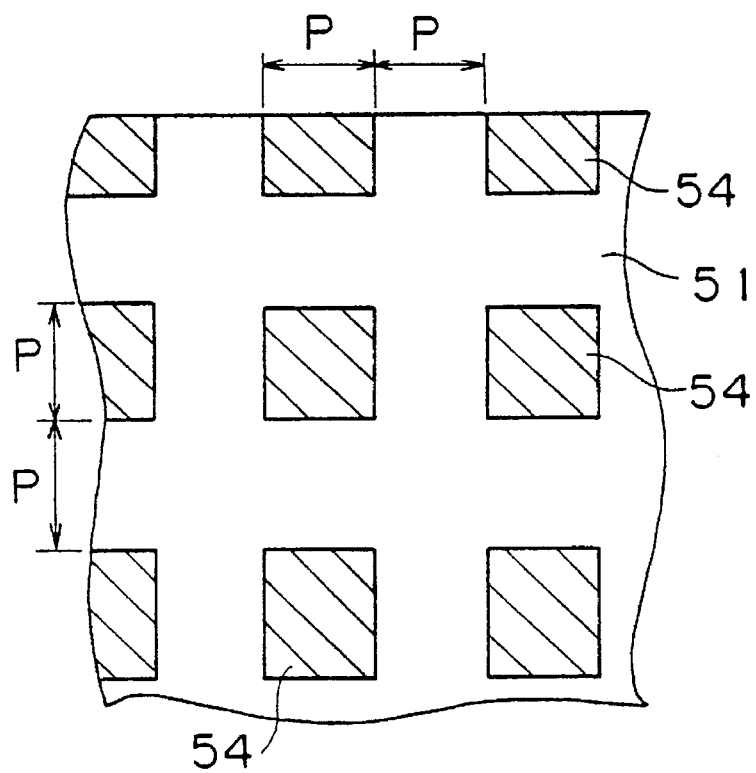
FIG. 49 is a plan view showing soft magnetic films provided in an exemplary magnetoresistance-effect element according to a fourth Example of the present invention.

FIG. 49 is a plan view showing soft magnetic films provided in an exemplary magnetoresistance-effect element according to a fourth Example of the present invention. According to this Example, NiFe films 54, which are the soft magnetic films, are discontinuously provided on a substrate 51 in the form of islands, i.e. separate areas isolated from one another and surrounded on all sides by CoAg films described next. A plurality of samples were prepared from such island-type NiFe films of 50 nm thickness and, having various widths p and spaces p, and CoAg films that were formed on the NiFe films in thicknesses of 100 nm. Rates of magnetoresistance change at room temperature and operating magnetic field strength values Hs were measured as to the respective samples.

The samples regularly exhibited extremely high rates of magnetoresistance change of 17 to 19%, regardless of the widths p and the spaces p of the island-shaped NiFe films.

Figure 50:
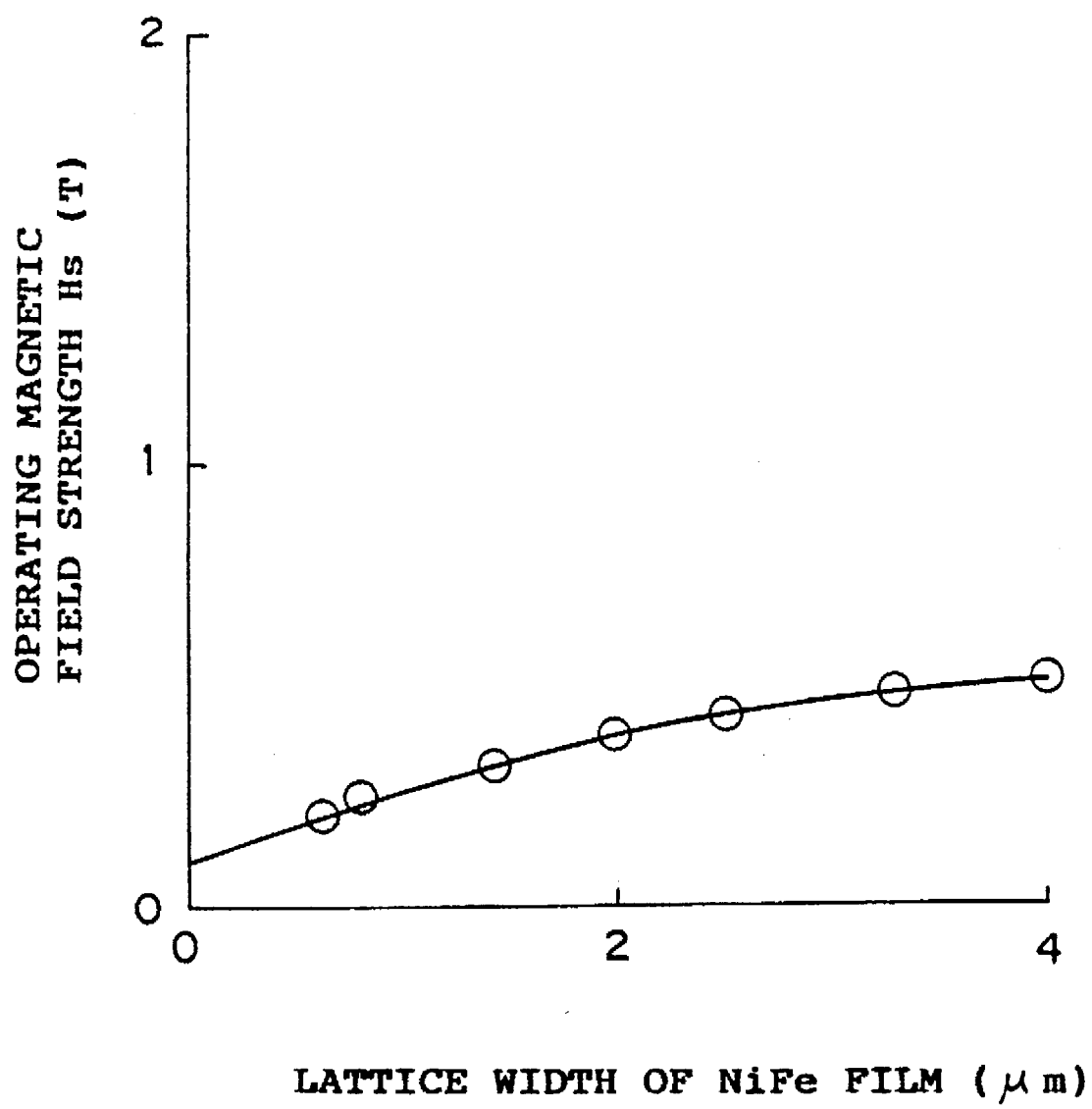
FIG. 50 illustrates the relation between the lattice widths of and spaces p between the soft magnetic films of the Example shown in FIG. 49 and the operating magnetic field strength levels.

As shown in FIG. 50, it is understood that the operating magnetic field strength values Hs were reduced as the widths p and the spaces p of the NiFe films were reduced, which improved the magnetic field sensitivity. A sample provided with island-like NiFe films having widths p of 0.5 μm exhibited an extremely small operating magnetic field strength value Hs of 0.2 T.

While NiFe films were employed as the soft magnetic films in the aforementioned Example, similar rates of magnetoresistance change and operating magnetic field strength values were obtained when CoNi films consisting of 20 atom % of Co and 80 atom % of Ni, for example, were employed as the soft magnetic films.

Furthermore, the soft magnetic films may alternatively be prepared from a soft magnetic metal material such as an alloy prepared by adding Mo, Cu or Cr to NiFe, Sendust, FeSi, FeAl, Fe-based nitride, Fe-based oxide, an Fe-based nitrogen interstitial alloy or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistance-effect element comprising a substrate and a magnetoresistance-effect film disposed on said substrate, wherein said magnetoresistance-effect film includes an alloy film comprising ferromagnetic metal atoms and non-magnetic metal atoms, wherein said ferromagnetic metal atoms and said non-magnetic metal atoms have the property relative to each other that they are mutually insoluble in both solid and liquid phases, and includes at least three soft magnetic films arranged as discontinuous areas in contact with said alloy film and magnetically coupled therewith for reducing an operating magnetic field strength of said element.

2. The magnetoresistance-effect element in accordance with claim 1, wherein said ferromagnetic metal atoms are atoms of Co and said non-magnetic metal atoms are atoms of Pb, and wherein said non-magnetic metal atoms are in an atomic content of 68 to 82 atom % relative to the total composition of said alloy film.

3. The magnetoresistance-effect element in accordance with claim 2, wherein said alloy film further comprises additional atoms of at least one element selected from the group consisting of V, Cr and Mn.

4. The magnetoresistance-effect element in accordance with claim 1, wherein said ferromagnetic metal atoms form grains having a diameter of not more than 20 nm.

5. The magnetoresistance-effect element in accordance with claim 1, wherein said alloy film has a thickness of not more than 30 nm.

6. The magnetoresistance-effect element in accordance with claim 1, wherein said soft magnetic films are disposed between said substrate and said alloy film.

7. The magnetoresistance-effect element in accordance with claim 6, wherein said soft magnetic films are in the form of at least three stripes that are spaced apart from each other in a first dimension, and that each have a length and a width in a plane of said films, wherein said length is substantially greater than said width and extends substantially across a second dimension of said element substantially perpendicular to said first dimension.

8. The magnetoresistance-effect element in accordance with claim 6, wherein said soft magnetic films are in the form of islands that are spaced apart from each other in two dimensions in an array pattern, and that each have an at least substantially equal length and width in a plane of said films.

9. The magnetoresistance-effect element in accordance with claim 1, wherein said soft magnetic films are arranged on said substrate.

10. The magnetoresistance-effect element in accordance with claim 1, wherein said soft magnetic films are disposed on said alloy film opposite said substrate.

11. The magnetoresistance-effect element in accordance with claim 1, wherein said soft magnetic films are NiFe alloy films.

12. The magnetoresistance-effect element in accordance with claim 1, wherein said soft magnetic films are CoNi alloy film.

13. The magnetoresistance-effect element in accordance with claim 1, wherein said ferromagnetic metal atoms consist of Fe and said non-magnetic metal atoms consist of Ag, and wherein said alloy film has a magnetoresistance ratio of at least 3% at room temperature.

14. The magnetoresistance-effect element in accordance with claim 13, wherein said magnetoresistance-effect film has a magnetoresistance ratio of at least 7% at room temperature.

15. The magnetoresistance-effect element in accordance with claim 13, having an atomic content of 60 to 85 atom % of said non-magnetic metal atoms of Ag relative to the total composition of said alloy film.

16. The magnetoresistance-effect element in accordance with claim 13, wherein said alloy film further comprises additional atoms of at least one element selected from the group consisting of Co, Cu and Zn.

17. The magnetoresistance-effect element in accordance with claim 13, wherein said magnetoresistance-effect film further includes a soft magnetic film disposed between said substrate and said alloy film.

18. The magnetoresistance-effect element in accordance with claim 1, wherein said ferromagnetic metal atoms consist of Fe and Ni and said non-magnetic metal atoms consist of Ag, and wherein said alloy film has a magnetoresistance ratio of at least 3% at room temperature.

19. The magnetoresistance-effect element in accordance with claim 18, wherein said magnetoresistance-effect film has a magnetoresistance ratio of at least 7% at room temperature.

20. The magnetoresistance-effect element in accordance with claim 18, having an atomic content of not more than 88 atom % of said ferromagnetic metal atoms of Ni relative to the total content of Fe and Ni.

21. The magnetoresistance-effect element in accordance with claim 18, wherein said alloy film further comprises additional atoms of at least one element selected from the group consisting of Co, Cu and Zn.

22. The magnetoresistance-effect element in accordance with claim 18, having an atomic content of 60 to 85 atom % of said non-magnetic metal atoms of Ag relative to the total composition of said alloy film.

23. The magnetoresistance-effect element in accordance with claim 18, wherein said magnetoresistance-effect film further includes a soft magnetic film disposed between said substrate and said alloy film.

24. The magnetoresistance-effect element in accordance with claim 1, wherein said ferromagnetic metal atoms consist of Co and said non-magnetic metal atoms consist of Ag, and wherein said alloy film has a magnetoresistance ratio of at least 3% at room temperature.

25. The magnetoresistance-effect element in accordance with claim 24, wherein said magnetoresistance-effect film has a magnetoresistance ratio of at least 7% at room temperature.

26. The magnetoresistance-effect element in accordance with claim 24, having an atomic content of 54 to 88 atom % of said non-magnetic metal atoms of Ag relative to the total composition of said alloy film.

27. The magnetoresistance-effect element in accordance with claim 24, wherein said alloy film further comprises additional atoms of at least one element selected from the group consisting of V, Cr and Mn.

28. The magnetoresistance-effect element in accordance with claim 24, wherein said magnetoresistance-effect film further includes a soft magnetic film disposed between said substrate and said alloy film.

29. The magnetoresistance-effect element in accordance with claim 1, wherein said ferromagnetic metal atoms consist of Ni and said non-magnetic metal atoms consist of Ag, and wherein said alloy film has a magnetoresistance ratio of at least 3% at room temperature.

30. The magnetoresistance-effect element in accordance with claim 29, wherein said magnetoresistance-effect film has a magnetoresistance ratio of at least 7% at room temperature.

31. The magnetoresistance-effect element in accordance with claim 29, having an atomic content of 60 to 80 atom % of said non-magnetic metal atoms of Ag relative to the total composition of said alloy film.

32. The magnetoresistance-effect element in accordance with claim 29, wherein said alloy film further comprises additional atoms of at least one element selected from the group consisting of V, Cr and Mn.

33. A magnetoresistance-effect element comprising a substrate and a magnetoresistance-effect film disposed on said substrate, wherein said magnetoresistance-effect film includes an alloy film comprising ferromagnetic metal atoms of Ni; non-magnetic metal atoms of Ag, and additional atoms of V, wherein the composition of said alloy film is represented by $(Ni_{100-X}V_X)_{100-Y}Ag_Y$, wherein Y is in a range from 60 to 80 atom % and X is in a range from 15 to 55 atom %.

34. The magnetoresistance-effect element in accordance with claim 32, wherein the composition of said alloy film is represented by $(Ni_{100-X} Cr_X)_{100-Y} Ag_Y$, wherein Y is in a range from 60 to 80 atom %, and X is in a range from atom %.

35. A magnetoresistance-effect element comprising a substrate and a magnetoresistance-effect film disposed on said substrate, wherein said magnetoresistance-effect film includes an alloy film comprising ferromagnetic metal atoms of Ni, non-magnetic metal atoms of Ag, and additional atoms of Mn, wherein the composition of said alloy film is represented by $(Ni_{100-X}Mn_X)_{100-Y}Ag_Y$, wherein Y is in a range from 60 to 80 atom % and X is in a range from 24 to 92 atom %.

36. The magnetoresistance-effect element in accordance with claim 29, wherein said magnetoresistance-effect film further includes a soft magnetic film disposed between said substrate and said alloy film.

37. The magnetoresistance-effect element in accordance with claim 1, wherein said ferromagnetic metal atoms are atoms of Fe and wherein said non-magnetic metal atoms are atoms of at least one element selected from the group consisting of Bi, Mg and Pb.

* * * * *

UNITED STATES PATENT AND TRADEMARK OFFICE
CERTIFICATE OF CORRECTION

PATENT NO. : 5,656,381
DATED : Aug. 12, 1997
INVENTOR(S) : Maeda et al.

It is certified that error appears in the above-identified patent and that said Letters Patent is hereby corrected as shown below:

On the Title Page: Item ]56];

The following should be inserted:

--Related U. S. Application Data
This application is related to application U. S. Ser. No. 08/326,731, filed on Oct. 20, 1994, and entitled MAGNETORESISTANCE EFFECT ELEMENT now U.S. Pat. No. 5,585,198, and to copending application U.S. Ser. No. 08/406,670, filed on March 20, 1995, and entitled MAGNETORESISTANCE ELEMENT.--.

In "OTHER PUBLICATIONS",
 In the first cited publication:
  line 1, replace "Lieri et al." by --Liou et al.--;
  line 2, replace "manostructured" by --nanostructured--.
please insert the following publication:
  --A. Maeda et al. "Annealing Effects on the Magneto-Resistance Characteristics of Grain-Type Alloy Thin Films", July 5, 1993, J. Phys.: Condens. Matter, Vol. 5, No. 27, pages 4641 - 4646.--.
Col. 6, line 41, replace "a" by --a--;
Col. 18, line 53, (claim 34) after "from" (second occurrence) insert --18 to 69--

Signed and Sealed this

Thirtieth Day of December, 1997

Attest:

BRUCE LEHMAN

*Attesting Officer*     *Commissioner of Patents and Trademarks*